(12) United States Patent
Takaki et al.

(10) Patent No.: US 9,530,824 B2
(45) Date of Patent: *Dec. 27, 2016

(54) MONOLITHIC THREE DIMENSIONAL MEMORY ARRAYS WITH STAGGERED VERTICAL BIT LINE SELECT TRANSISTORS AND METHODS THERFOR

(71) Applicant: SANDISK TECHNOLOGIES LLC, Plano, TX (US)

(72) Inventors: Seje Takaki, Yokkaichi (JP); Yoshio Mori, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 147 days.

This patent is subject to a terminal disclaimer.

(21) Appl. No.: 14/542,213

(22) Filed: Nov. 14, 2014

(65) Prior Publication Data

US 2016/0141334 A1 May 19, 2016

(51) Int. Cl.
*H01L 27/24* (2006.01)
*G11C 13/00* (2006.01)

(52) U.S. Cl.
CPC ......... *H01L 27/249* (2013.01); *G11C 13/0023* (2013.01); *G11C 13/0026* (2013.01); *G11C 13/0028* (2013.01); *G11C 13/0069* (2013.01); *G11C 2213/71* (2013.01); *G11C 2213/77* (2013.01)

(58) Field of Classification Search
CPC .............. H01L 27/11524; H01L 27/11551; H01L 27/2454; H01L 27/2481; H01L 27/249

See application file for complete search history.

(56) References Cited

U.S. PATENT DOCUMENTS

2013/0337646 A1* 12/2013 Cernea ................. H01L 27/249
 438/666
2014/0369104 A1* 12/2014 Murooka ................ G11C 5/06
 365/63
2016/0118113 A1* 4/2016 Siau .................... G11C 13/0069
 365/51

* cited by examiner

*Primary Examiner* — Allison P Bernstein
(74) *Attorney, Agent, or Firm* — Vierra Magen Marcus LLP

(57) ABSTRACT

A monolithic three-dimensional memory array is provided that includes a plurality of global bit lines disposed above a substrate, each global bit line having a long axis, a plurality of vertically-oriented bit lines disposed above the global bit lines, a plurality of word lines disposed above the global bit lines, a plurality of memory cells coupled between the vertically-oriented bit lines and the word lines, and a plurality of vertically-oriented bit line select transistors coupled between the vertically-oriented bit lines and the global bit lines, each vertically-oriented bit line select transistor comprising a width and a thickness. Vertically-oriented bit line select transistors disposed above adjacent global bit lines are offset from one another in a direction along the long axis of the global bit lines. The width of each vertically-oriented bit line select transistor is greater than the thickness of the vertically-oriented bit line select transistors.

24 Claims, 49 Drawing Sheets

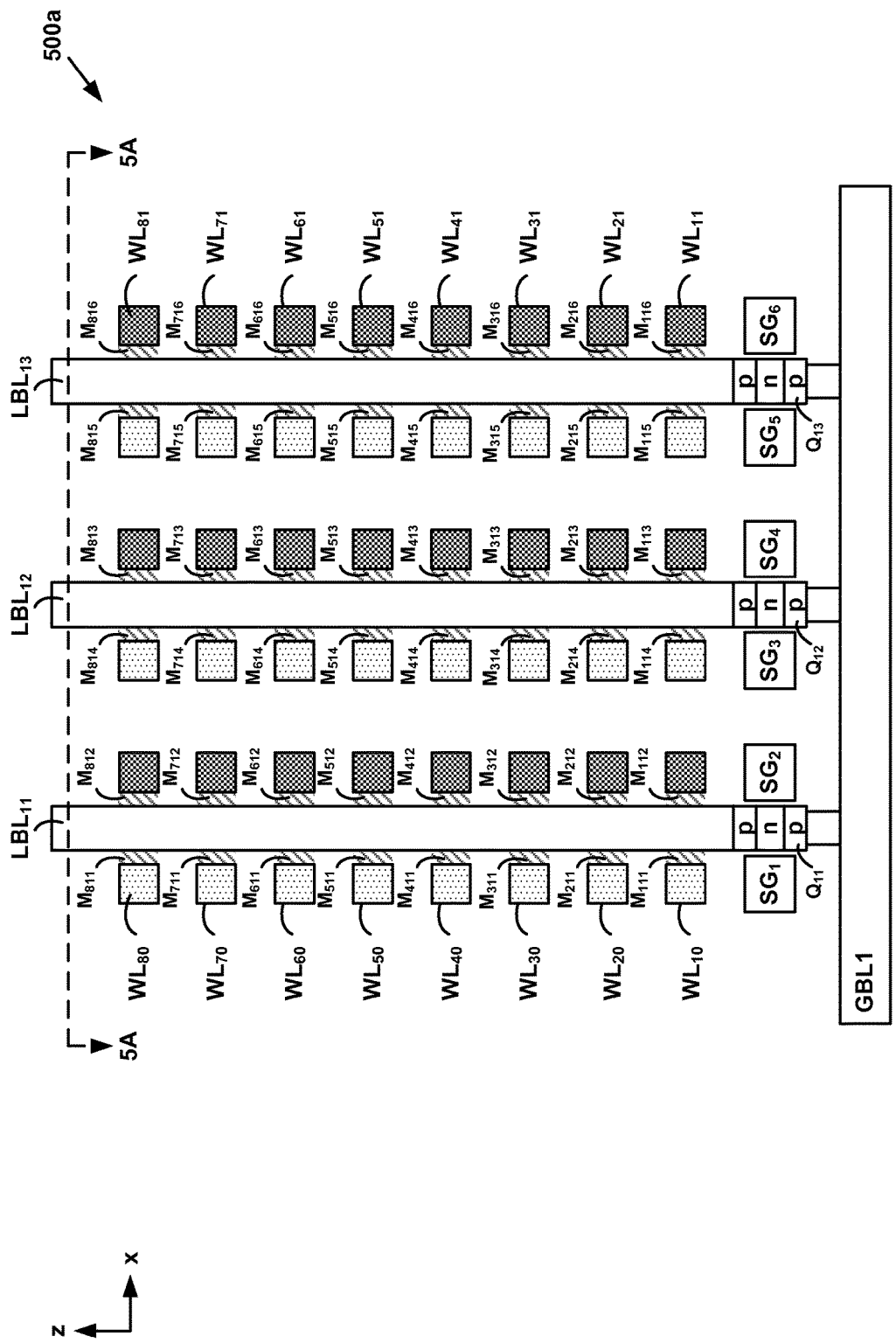

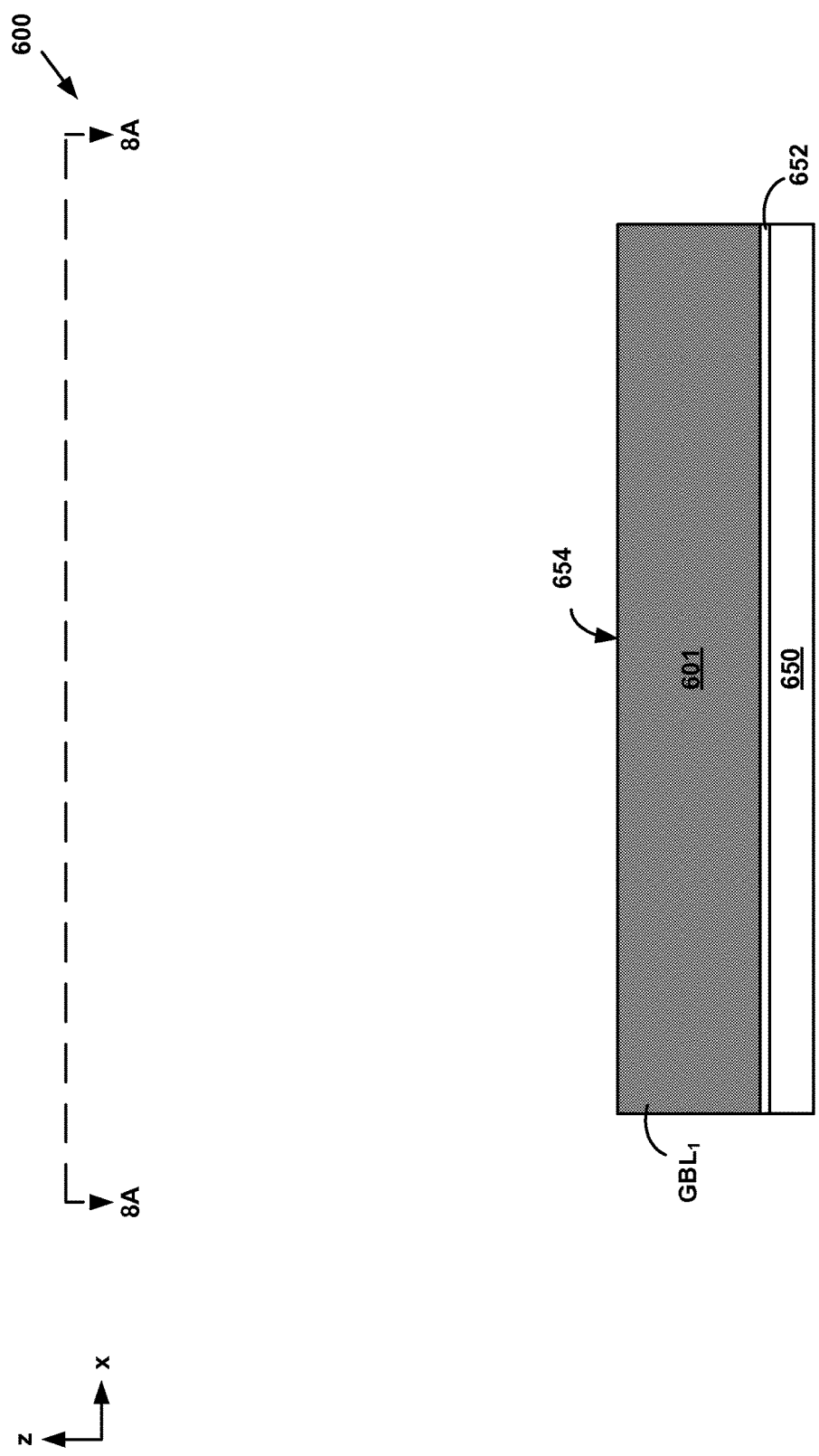

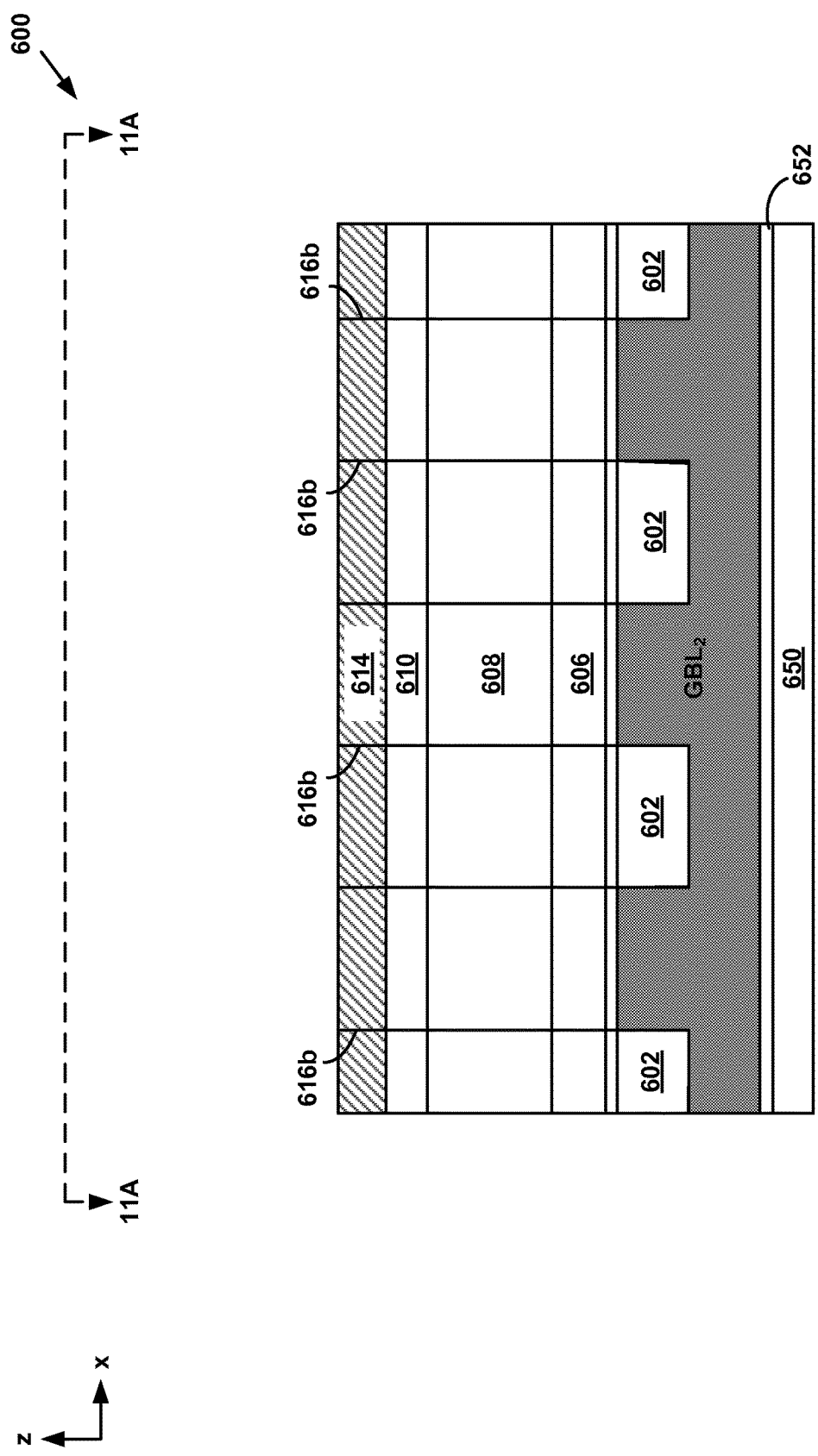

US 9,530,824 B2

MONOLITHIC THREE DIMENSIONAL MEMORY ARRAYS WITH STAGGERED VERTICAL BIT LINE SELECT TRANSISTORS AND METHODS THERFOR

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery).

Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics, reduced memory cell sensing currents, and increased bit line settling times.

BRIEF DESCRIPTION OF THE DRAWINGS

FIGS. 5B-5C depict various perspective views of the monolithic three-dimensional memory array of FIG. 5A.

DETAILED DESCRIPTION

Figure 1A:
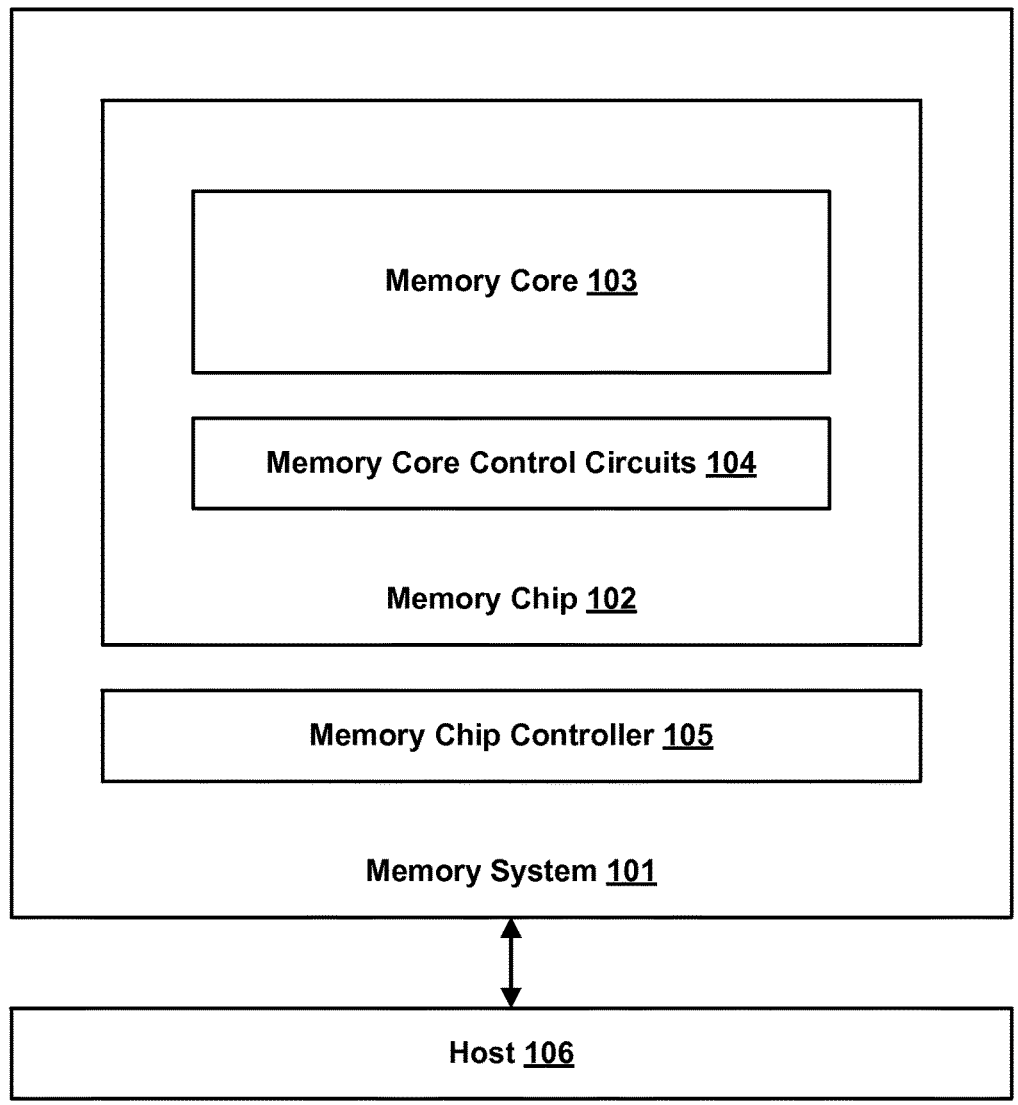
FIG. 1A depicts an embodiment of a memory system and a host.

Technology is described for monolithic three-dimensional memory arrays with staggered vertically-oriented bit line select transistors. The monolithic three-dimensional memory arrays include word lines, and vertical bit lines disposed in a checkerboard pattern above global bit lines. Vertically-oriented bit line select transistors are coupled between the vertical bit lines and the global bit lines. Staggering the vertical bit lines permits an increase in the width of the vertically-oriented bit line select transistors. Vertically-oriented bit line select transistors have a thickness and a width, wherein the width of each vertically-oriented bit line select transistor is greater than the thickness. In some embodiments, the width of each vertically-oriented bit line select transistor is between about 2-3 times the thickness of the vertically-oriented bit line select transistor. Without wanting to be bound by any particular theory, it is believed that increasing the width and providing two control terminals increases the drive capability of each vertically-oriented bit line select transistor, and increases the available programming current for each memory cell in the memory array.

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may include a non-volatile storage system interfacing with the host (e.g., a mobile computing device). In some cases, the memory system 101 may be embedded within the host 106. In other cases, the memory system 101 may include a memory card. As depicted, the memory system 101 includes a memory chip controller 105 and a memory chip 102. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit. In other embodiments, memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array. The one or more managing or control circuits may provide control signals to a memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
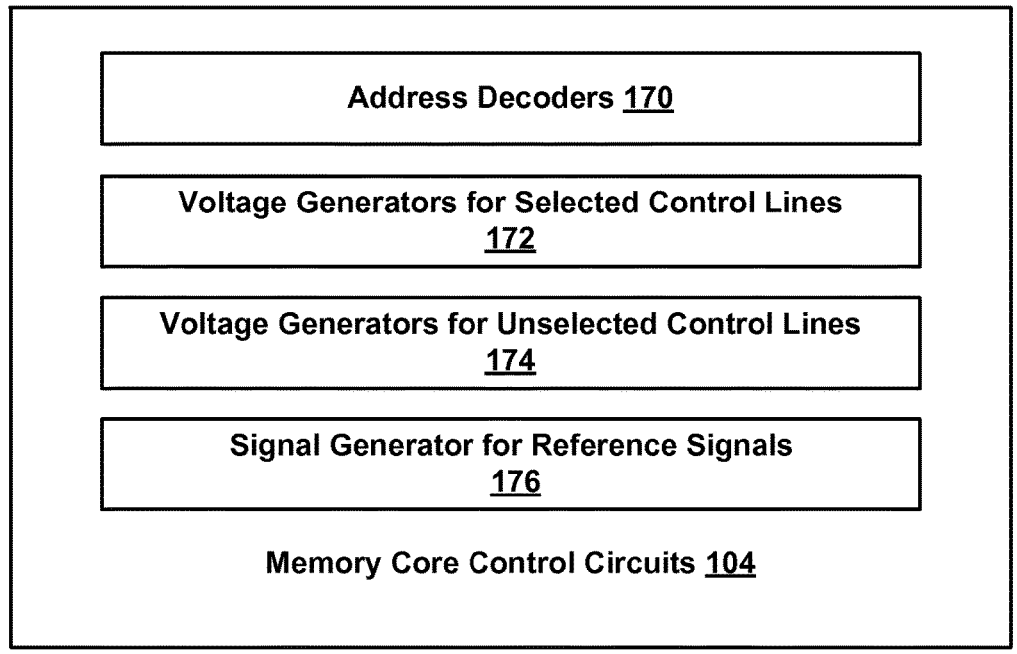
FIG. 1B depicts an embodiment of memory core control circuits.

FIG. 1B depicts one embodiment of memory core control circuits 104. As depicted, the memory core control circuits 104 include address decoders 170, voltage generators for selected control lines 172, voltage generators for unselected control lines 174 and signal generators for reference signals 176 (described in more detail below). Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may include one or more voltage generators for generating selected control line voltages. The voltage generators for unselected control lines 174 may include one or more voltage generators for generating unselected control line voltages. The signal generators for reference signals 176 may include one or more voltage or current generators for generating reference voltage or current signals. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings can also be used with the technology described herein.

Figure 1C:
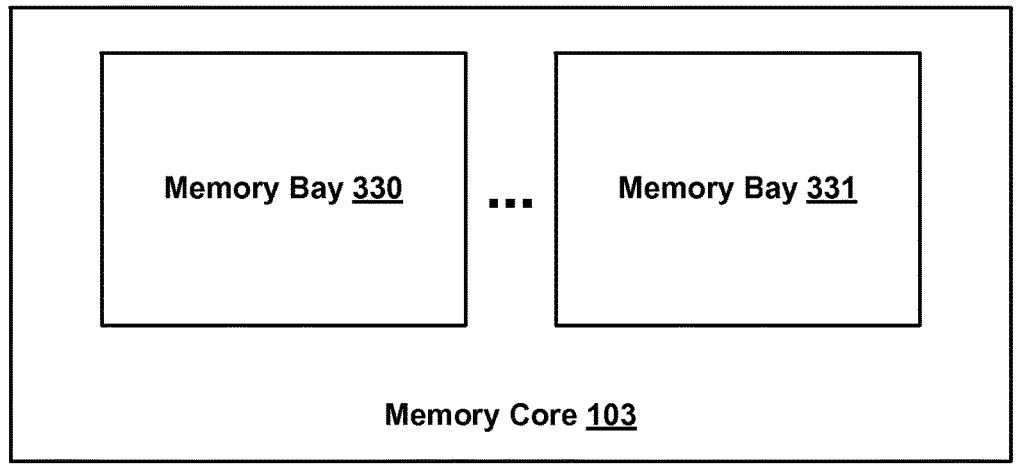
FIG. 1C depicts an embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
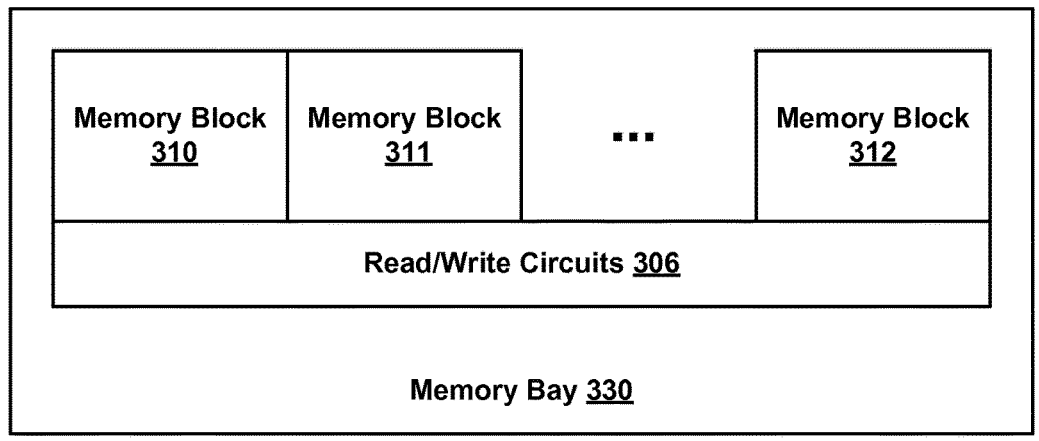
FIG. 1D depicts an embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address and/or to acquire overhead information (e.g., ECC information) before performing a write operation to write the set of data to the target address.

In some cases, read/write circuits 306 may be used to program a particular memory cell to be in one of three or more data/resistance states (i.e., the particular memory cell may include a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
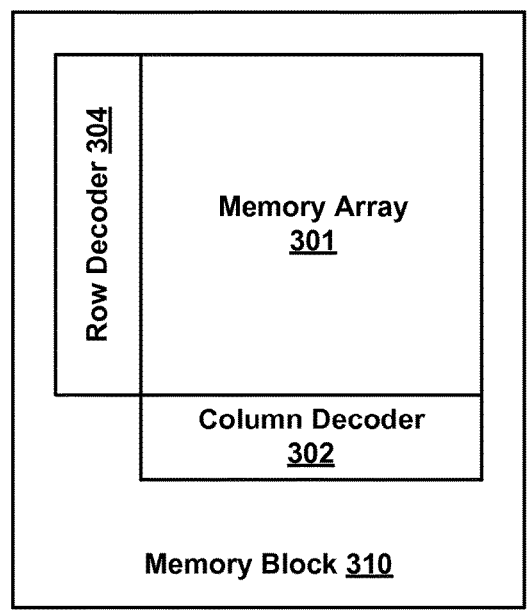
FIG. 1E depicts an embodiment of a memory block.

FIG. 1E depicts one embodiment of memory block 310 in FIG. 1D. As depicted, memory block 310 includes a memory array 301, row decoder 304, and column decoder 302. Memory array 301 may include a contiguous group of memory cells having contiguous word lines and bit lines. Memory array 301 may include one or more layers of memory cells. Memory array 310 may include a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
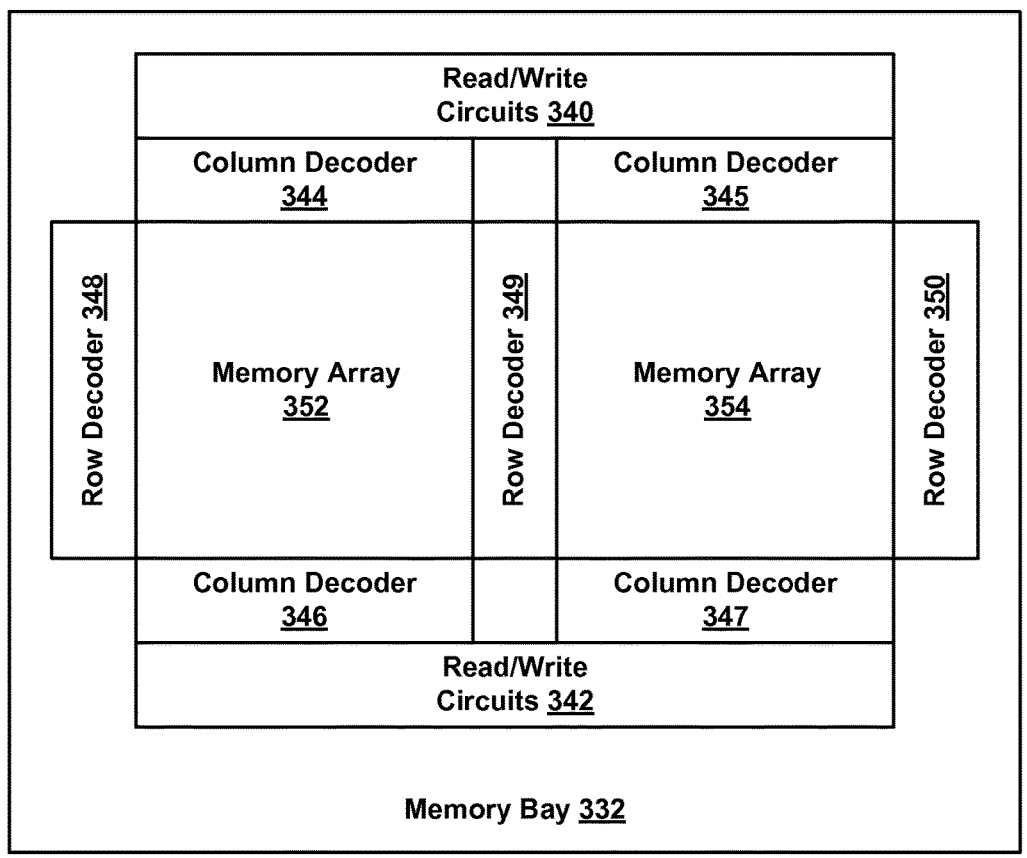
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2A:
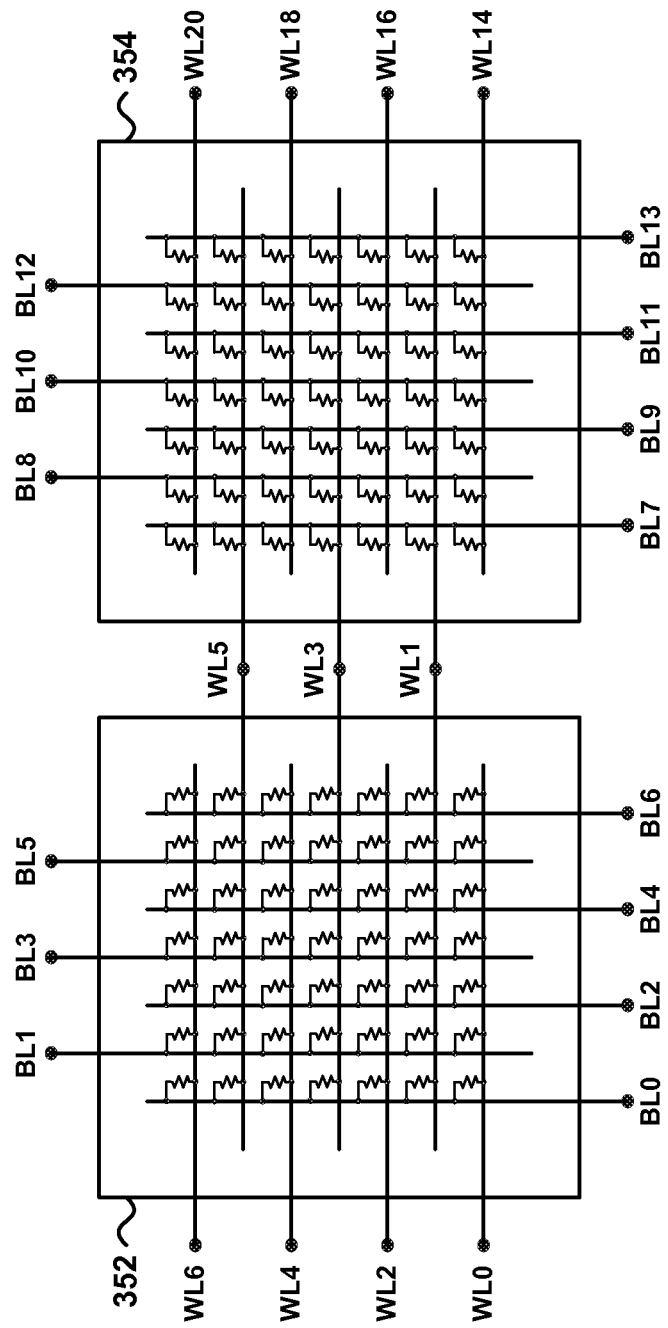
FIG. 2A depicts a schematic diagram of the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may include memory layers that are oriented in a horizontal plane that is horizontal to the supporting substrate. In another embodiment, the memory arrays 352 and 354 may include memory layers that are oriented in a vertical plane that is vertical with respect to the supporting substrate (i.e., the vertical plane is perpendicular to the supporting substrate).

Figure 2B:
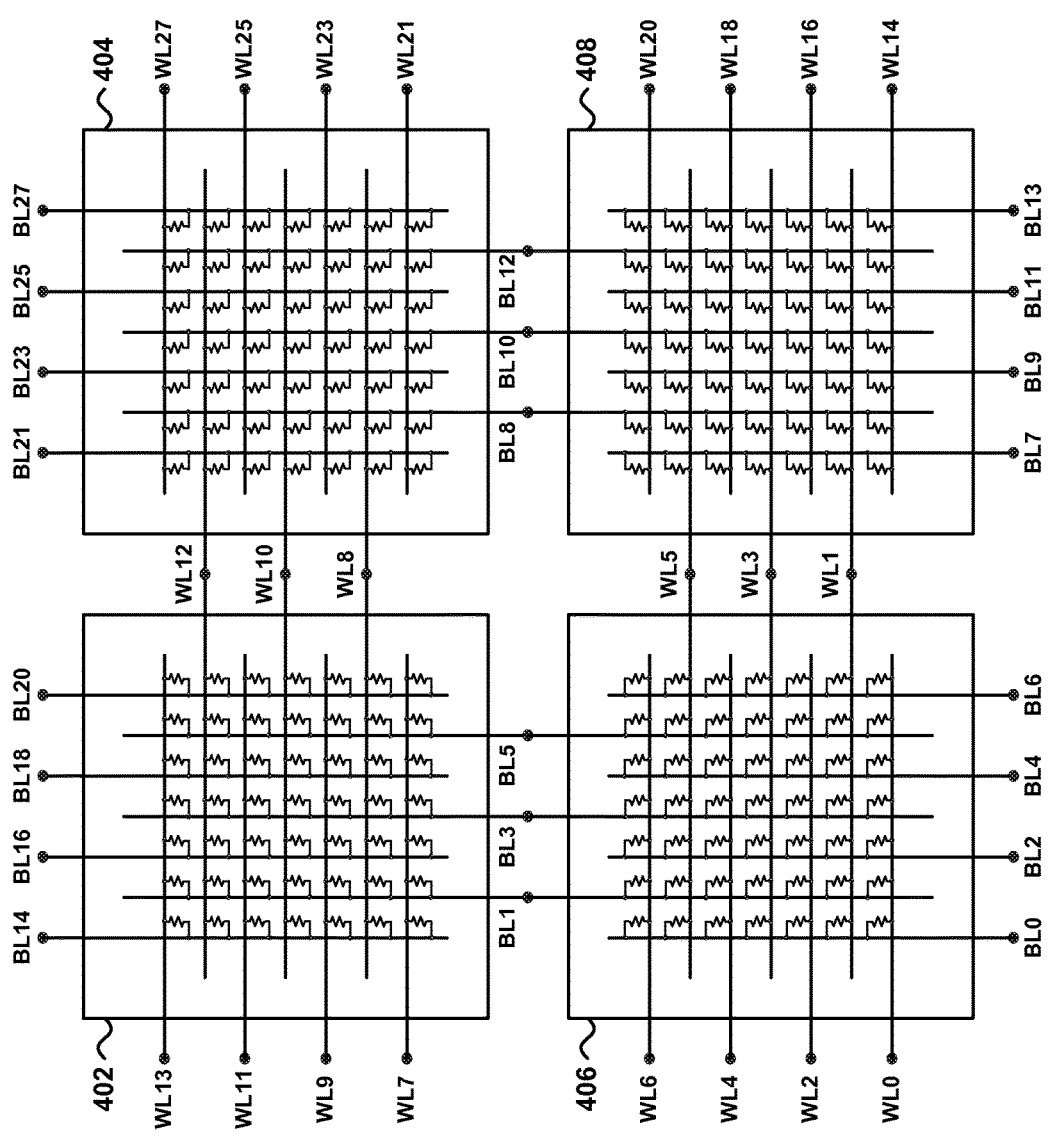
FIG. 2B depicts a schematic diagram of a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
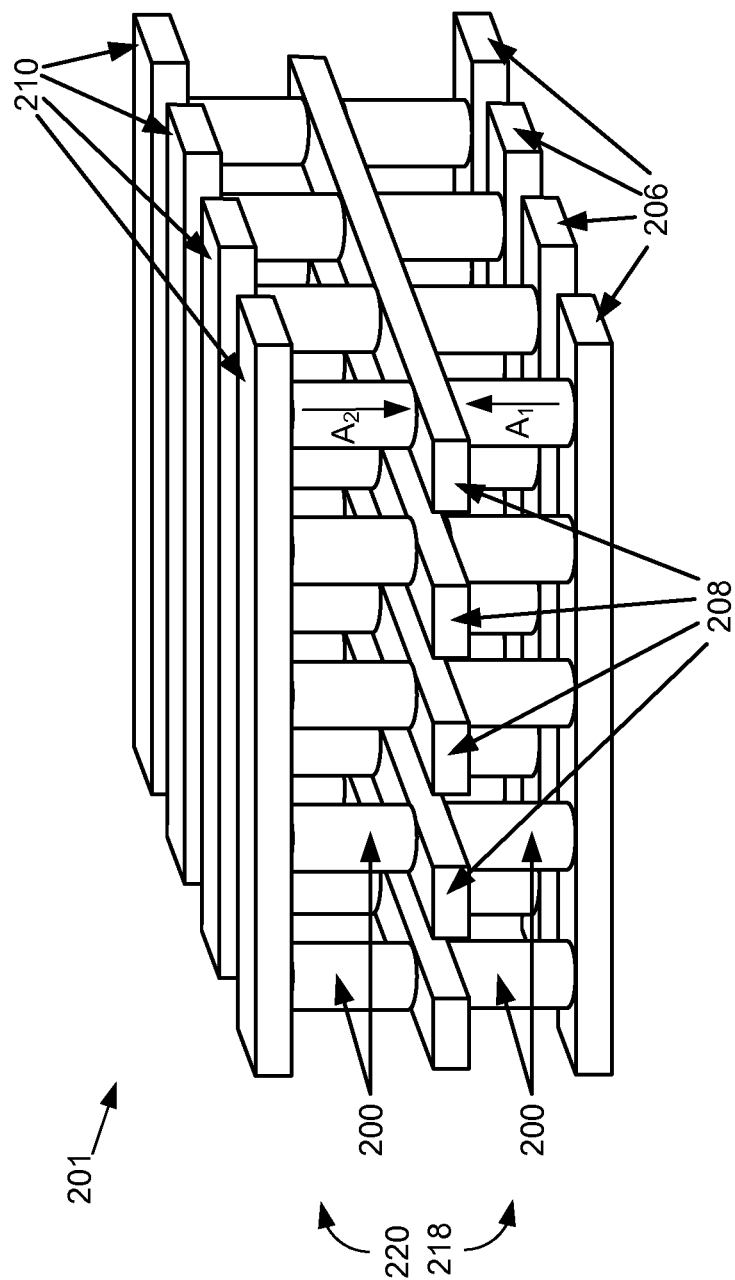
FIG. 3A depicts an embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element).

In one example, the diodes of the first memory level 218 may be upward pointing diodes as indicated by arrow $A_1$ (e.g., with p regions at the bottom of the diodes), whereas the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode (or other steering element) from a memory cell may reduce the process complexity and costs associated with manufacturing a memory array.

In one embodiment, the memory cells 200 of FIG. 3A include re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may include resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to a selected word line voltage in read mode (e.g., 0V). A sense amplifier may then be used to bias a selected bit line connected to the selected memory cell to the selected bit line voltage in read mode (e.g., 1.0V). In some cases, to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V). However, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a sense amplifier may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to include more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding can be reversed. In some embodiments, the first time a resistance-switching element is SET may require a higher than normal programming voltage and may be referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V).

In some cases, to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation to detect a write disturb.

Figure 3B:
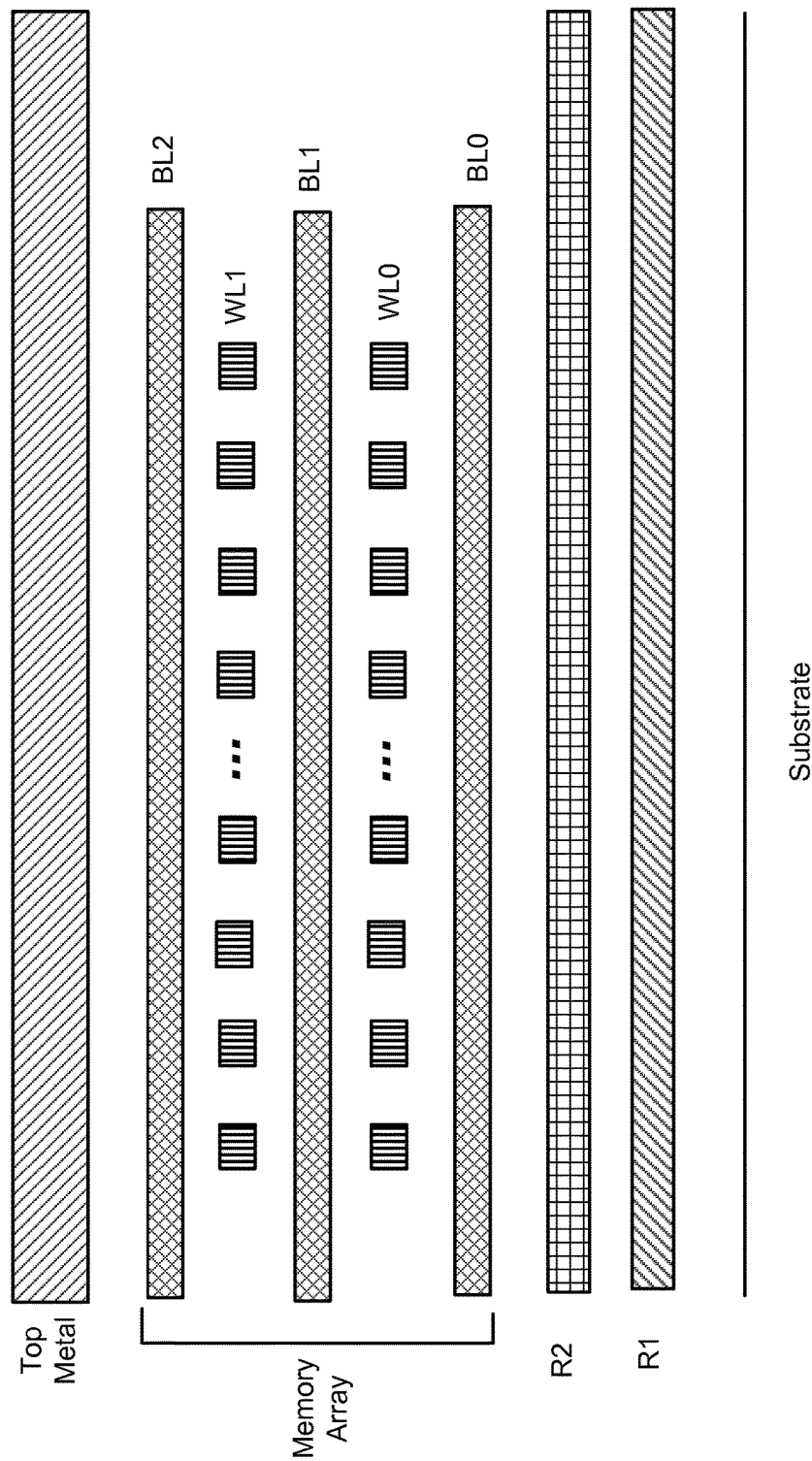
FIG. 3B depicts a subset of the memory array and routing layers of an embodiment of a three-dimensional memory array.

FIG. 3B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3C:
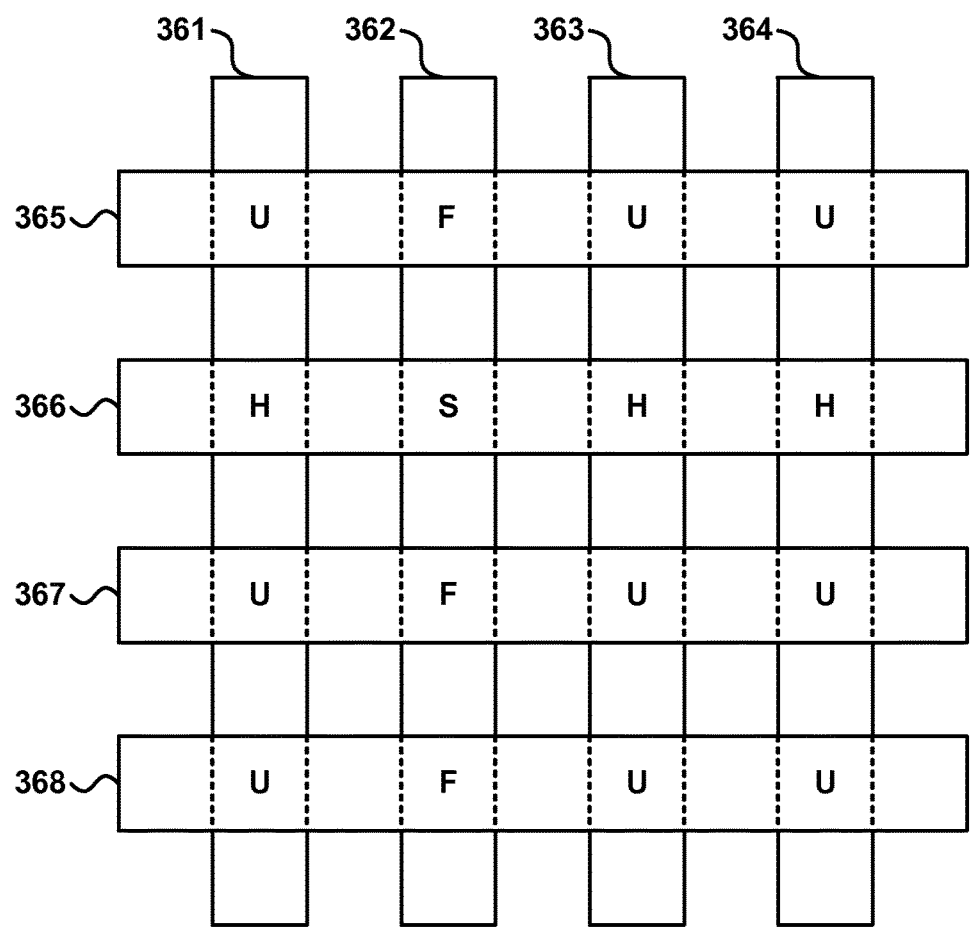
FIGS. 3C-3D depict various embodiments of a cross-point memory array.

FIG. 3C depicts one embodiment of a cross-point memory array 360. The cross-point memory array 360 may correspond with memory array 201 in FIG. 3A. As depicted, cross-point memory array 360 includes word lines 365-368 and bit lines 361-364. Word line 366 includes a selected word line and bit line 362 includes a selected bit line. At the intersection of selected word line 366 and selected bit line 362 is a selected memory cell (an S cell). The voltage across the S cell is the difference between the selected word line voltage and the selected bit line voltage.

Memory cells at the intersections of the selected word line 366 and the unselected bit lines 361, 363, and 364 include unselected memory cells (H cells). H cells are unselected memory cells that share a selected word line that is biased to the selected word line voltage. The voltage across the H cells is the difference between the selected word line voltage and the unselected bit line voltage.

Memory cells at the intersections of the selected bit line 362 and the unselected word lines 365, 367, and 368 include unselected memory cells (F cells). F cells are unselected memory cells that share a selected bit line that is biased to a selected bit line voltage. The voltage across the F cells is the difference between the unselected word line voltage and the selected bit line voltage.

Memory cells at the intersections of the unselected word lines 365, 367, and 368 and the unselected bit lines 361, 363, and 364 include unselected memory cells (U cells). The voltage across the U cells is the difference between the unselected word line voltage and the unselected bit line voltage.

The number of F cells is related to the length of the bit lines (or the number of memory cells connected to a bit line), whereas the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3D:
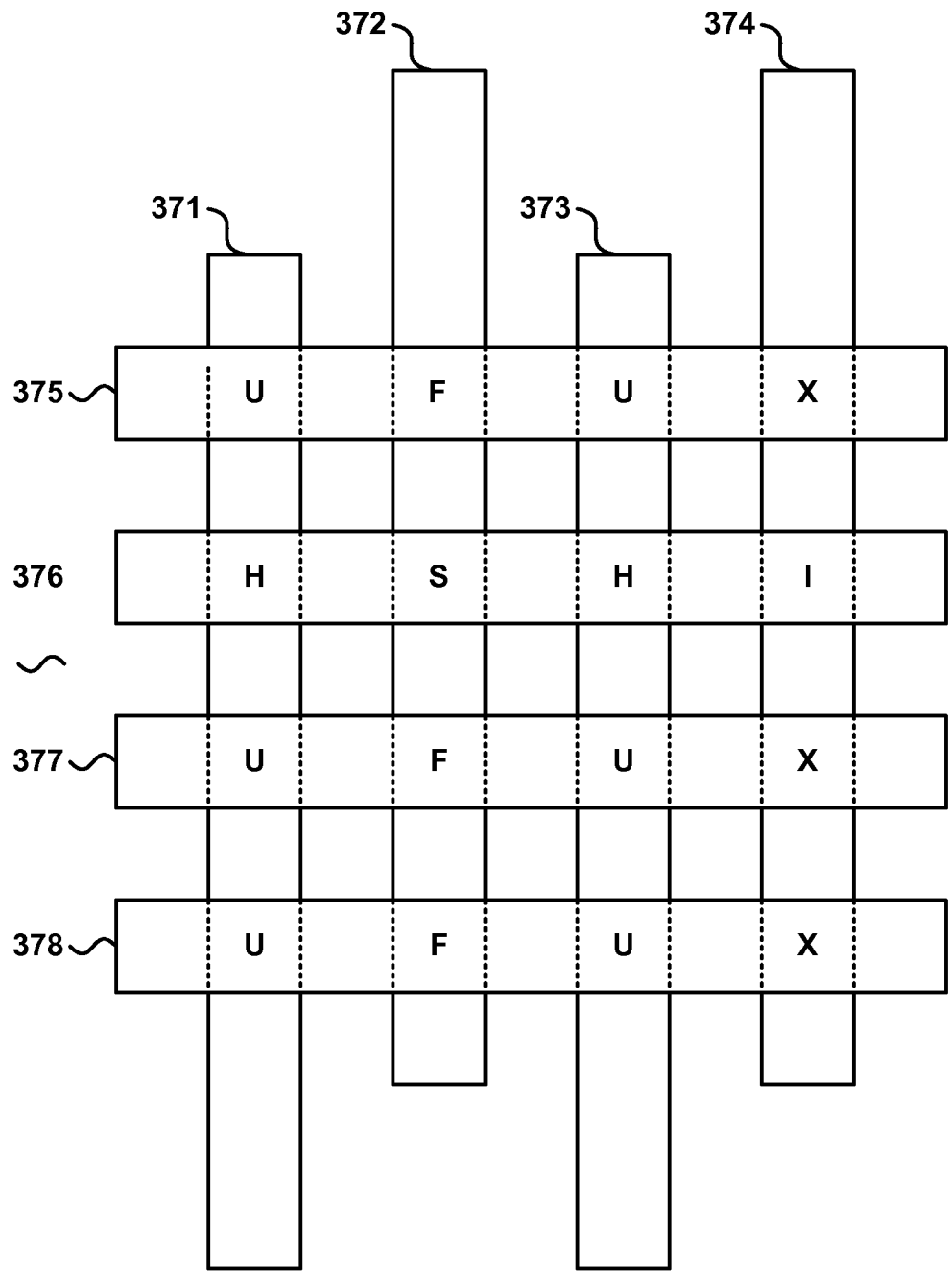

FIG. 3D depicts an alternative embodiment of a cross-point memory array 370. The cross-point memory array 370 may correspond with memory array 201 in FIG. 3A. As depicted, cross-point memory array 370 includes word lines 375-378 and bit lines 371-374. Word line 376 includes a selected word line and bit lines 372 and 374 include selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 include unselected memory cells (X cells). X cells are unselected memory cells that share a selected bit line that is biased to a program inhibit voltage. The voltage across the X cells is the difference between the unselected word line voltage and the program inhibit voltage.

In one embodiment, the program inhibit voltage applied to the selected bit line 374 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may include H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may include resistive memory elements without isolating diodes. In one embodiment, the bit lines 372 and 373 may include vertical bit lines in a three dimensional memory array comprising comb shaped word lines.

Figure 4A:
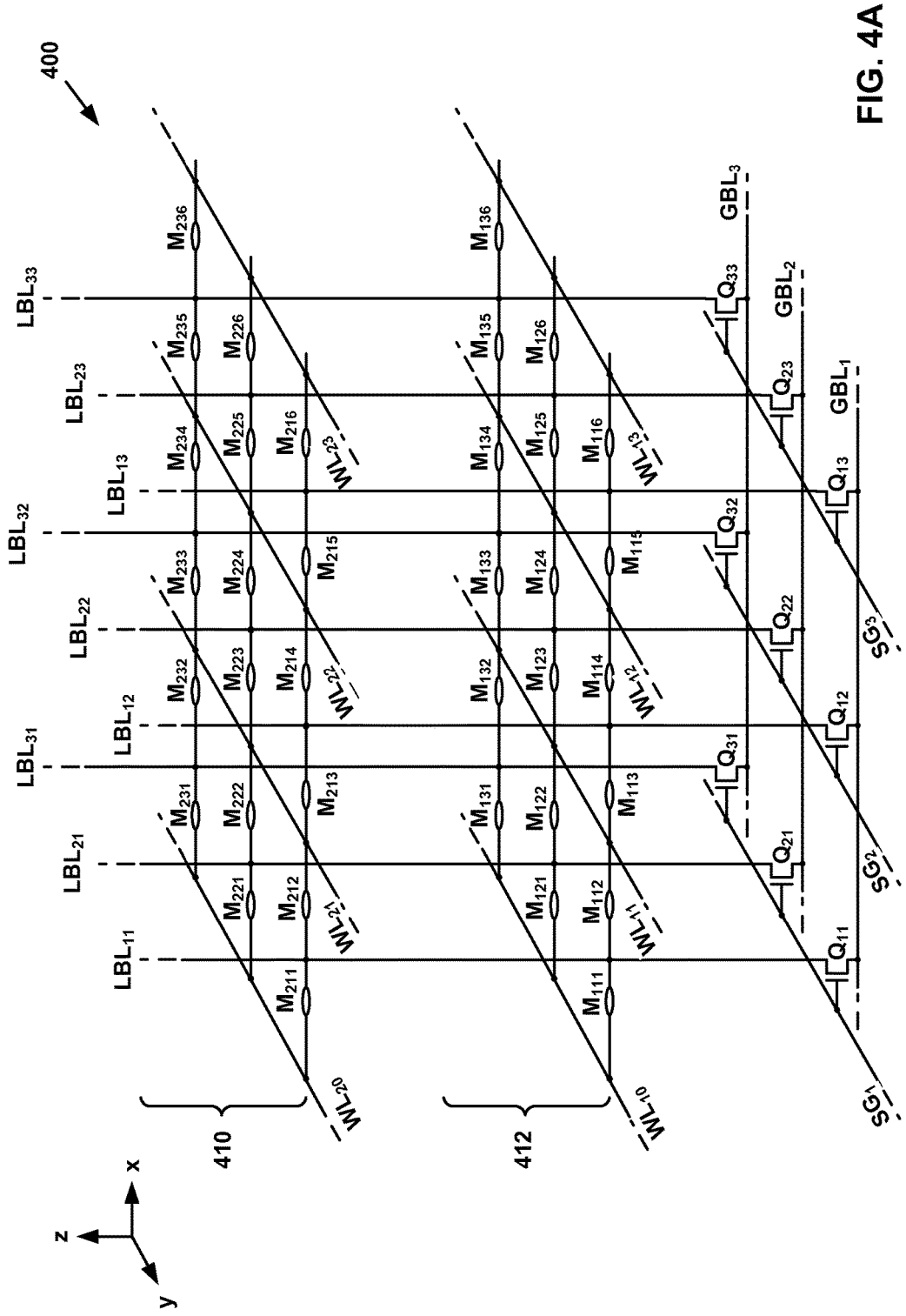
FIG. 4A depicts an embodiment of a portion of a monolithic three-dimensional memory array.

FIG. 4A depicts one embodiment of a portion of a monolithic three-dimensional memory array 400 that includes a first memory level 412 positioned below a second memory level 410. Memory array 400 is one example of an implementation for memory array 301 in FIG. 1E. The local bit lines $LBL_{11}$-$LBL_{33}$ are arranged in a first direction (e.g., a z-direction) and the word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate device or a charge trap device (e.g., using a silicon nitride material). The global bit lines $GBL_1$-$GBL_3$ are arranged in a third direction (e.g., a y-direction) that is perpendicular to both the first direction and the second direction.

Each local bit line $LBL_{11}$-$LBL_{33}$ has an associated bit line select transistor $Q_{11}$-$Q_{33}$, respectively. Bit line select transistors $Q_{11}$-$Q_{33}$ may be field effect transistors, such as shown, or may be any other transistors. As depicted, bit line select transistors $Q_{11}$-$Q_{31}$ are associated with local bit lines $LBL_{11}$-$LBL_{31}$, respectively, and may be used to connect local bit lines $LBL_{11}$-$LBL_{31}$ to global bit lines $GBL_1$-$GBL_3$, respectively, using row select line $SG_1$. In particular, each of bit line select transistors $Q_{11}$-$Q_{31}$ has a first terminal (e.g., a drain./source terminal) coupled to a corresponding one of local bit lines $LBL_{11}$-$LBL_{31}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_1$.

Similarly, bit line select transistors $Q_{12}$-$Q_{32}$ are associated with local bit lines $LBL_{12}$-$LBL_{32}$, respectively, and may be used to connect local bit lines $LBL_{12}$-$LBL_{32}$ to global bit lines $GBL_1$-$GBL_3$, respectively, using row select line $SG_2$. In particular, each of bit line select transistors $Q_{12}$-$Q_{32}$ has a first terminal (e.g., a drain./source terminal) coupled to a corresponding one of local bit lines $LBL_{12}$-$LBL_{32}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_2$.

Likewise, bit line select transistors $Q_{13}$-$Q_{33}$ are associated with local bit lines $LBL_{13}$-$LBL_{33}$, respectively, and may be used to connect local bit lines $LBL_{13}$-$LBL_{33}$ to global bit lines $GBL_1$-$GBL_3$, respectively, using row select line $SG_3$. In particular, each of bit line select transistors $Q_{13}$-$Q_{33}$ has a first terminal (e.g., a drain./source terminal) coupled to a corresponding one of local bit lines $LBL_{13}$-$LBL_{33}$, respectively, a second terminal (e.g., a source/drain terminal) coupled to a corresponding one of global bit lines $GBL_1$-

$GBL_3$, respectively, and a third terminal (e.g., a gate terminal) coupled to row select line $SG_3$.

Because a single bit line select transistor is associated with a corresponding local bit line, the voltage of a particular global bit line may be applied to a corresponding local bit line. Therefore, when a first set of local bit lines (e.g., $LBL_{11}$-$LBL_{31}$) is biased to global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated.

In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 400, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, whereas the number of memory cells along each word line may be 2048 or more than 4096.

In one embodiment of a read operation, the data stored in a selected memory cell (e.g., memory cell $M_{111}$) may be read by biasing the word line connected to the selected memory cell (e.g., selected word line $WL_{10}$) to a selected word line voltage in read mode (e.g., 0V). The local bit line (e.g., $LBL_{11}$) coupled to the selected memory cell ($M_{111}$) is biased to a selected bit line voltage in read mode (e.g., 1 V) via the associated bit line select transistor (e.g., $Q_{11}$) coupled to the selected local bit line ($LBL_{11}$), and the global bit line (e.g., $GBL_1$) coupled to the bit line select transistor ($Q_{11}$). A sense amplifier may then be coupled to the selected local bit line ($LBL_{11}$) to determine a read current $I_{READ}$ of the selected memory cell ($M_{111}$). The read current $I_{READ}$ is conducted by the bit line select transistor $Q_{11}$, and may be between about 100 nA and about 500 nA.

In one embodiment of a write operation, data may be written to a selected memory cell (e.g., memory cell $M_{221}$) by biasing the word line connected to the selected memory cell (e.g., $WL_{20}$) to a selected word line voltage in write mode (e.g., 5V). The local bit line (e.g., $LBL_{21}$) coupled to the selected memory cell ($M_{221}$) is biased to a selected bit line voltage in write mode (e.g., 0 V) via the associated bit line select transistor (e.g., $Q_{21}$) coupled to the selected local bit line ($LBL_{21}$), and the global bit line (e.g., $GBL_2$) coupled to the bit line select transistor ($Q_{21}$). During a write operation, a programming current $I_{PGRM}$ is conducted by the associated bit line select transistor $Q_{21}$, and may be between about 3 uA and about 6 uA.

Figure 4B:
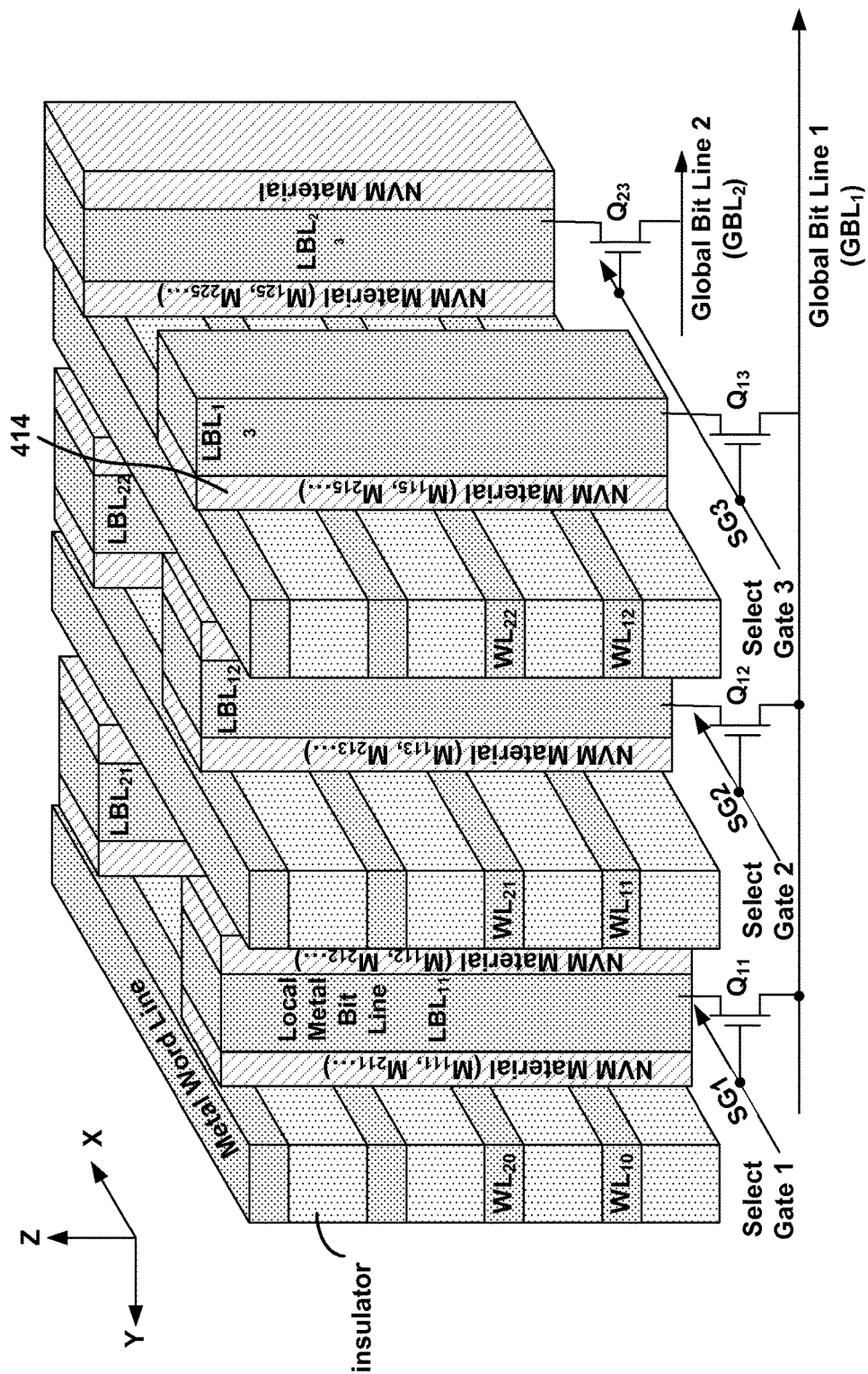
FIG. 4B depicts an embodiment of a portion of a monolithic three-dimensional memory array that includes vertical strips of a non-volatile memory material.

FIG. 4B depicts an embodiment of a portion of a monolithic three-dimensional memory array that includes vertical strips of a non-volatile memory material. The physical structure depicted in FIG. 4B may include one implementation for a portion of the monolithic three-dimensional memory array depicted in FIG. 4A. The vertical strips of non-volatile memory material may be formed in a direction that is perpendicular to a substrate (e.g., in the Z direction).

A vertical strip of the non-volatile memory material 414 may include, for example, a vertical oxide layer, a vertical metal oxide layer (e.g., nickel oxide, hafnium oxide, or other similar metal oxide material), a vertical layer of phase change material, or a vertical charge trapping layer (e.g., a layer of silicon nitride). The vertical strip of material may include a single continuous layer of material that may be used by a plurality of memory cells or devices.

In one example, portions of the vertical strip of the non-volatile memory material 414 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via an associated vertically-oriented bit line select transistor (e.g., $Q_{11}$, $Q_{12}$, $Q_{13}$, $Q_{23}$ in FIG. 4B). Each vertically-oriented bit line select transistor may include a MOS device (e.g., an NMOS device) or a vertical thin-film transistor (TFT).

In an embodiment, each vertically-oriented bit line select transistor is a vertically-oriented pillar-shaped TFT coupled between an associated local bit line pillar and a global bit line. In an embodiment, the vertically-oriented bit line select transistors are formed in a pillar select layer formed above a CMOS substrate, and a memory layer that includes multiple layers of word lines and memory elements is formed above the pillar select layer.

As described above, during a write operation of a selected memory cell, a programming current $I_{PRGM}$ is conducted by the local bit line and the associated vertically-oriented bit line select transistor connected to the selected memory cell. In some embodiments, it may be desirable to use a programming current $I_{PGRM}$ of between about 3 uA and about 6 uA, which may be higher than the drive current capabilities of the associated vertically-oriented bit line select transistor. In such embodiments, the vertically-oriented bit line select transistor associated with the selected memory cell may limit the programming current $I_{PRGM}$ that may be supplied to program the selected memory cell.

One technique to increase drive current of a TFT device, such as the vertically-oriented bit line select transistors described above, is to increase the transistor width, and another technique is to increase the number of transistor gates. However, these techniques are often difficult to implement from a processing and manufacturing perspective. For example, if the half-pitch (i.e., half the distance between identical features) of word lines and bit lines in a memory array is 24 nm, the spacing between adjacent transistor gates may only be about 8 nm, which is very difficult to reliably achieve using current lithography techniques. In addition, if the voltage difference between the two adjacent gates is too high, the dielectric material separating the adjacent gates becomes susceptible to breakdown.

Figure 5A:
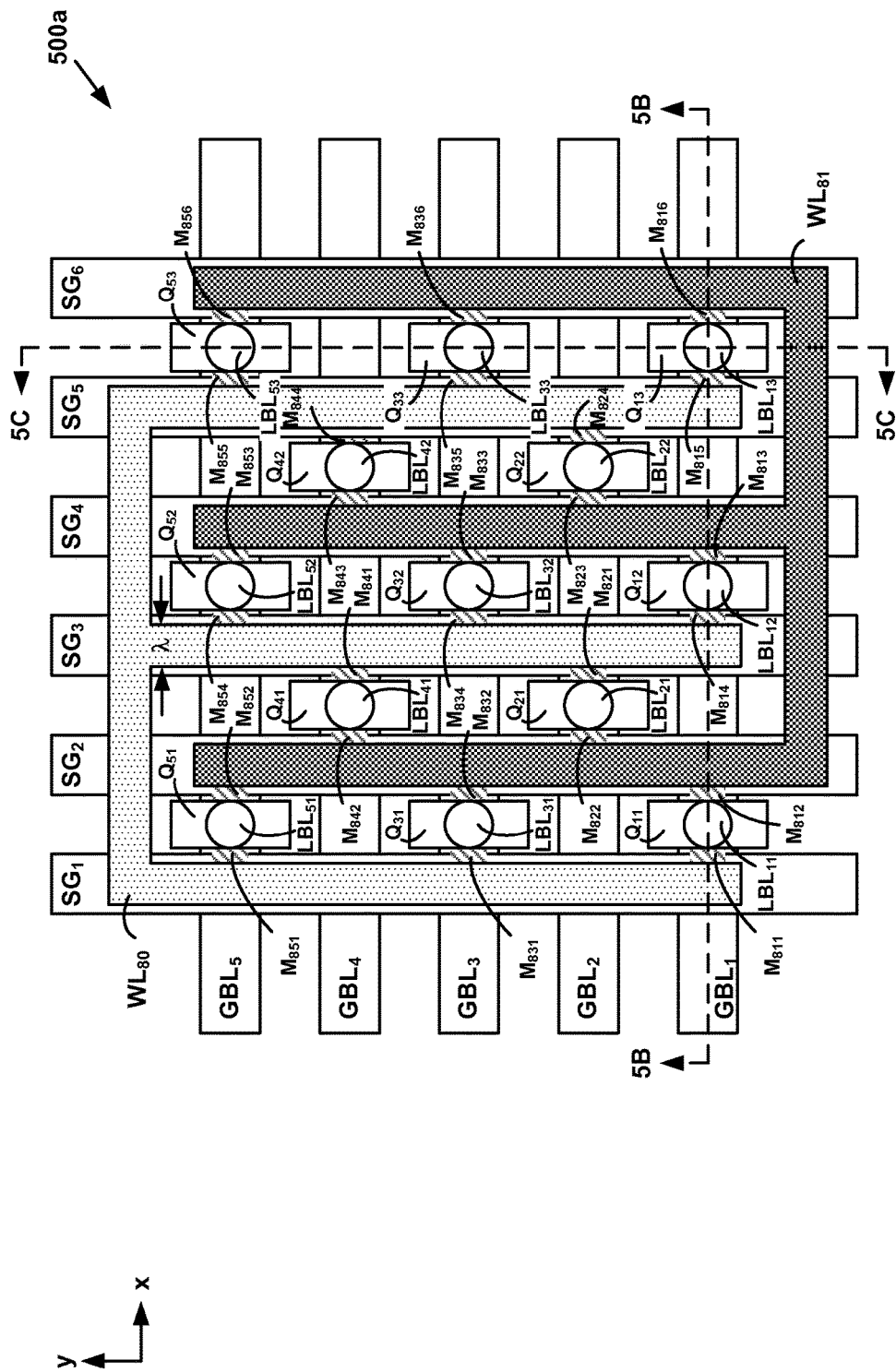
FIG. 5A depicts a top level view of an embodiment monolithic three-dimensional memory array.
Figure 5C:
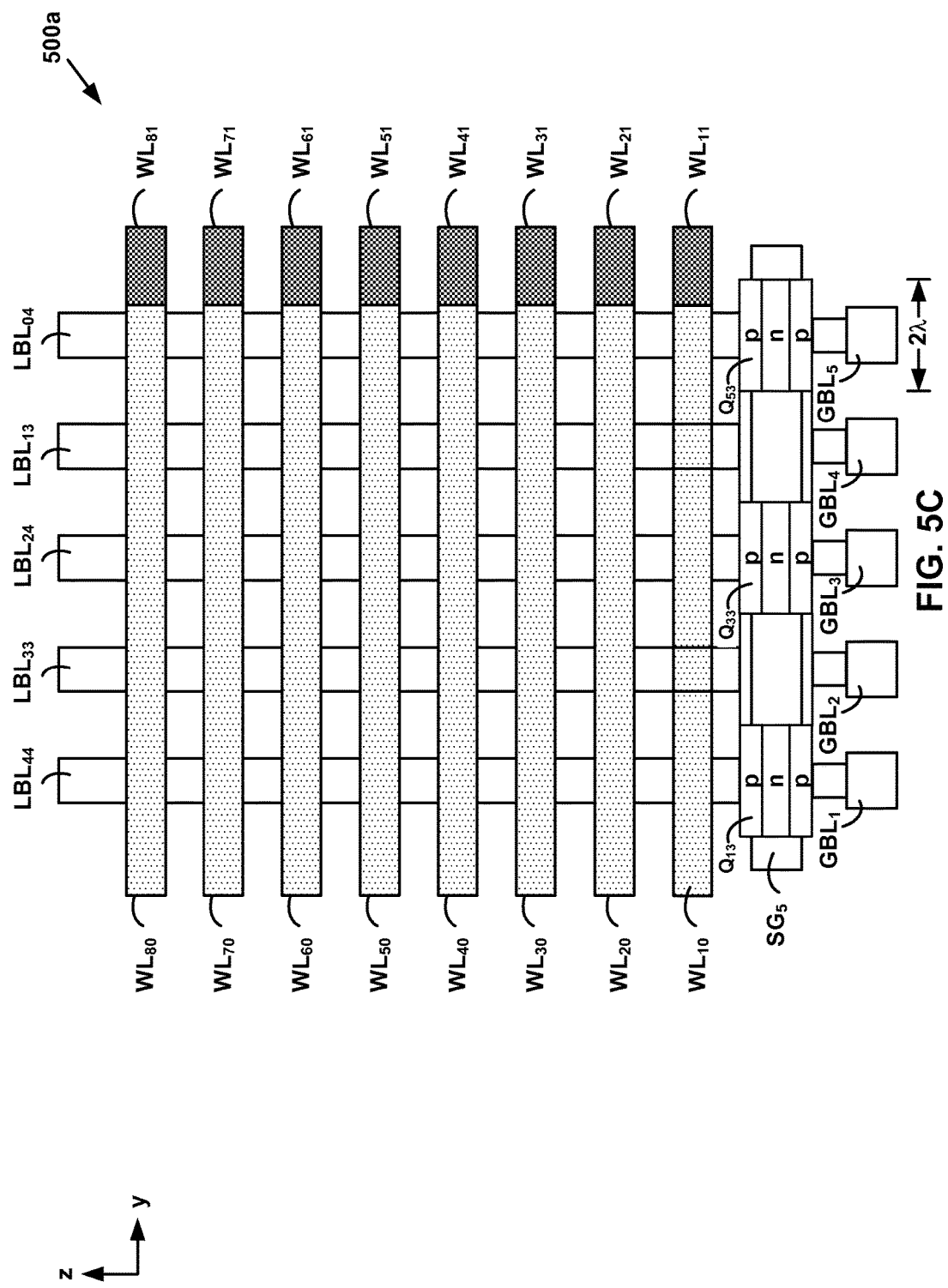

These problems may be avoided using staggered vertical bit lines. In particular, FIGS. 5A-5C depict an embodiment of a portion of a monolithic three-dimensional memory array 500a in which vertical bit lines disposed above adjacent global bit lines are offset from one another in a direction along a long axis of the global bit lines. Staggering the vertical bit lines in a direction along a long axis of the global bit lines permits an increase in the width of the vertically-oriented bit line select transistors. In some embodiments, the vertically-oriented bit line select transistors have a width of about 2-3 times the half-pitch of the vertical bit lines and the word lines. Without wanting to be bound by any particular theory, it is believed that increasing the width increases the drive capability of each vertically-oriented bit line select transistor, and hence increases the available programming current $I_{PRGM}$.

In addition, staggering the vertical bit lines in a direction along a long axis of the global bit lines permits the use of vertically-oriented bit line select transistors that each have two independent control terminals that may be used to individually and collectively turn ON the vertically-oriented bit line select transistor. Without wanting to be bound by any particular theory, it is believed that increasing number of independent control terminals increases the drive capability of each vertically-oriented bit line select transistor, and hence increases the available programming current $I_{PRGM}$.

Monolithic three-dimensional memory array 500a includes vertical bit lines $LBL_{11}$-$LBL_{53}$ arranged in a first direction (e.g., a z-direction), word lines $WL_{10}$, $WL_{20}$, ..., $WL_{81}$ arranged in a second direction (e.g., an x-direction) perpendicular to the first direction, row select lines $SG_1$, $SG_2$, ..., $SG_5$ arranged in the second direction, and global bit lines $GBL_1$, $GBL_2$, ..., $GBL_5$ arranged in a third direction (e.g., a y-direction) perpendicular to the first and second directions. Each of word lines $WL_{10}$, $WL_{20}$, ..., $WL_{81}$ has a comb-like shape, with multiple fingers on each comb, and the fingers of word lines $WL_{10}$, $WL_{20}$, ... $WL_{80}$ are interleaved with the fingers of word lines $WL_{11}$, $WL_{21}$, ... $WL_{81}$, respectively. Persons of ordinary skill in the art will understand that the word lines alternatively may have liner or other non-comb-like shapes.

Vertical bit lines $LBL_{11}$-$LBL_{53}$ are disposed above global bit lines $GBL_1$, $GBL_2$, ..., $GBL_5$, which each have a long axis in the second (e.g., x-direction). Vertical bit lines $LBL_{11}$-$LBL_{53}$ are staggered such that vertical bit lines disposed above adjacent global bit lines are offset from one another in a direction along the long axis of the global bit lines.

For example, vertical bit lines $LBL_{11}$, $LBL_{12}$ and $LBL_{13}$ are disposed above global bit line $GBL_1$, and vertical bit lines $LBL_{21}$ and $LBL_{22}$ are disposed above adjacent global bit line $GBL_2$. Vertical bit lines $LBL_{21}$ and $LBL_{22}$ are offset from vertical bit lines $LBL_{11}$, $LBL_{12}$ and $LBL_{13}$ in a direction along the long axis of the global bit lines. Likewise, vertical bit lines $LBL_{51}$, $LBL_{52}$ and $LBL_{53}$ are disposed above global bit line $GBL_5$, and vertical bit lines $LBL_{41}$ and $LBL_{42}$ are disposed above adjacent global bit line $GBL_5$. Vertical bit lines $LBL_{41}$ and $LBL_{42}$ are offset from vertical bit lines $LBL_{51}$, $LBL_{52}$ and $LBL_{53}$ in a direction along the long axis of the global bit lines.

A memory cell is disposed between the intersection of each vertical bit line and each word line (e.g., memory cell $M_{811}$ is disposed between vertical bit line $LBL_{11}$ and word line $WL_{80}$). Each memory cell may include a floating gate device or a charge trap device (e.g., using a silicon nitride material) or resistive change memory device. A set of vertically-oriented bit line select transistors (e.g., $Q_{11}$, $Q_{12}$, $Q_{13}$) may be used to select a set of vertical local bit lines (e.g., $LBL_{11}$, $LBL_{12}$, $LBL_{13}$). Vertically-oriented bit line select transistors $Q_{11}$-$Q_{53}$ may be field effect transistors, such as shown, or may be any other transistors.

Each of vertically-oriented bit line select transistors $Q_{11}$-$Q_{53}$ has a first terminal (e.g., a drain/source terminal), a second terminal (e.g., a source/drain terminal), a first control terminal (e.g., a first gate terminal) and a second control terminal (e.g., a second gate terminal). The first gate terminal and the second gate terminal may be disposed on opposite sides of the vertically-oriented bit line select transistor. The first gate terminal may be used to selectively induce a first conductive channel between the first terminal and the second terminal of the transistor, and the second gate terminal may be used to selectively induce a second conductive channel between the first terminal and the second terminal of the transistor.

The first gate terminal and the second gate terminal are independent control terminals that may be used to individually and collectively turn ON the vertically-oriented bit line select transistor. That is, the first gate terminal may be used to turn ON the vertically-oriented bit line select transistor, the second gate terminal may be used to turn ON the vertically-oriented bit line select transistor, and the first and second gate terminals may be used to turn ON the vertically-oriented bit line select transistor.

Thus, either the first gate terminal or the second gate terminal of each of vertically-oriented bit line select transistors $Q_{11}$-$Q_{53}$ may be used to select a corresponding one of vertical bit lines $LBL_{11}$, $LBL_{12}$, ..., $LBL_{53}$. In addition, without wanting to be bound by any particular theory, for each of vertically-oriented bit line select transistors $Q_{11}$-$Q_{53}$, the current drive capability of the transistor may be increased by using both the first gate terminal and the second gate terminal to turn ON the transistor.

For example, for each of vertically-oriented bit line select transistors $Q_{11}$-$Q_{53}$, if the first gate terminal or the second gate terminal are used to turn ON the transistor, the current drive capability of the transistor may be between about 1.2 uA and about 2.4 uA. In contrast, if both the first gate terminal and the second gate terminal to turn ON the transistor, the current drive capability of the transistor may be between about 3 uA and about 6 uA.

Referring again to FIGS. 5A-5C, vertically-oriented bit line select transistors $Q_{11}$, $Q_{31}$, $Q_{51}$ are used to selectively connect vertical bit lines $LBL_{11}$, $LBL_{31}$, $LBL_{51}$ to global bit lines $GBL_1$, $GBL_3$, $GBL_5$, respectively, using row select lines $SG_1$ and $SG_2$. In particular, each of vertically-oriented bit line select transistors $Q_{11}$, $Q_{31}$, $Q_{51}$ has a first terminal (e.g., a drain./source terminal) coupled to a corresponding one of vertical bit lines $LBL_{11}$, $LBL_{31}$, $LBL_{51}$, respectively, a second terminal (e.g., a source/drain terminal) coupled to a corresponding one of global bit lines $GBL_1$, $GBL_3$, $GBL_5$, respectively, and a first control terminal (e.g., a first gate terminal) coupled to row select line $SG_1$ and a second control terminal (e.g., a second gate terminal) coupled to row select line $SG_2$. Row select lines $SG_1$ and $SG_2$ may individually and collectively connect vertical bit lines $LBL_{11}$, $LBL_{31}$, $LBL_{51}$ to global bit lines $GBL_1$, $GBL_3$, $GBL_5$, respectively.

Vertically-oriented bit line select transistors $Q_{21}$, $Q_{41}$ are used to selectively connect vertical bit lines $LBL_{21}$, $LBL_{41}$ to global bit lines $GBL_2$, $GBL_4$, respectively, using row select lines $SG_2$ and/or $SG_3$. In particular, each of vertically-oriented bit line select transistors $Q_{21}$, $Q_{41}$ has a first terminal (e.g., a drain./source terminal) coupled to a corresponding one of vertical bit lines $LBL_{21}$, $LBL_{41}$, respectively, a second terminal (e.g., a source/drain terminal) coupled to a corresponding one of global bit lines $GBL_2$, $GBL_4$, respectively, and a first control terminal (e.g., a first gate terminal) coupled to row select line $SG_2$ and a second control terminal (e.g., a second gate terminal) coupled to row select line $SG_3$. Row select lines $SG_2$ and $SG_3$ may individually and collectively connect vertical bit lines $LBL_{21}$, $LBL_{41}$ to global bit lines $GBL_2$, $GBL_4$, respectively.

Vertically-oriented bit line select transistors $Q_{12}, Q_{32}, Q_{52}$ are used to selectively connect vertical bit lines $LBL_{12}$, $LBL_{32}, LBL_{52}$ to global bit lines $GBL_1, GBL_3, GBL_5$, respectively, using row select lines $SG_3$ and/or $SG_4$. In particular, each of vertically-oriented bit line select transistors $Q_{12}, Q_{32}, Q_{52}$ has a first terminal (e.g., a drain./source terminal) coupled to a corresponding one of vertical bit lines $LBL_{12}, LBL_{32}, LBL_{52}$, respectively, a second terminal (e.g., a source/drain terminal) coupled to a corresponding one of global bit lines $GBL_1, GBL_3, GBL_5$, respectively, and a first control terminal (e.g., a first gate terminal) coupled to row select line $SG_3$ and a second control terminal (e.g., a second gate terminal) coupled to row select line $SG_4$. Row select lines $SG_3$ and $SG_4$ may individually and collectively connect vertical bit lines $LBL_{12}, LBL_{32}, LBL_{52}$ to global bit lines $GBL_1, GBL_3, GBL_5$, respectively.

Vertically-oriented bit line select transistors $Q_{22}, Q_{42}$ are used to selectively connect vertical bit lines $LBL_{22}, LBL_{42}$ to global bit lines $GBL_2, GBL_4$, respectively, using row select lines $SG_4$ and/or $SG_5$. In particular, each of vertically-oriented bit line select transistors $Q_{22}, Q_{42}$ has a first terminal (e.g., a drain./source terminal) coupled to a corresponding one of vertical bit lines $LBL_{22}, LBL_{42}$, respectively, a second terminal (e.g., a source/drain terminal) coupled to a corresponding one of global bit lines $GBL_2, GBL_4$, respectively, and a first control terminal (e.g., a first gate terminal) coupled to row select line $SG_4$ and a second control terminal (e.g., a second gate terminal) coupled to row select line $SG_5$. Row select lines $SG_4$ and $SG_5$ may individually and collectively connect vertical bit lines $LBL_{22}, LBL_{42}$ to global bit lines $GBL_2, GBL_4$, respectively.

Vertically-oriented pillar-shaped transistors $Q_{13}, Q_{33}, Q_{53}$ are used to selectively connect vertical bit lines $LBL_{13}$, $LBL_{33}, LBL_{53}$ to global bit lines $GBL_1, GBL_3, GBL_5$, respectively, using row select lines $SG_5$ and/or $SG_6$. In particular, each of vertically-oriented pillar-shaped transistors $Q_{13}, Q_{33}, Q_{53}$ has a first terminal (e.g., a drain./source terminal) coupled to a corresponding one of vertical bit lines $LBL_{13}, LBL_{33}, LBL_{53}$, respectively, a second terminal (e.g., a source/drain terminal) coupled to a corresponding one of global bit lines $GBL_1, GBL_3, GBL_5$, respectively, and a first control terminal (e.g., a first gate terminal) coupled to row select line $SG_5$ and a second control terminal (e.g., a second gate terminal) coupled to row select line $SG_6$. Row select lines $SG_5$ and $SG_6$ may individually and collectively connect vertical bit lines $LBL_{13}, LBL_{33}, LBL_{53}$ to global bit lines $GBL_1, GBL_3, GBL_5$, respectively.

Figure 5D:
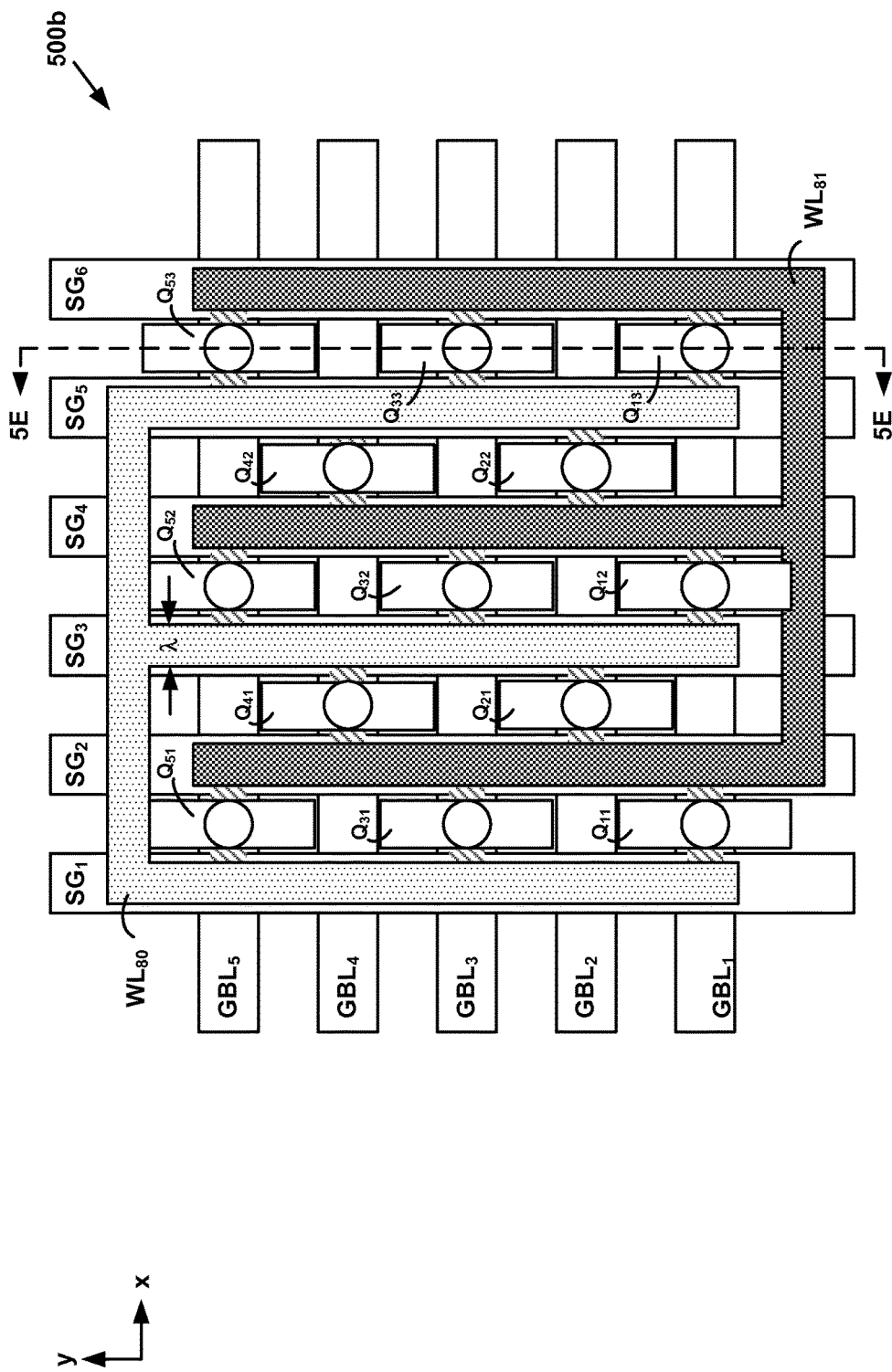
FIG. 5D depicts a top level view of another embodiment of a monolithic three-dimensional memory array.
Figure 5E:
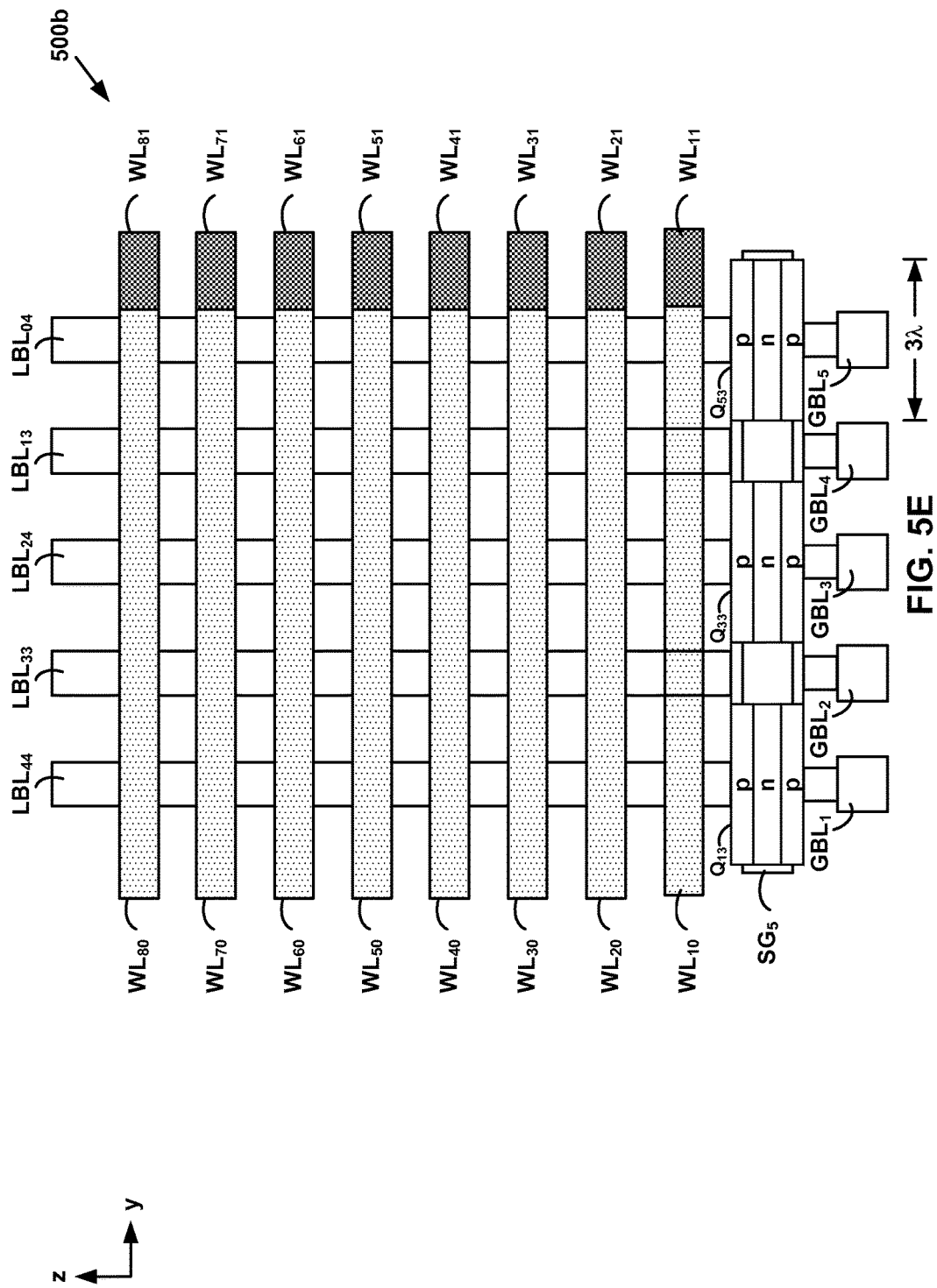
FIG. 5E depicts a perspective view of the monolithic three-dimensional memory array of FIG. 5D.

In an embodiment, each of vertical bit lines $LBL_{11}$, $LBL_{12}, \ldots, LBL_{53}$ and word lines $WL_{10}, WL_{20}, \ldots, WL_{81}$ has a half-pitch X, and each of vertically-oriented pillar-shaped transistors $Q_{11}$-$Q_{53}$ has a width wider of between about $2\lambda$-$3\lambda$. For example, as depicted in FIGS. 5A-5C, monolithic three-dimensional memory array 500a includes vertically-oriented pillar-shaped transistors $Q_{11}$-$Q_{53}$ that each have a width of about $2\lambda$. In contrast, as depicted in FIGS. 5D-5E, monolithic three-dimensional memory array 500b includes vertically-oriented pillar-shaped transistors $Q_{11}$-$Q_{53}$ that each have a width of about $3\lambda$. Other widths may be used for each of vertically-oriented pillar-shaped transistors $Q_{11}$-$Q_{53}$.

Figure 6A:
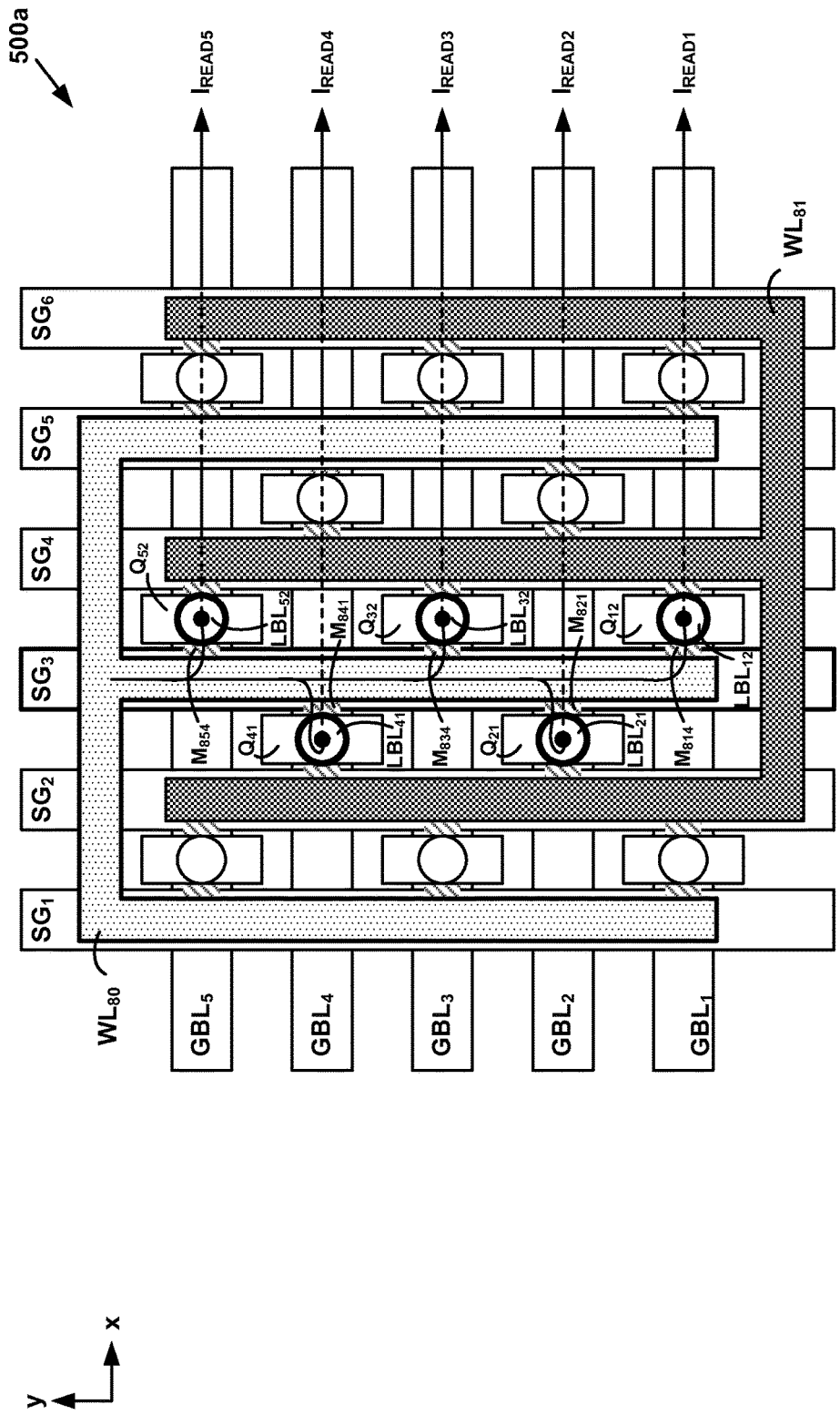
FIG. 6A depicts a top view of the monolithic three-dimensional memory array of FIG. 5A during a read operation.

Referring to FIG. 6A, an example read operation of monolithic three-dimensional memory array 500a is described. In particular, the data stored in memory cells $M_{854}, M_{841}, M_{834}, M_{821}$ and $M_{814}$ may be read by biasing the word line connected to the selected memory cells (e.g., word line $WL_{80}$) to a selected word line read voltage (e.g., 0V), and by biasing row select line $SG_3$ to turn ON vertically-oriented pillar-shaped transistors $Q_{52}, Q_{41}, Q_{32}, Q_{21}$ and $Q_{12}$. As a result, vertical bit lines $LBL_{52}, LBL_{41}, LBL_{32}$, $LBL_{21}$ and $LBL_{12}$ coupled to selected memory cells $M_{854}$, $M_{841}, M_{834}, M_{821}$ and $M_{814}$, respectively, are connected to global bit lines $GBL_5, GBL_4, GBL_3, GBL_2$ and $GBL_1$, respectively, which are biased to a bit line read voltage (e.g., 1V).

As a result, a read current $I_{READ5}$ is conducted by selected memory cell $M_{854}$, vertical bit line $LBL_{52}$, vertically-oriented pillar-shaped transistor $Q_{52}$, and global bit line $GBL_5$, and may be coupled to a sense amplifier to determine a data state of the selected memory cell $M_{854}$. Likewise, a read current $I_{READ4}$ is conducted by selected memory cell $M_{841}$, vertical bit line $LBL_{41}$, vertically-oriented pillar-shaped transistor $Q_{41}$, and global bit line $GBL_4$, and may be coupled to a sense amplifier to determine a data state of the selected memory cell $M_{841}$. Similarly, a read current $I_{READ3}$ is conducted by selected memory cell $M_{834}$, vertical bit line $LBL_{32}$, vertically-oriented pillar-shaped transistor $Q_{32}$, and global bit line $GBL_3$, and may be coupled to a sense amplifier to determine a data state of the selected memory cell $M_{834}$. In addition, a read current $I_{READ2}$ is conducted by selected memory cell $M_{821}$, vertical bit line $LBL_{21}$, vertically-oriented pillar-shaped transistor $Q_{21}$, and global bit line $GBL_2$, and may be coupled to a sense amplifier to determine a data state of the selected memory cell $M_{821}$. Further, a read current $I_{READ1}$ is conducted by selected memory cell $M_{814}$, vertical bit line $LBL_{12}$, vertically-oriented pillar-shaped transistor $Q_{12}$, and global bit line $GBL_1$, and may be coupled to a sense amplifier to determine a data state of the selected memory cell $M_{814}$. Persons of ordinary skill in the art will understand that fewer than all memory cells coupled to a selected row select line.

Figure 6B:
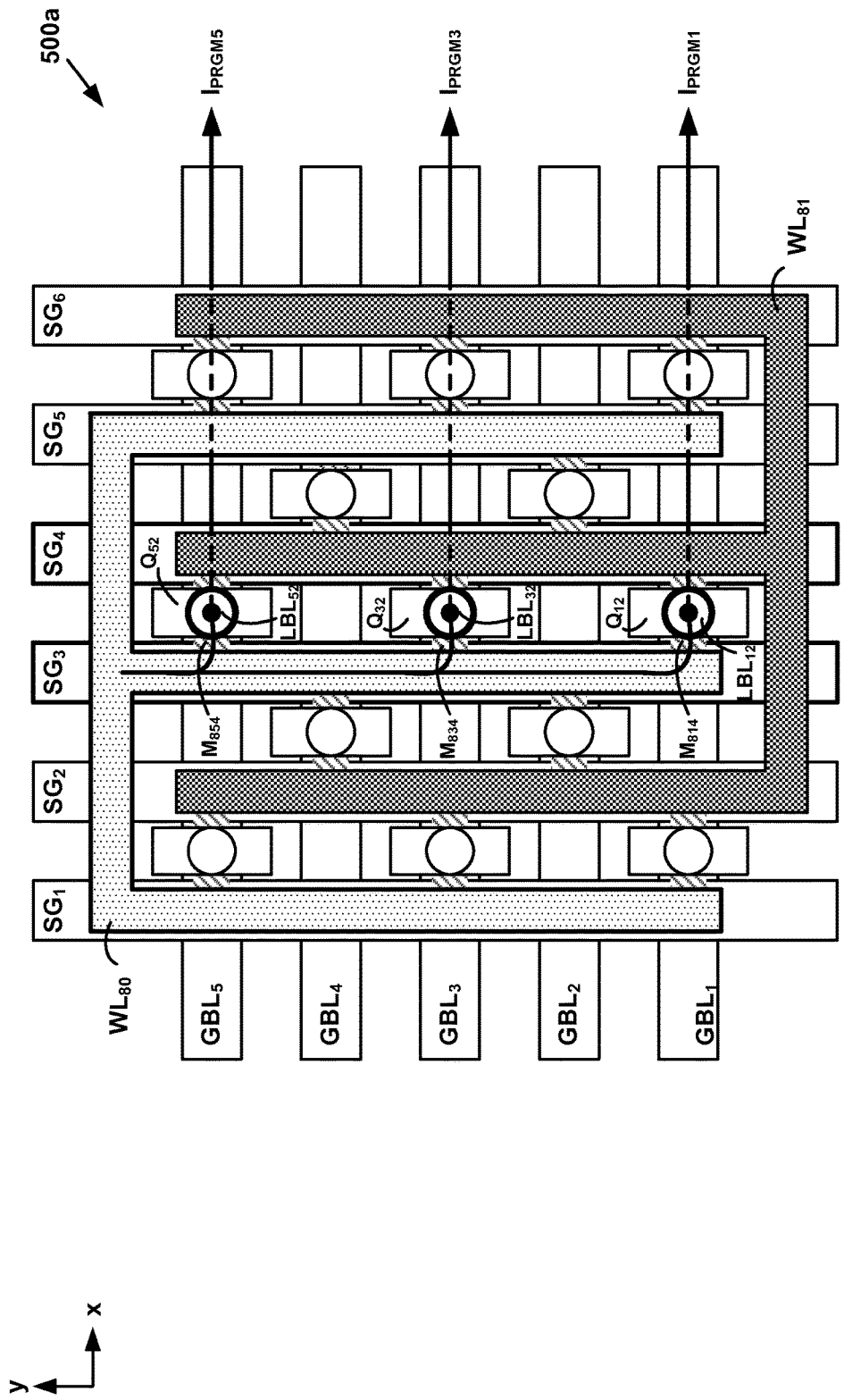
FIG. 6B depicts a top view of the monolithic three-dimensional memory array of FIG. 5A during a write operation.

Referring to FIG. 6B, an example write operation of monolithic three-dimensional memory array 500a is described. In particular, memory cells $M_{854}, M_{834}$ and $M_{814}$ may be programmed by biasing the word line connected to selected memory cells $M_{854}, M_{834}$ and $M_{814}$ to a selected word line write voltage (e.g., 5V), and by biasing row select lines $SG_3$ and $SG_4$ to turn ON vertically-oriented pillar-shaped transistors $Q_{52}, Q_{32}$ and $Q_{12}$. As a result, vertical bit lines $LBL_{52}, LBL_{32}$ and $LBL_{12}$ coupled to selected memory cells $M_{854}, M_{834}$ and $M_{814}$, respectively, are connected to global bit lines $GBL_5, GBL_3$ and $GBL_1$, respectively, which are biased to a bit line write voltage (e.g., 0V).

As a result, a programming current $I_{PRGM5}$ is conducted by selected memory cell $M_{854}$, vertical bit line $LBL_{52}$, vertically-oriented pillar-shaped transistor $Q_{52}$, and global bit line $GBL_5$, a programming current $I_{PRGM3}$ is conducted by selected memory cell $M_{834}$, vertical bit line $LBL_{32}$, vertically-oriented pillar-shaped transistor $Q_{32}$, and global bit line $GBL_3$, and a programming current $I_{PRGM1}$ is conducted by selected memory cell $M_{814}$, vertical bit line $LBL_{12}$, vertically-oriented pillar-shaped transistor $Q_{12}$, and global bit line $GBL_1$.

Without wanting to be bound by any particular theory, it is believed that using both row select lines $SG_3$ and $SG_4$ to turn ON vertically-oriented pillar-shaped transistors $Q_{52}$, $Q_{32}$ and $Q_{12}$, and using transistor widths of 2-3 half-pitch of the vertical bit lines and the word lines, increases the drive capability of each vertically-oriented pillar-shaped transistors $Q_{52}, Q_{32}$ and $Q_{12}$, and hence increases the available programming current $I_{PRGM5}, I_{PRGM3}$, and $I_{PRGM1}$.

Figure 7A:
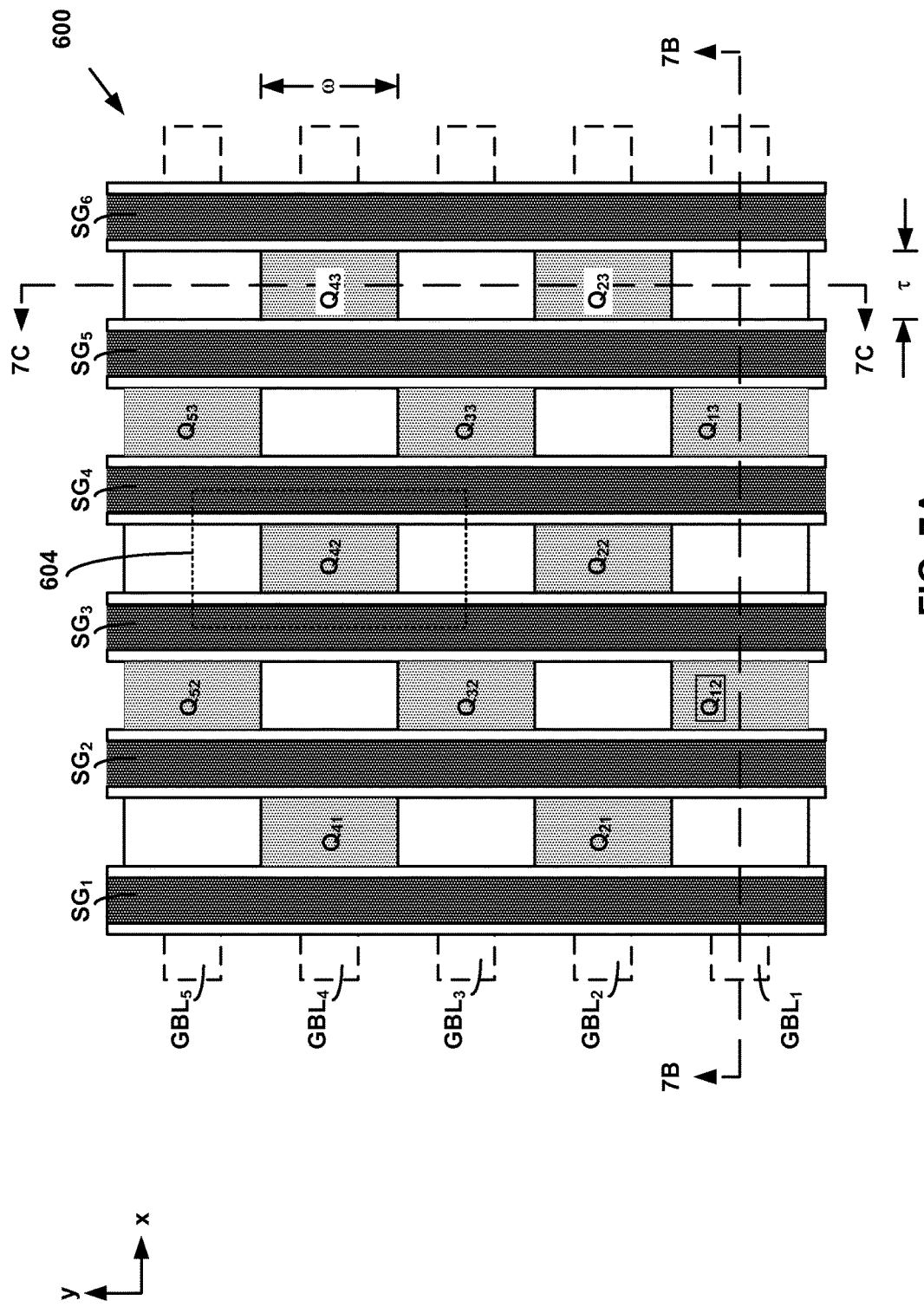
FIG. 7A depicts a top level view of an embodiment monolithic three-dimensional memory array.
Figure 7B:
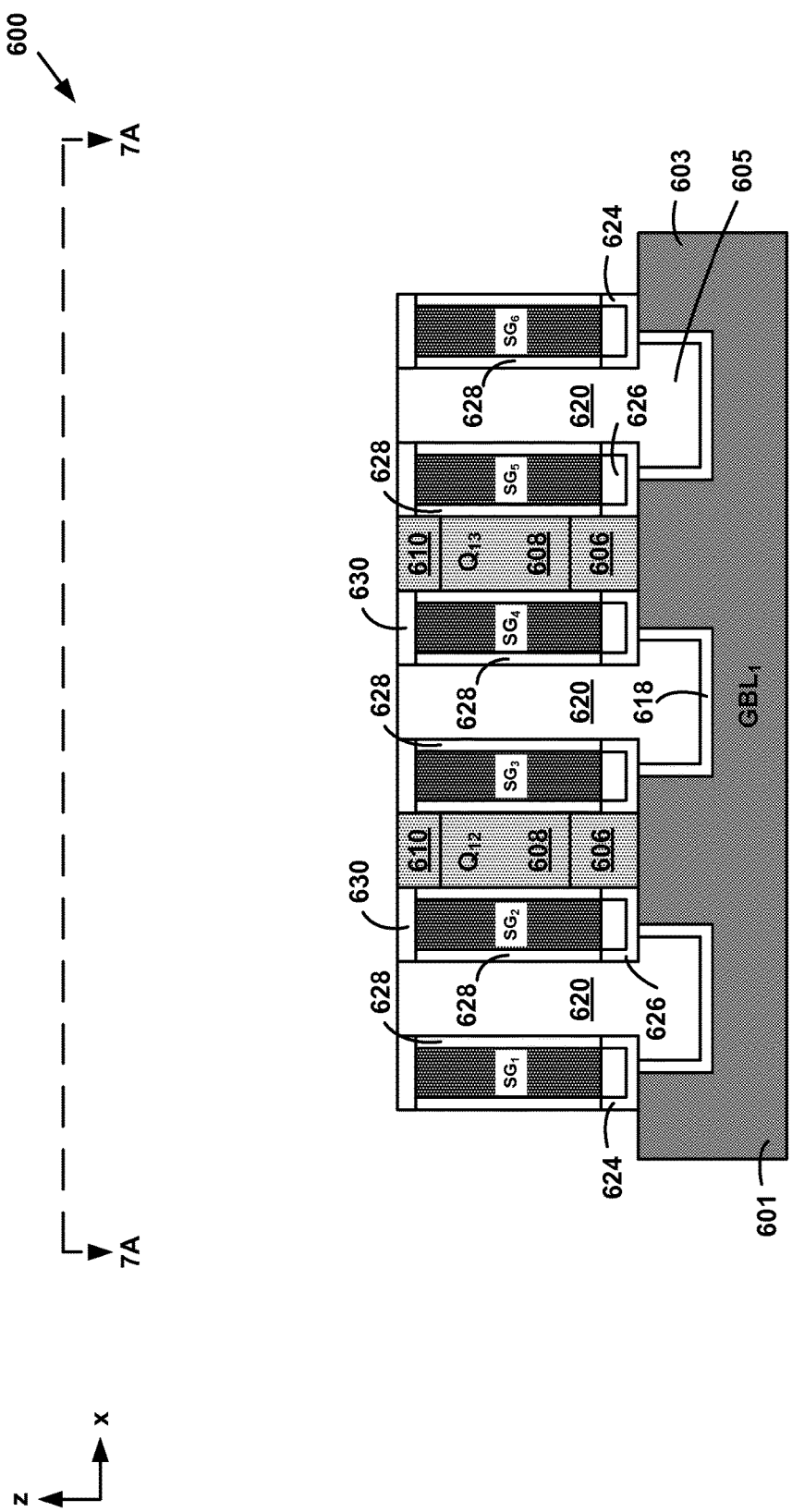
FIGS. 7B-7C depict various perspective views of the monolithic three-dimensional memory array of FIG. 7A.
Figure 7C:
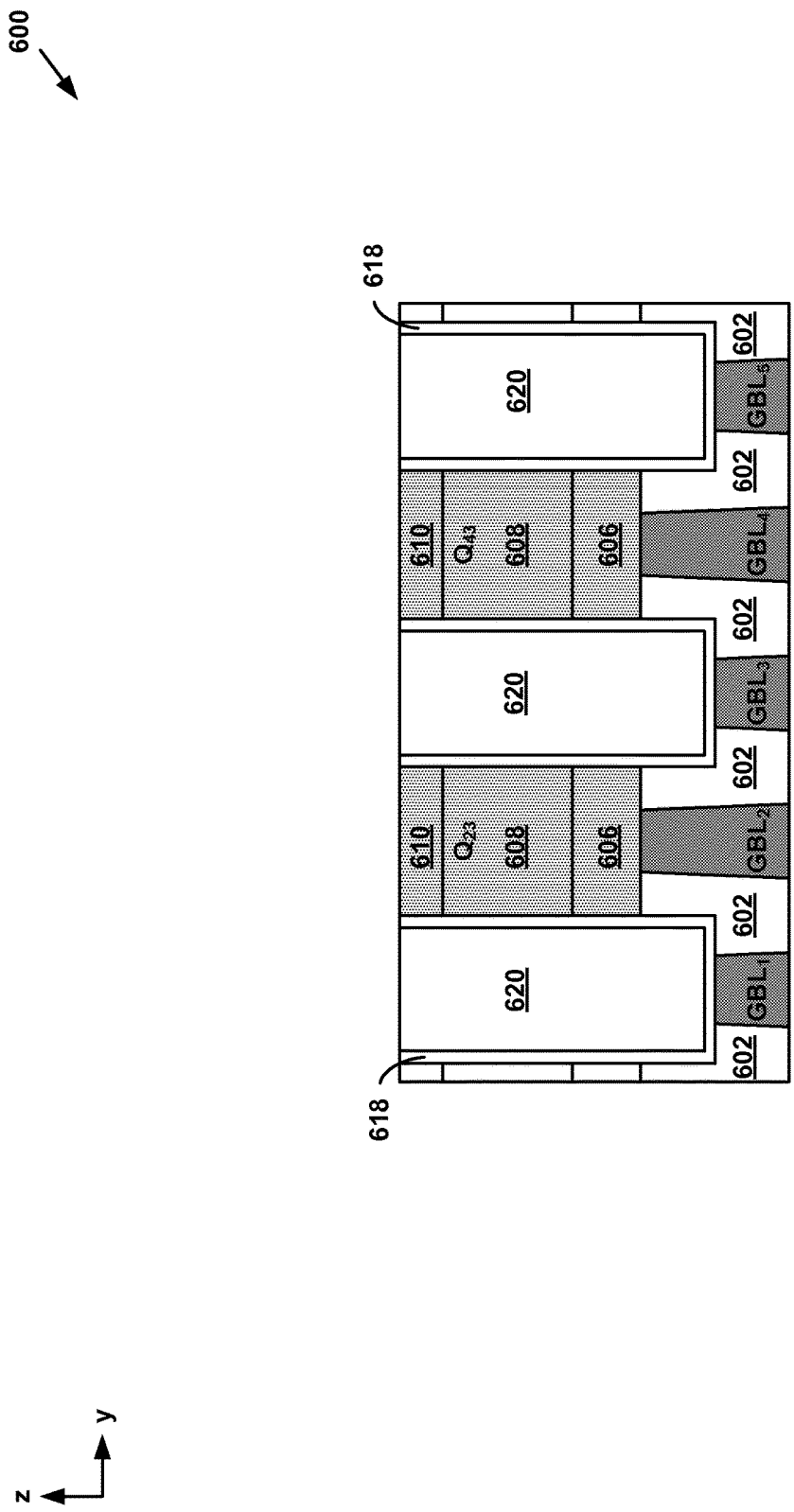

As described above and illustrated in FIGS. 5A-5C, staggering vertical bit lines in a direction along a long axis of the global bit lines permits an increase in the width of the vertically-oriented bit line select transistors, which also are staggered in a direction along a long axis of the global bit lines. FIGS. 7A-7C depict another embodiment of a portion of a monolithic three-dimensional memory array 600 in which vertically-oriented bit line select transistors are staggered in a direction along a long axis of the global bit lines. To avoid overcomplicating the drawings, vertically-oriented bit line select transistors are depicted, but vertical bit lines and word lines are not illustrated. Persons of ordinary skill in the art will understand that a vertical bit line may be disposed above each vertically-oriented bit line select transistor.

Monolithic three-dimensional memory array 600 includes row select lines $SG_1$, $SG_2$, . . . , $SG_6$ arranged in a first direction (e.g., an x-direction), global bit lines $GBL_1$, $GBL_2$, . . . , $GBL_5$, arranged in a second direction (e.g., a y-direction) perpendicular to the first direction, and vertically-oriented bit line select transistors $Q_{12}$-$Q_{53}$ staggered in a direction along a long axis of global bit lines $GBL_1$, $GBL_2$, . . . , $GBL_5$, (i.e., along the x-axis in FIG. 7A). Row select lines $SG_1$, $SG_2$, . . . , $SG_6$ and vertically-oriented bit line select transistors $Q_{12}$-$Q_{53}$ are disposed above global bit lines $GBL_1$, $GBL_2$, . . . , $GBL_5$. Although not depicted in FIGS. 7A-7C, vertical bit lines may be arranged in a third direction (e.g., a z-direction) and disposed on vertically-oriented bit line select transistors $Q_{12}$-$Q_{53}$.

Vertically-oriented bit line select transistors $Q_{12}$-$Q_{53}$ each have a thickness τ and a width ω, wherein the width ω of each vertically-oriented bit line select transistor is greater than the thickness τ. In the plane illustrated in FIG. 7A, each of vertically-oriented bit line select transistors $Q_{12}$-$Q_{53}$ has a long axis and a short axis. The width ω of each vertically-oriented bit line select transistor is the dimension of the long axis (i.e., along the y-axis in FIG. 7A), and the thickness τ is the dimension of the short axis (i.e., along the x-axis in FIG. 7A), as depicted in FIG. 7A. In some embodiments, the width ω of each vertically-oriented bit line select transistor is between about 2-3 times the thickness τ of the vertically-oriented bit line select transistor. The long axis of each of vertically-oriented bit line select transistors $Q_{12}$-$Q_{53}$ (i.e., along the y-axis in FIG. 7A) is substantially parallel to the long axis of each of row select lines $SG_1$, $SG_2$, . . . , $SG_6$ (i.e., along the y-axis in FIG. 7A), and substantially perpendicular to each of global bit lines $GBL_1$, $GBL_2$, . . . , $GBL_5$.

In the example embodiment of monolithic three-dimensional memory array 600 FIGS. 7A-7C, each of global bit lines $GBL_1$, $GBL_2$, . . . , $GBL_5$, row select lines $SG_1$, $SG_2$, . . . , $SG_6$, vertical bit lines (not shown) and word lines (not shown) has a width "F," which may be the minimum feature size of the device, and vertically-oriented bit line select transistors $Q_{12}$-$Q_{53}$ each have a thickness τ=F. Thus, each memory cell (shown in dashed line 604) occupies an area $A_{cell}=8F^2$.

Global bit lines $GBL_1$, $GBL_2$, . . . , $GBL_5$ are formed above a substrate (not shown), and includes a conductor such as tungsten or other similar conductive material, and optionally may include an adhesion layer (not shown), such as titanium nitride or other similar adhesion layer material. A dielectric material 602, such as $SiO_2$ or other similar dielectric material is disposed between adjacent global bit lines $GBL_1$, $GBL_2$, . . . , $GBL_5$. Each of global bit lines $GBL_1$, $GBL_2$, . . . , $GBL_5$ may have a width (y-direction) between about 19 nm and about 24 nm, and a thickness (z-direction) between about 200 nm and about 250 nm, although other dimensions may be used. Dielectric material 602 may have a width (y-direction) between about 19 nm and about 24 nm, and a thickness (z-direction) between about 200 nm and about 250 nm, although other dimensions may be used.

Each of global bit lines $GBL_1$, $GBL_2$, . . . , $GBL_5$ has a base portion 601, and a series of tab portions 603 extending in a z-direction above base portion 601, with recesses 605 separating adjacent tab portions 603, such as illustrated in FIG. 7B. Each recess 605 may have a height (z-direction) between about 15 nm and about 30 nm, and a width (x-direction) between about 38 nm and about 48 nm, although other dimensions may be used.

Each of vertically-oriented bit line select transistors $Q_{12}$-$Q_{53}$ has a first region 606 having a first conductivity type (e.g., n+ polysilicon), a second region 608 having a second conductivity type (e.g., p polysilicon) above first region 606, and a third region 610 having the first conductivity type (e.g., n+ polysilicon) above second region 608, to form drain/source, body, and source/drain regions, respectively, of a vertical FET. Although vertically-oriented bit line select transistors $Q_{12}$-$Q_{53}$ are shown as having a rectangular cross-sectional shape, persons of ordinary skill in the art will understand that vertically-oriented bit line select transistors $Q_{12}$-$Q_{53}$ may have other shapes.

In some embodiments, first region 606 may have a height of about 100 angstroms to about 400 angstroms, second region 608 may have a height of about 1100 angstroms to about 2100 angstroms, and third region 610 may have a height of about 100 angstroms to about 700 angstroms, although other dimensions may be used. As described in more detail below, vertically-oriented bit line select transistors $Q_{12}$-$Q_{53}$ may be formed by depositing semiconductor material, doping the semiconductor material to form drain/source, body, and source/drain regions, and then etching the semiconductor material to form vertically-oriented bit line select transistors $Q_{12}$-$Q_{53}$.

Persons of ordinary skill in the art will understand that vertically-oriented bit line select transistors $Q_{12}$-$Q_{53}$ also may be formed using layer-transfer techniques that provide a single-crystal layer. In addition, persons of ordinary skill in the art will understand that vertically-oriented bit line select transistors $Q_{12}$-$Q_{53}$ alternatively may be doped p+/n/p+, or may be doped with a single type of dopant to produce a junctionless-FET. Vertically-oriented bit line select transistors $Q_{12}$-$Q_{53}$ may include silicon, germanium, silicon-germanium alloys, or other similar semiconductor materials. In addition, vertically-oriented bit line select transistors $Q_{12}$-$Q_{53}$ may include wide band-gap semiconductor materials, such as ZnO, InGaZnO, or SiC, which may provide a high breakdown voltage, and typically may be used to provide junctionless FETs.

Row select lines $SG_1$, $SG_2$, . . . , $SG_6$ are disposed on opposite sides of vertically-oriented bit line select transistors $Q_{12}$-$Q_{53}$. In particular, row select lines $SG_1$ and $SG_2$ are disposed on opposite sides of vertically-oriented bit line select transistors $Q_{21}$ and $Q_{41}$, row select lines $SG_2$ and $SG_3$ are disposed on opposite sides of vertically-oriented bit line select transistors $Q_{12}$, $Q_{32}$ and $Q_{52}$, row select lines $SG_3$ and $SG_4$ are disposed on opposite sides of vertically-oriented bit line select transistors $Q_{22}$ and $Q_{42}$, row select lines $SG_4$ and $SG_5$ are disposed on opposite sides of vertically-oriented bit line select transistors $Q_{132}$, $Q_{33}$ and $Q_{53}$, and row select lines $SG_5$ and $SG_6$ are disposed on opposite sides of vertically-oriented bit line select transistors $Q_{23}$ and $Q_{43}$.

Row select lines $SG_1$, $SG_2$, . . . , $SG_6$ each include a conductor, such as a metal (e.g., titanium nitride or other similar metal), a highly-doped semiconductor, such as n+ polysilicon, p+ polysilicon, or other similar conductive material, and has a width between about 10 nm and about 20 nm, and a thickness between about 160 nm and about 320 nm, although other dimensions may be used.

A liner material 618, such silicon nitride or other similar liner material, is disposed on sidewalls of recesses 606, and a dielectric material 620, such as $SiO_2$ or other similar dielectric material, is disposed above liner material 618 and between adjacent row select lines $SG_1, SG_2, \ldots, SG_6$. Liner material 618 may have a thickness between about 4 nm and about 6 nm, and dielectric material 620 may have a thickness between about 175 nm and about 350 nm, although other dimensions may be used.

Each of row select lines $SG_1, SG_2, \ldots, SG_6$ is disposed on a bottom isolation material including a liner material 624, such as silicon nitride or other similar liner material, and a dielectric material 626, such as $SiO_2$ or other similar dielectric material, is disposed above liner material 624. Liner material 624 may have a thickness between about 4 nm and about 6 nm, and dielectric material 626 may have a thickness between about 5 nm and about 15 nm, although other dimensions may be used.

A gate dielectric material 628, such as $SiO_2$ or other similar gate dielectric material, is disposed between each of row select lines $SG_1, SG_2, \ldots, SG_6$ and corresponding vertically-oriented bit line select transistors $Q_{12}$-$Q_{53}$. Gate dielectric material 628 may have a thickness between about 3 nm and about 7 nm, although other dimensions may be used.

Isolation plugs 630, such as $SiO_2$ or other similar dielectric material, are disposed above each of row select lines $SG_1, SG_2, \ldots, SG_6$. Isolation plugs 630 may have a thickness between about 10 nm and about 70 nm, although other dimensions may be used.

Referring now to FIGS. 8A-16C, an example method of forming a monolithic three-dimensional memory array in which vertically-oriented bit line select transistors are staggered in a direction along a long axis of the global bit lines is described. In particular, FIGS. 8A-16C illustrate an example method of forming monolithic three-dimensional memory array 600 of FIGS. 7A-7C.

Figure 8A:
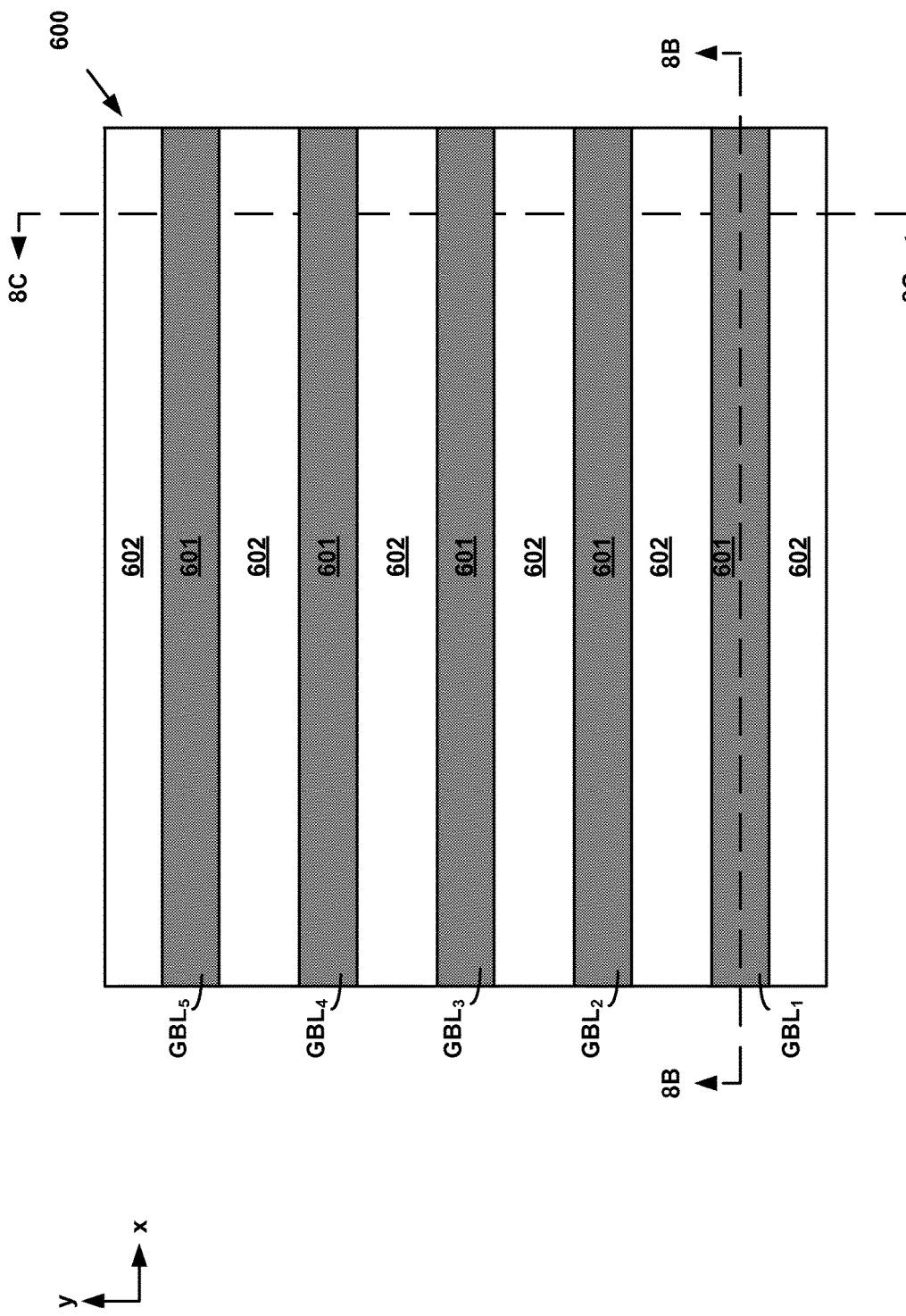
FIGS. 8A-16C are cross-sectional views of a portion of a substrate during an example fabrication of the monolithic three-dimensional memory array of FIGS. 7A-7C.
Figure 8C:
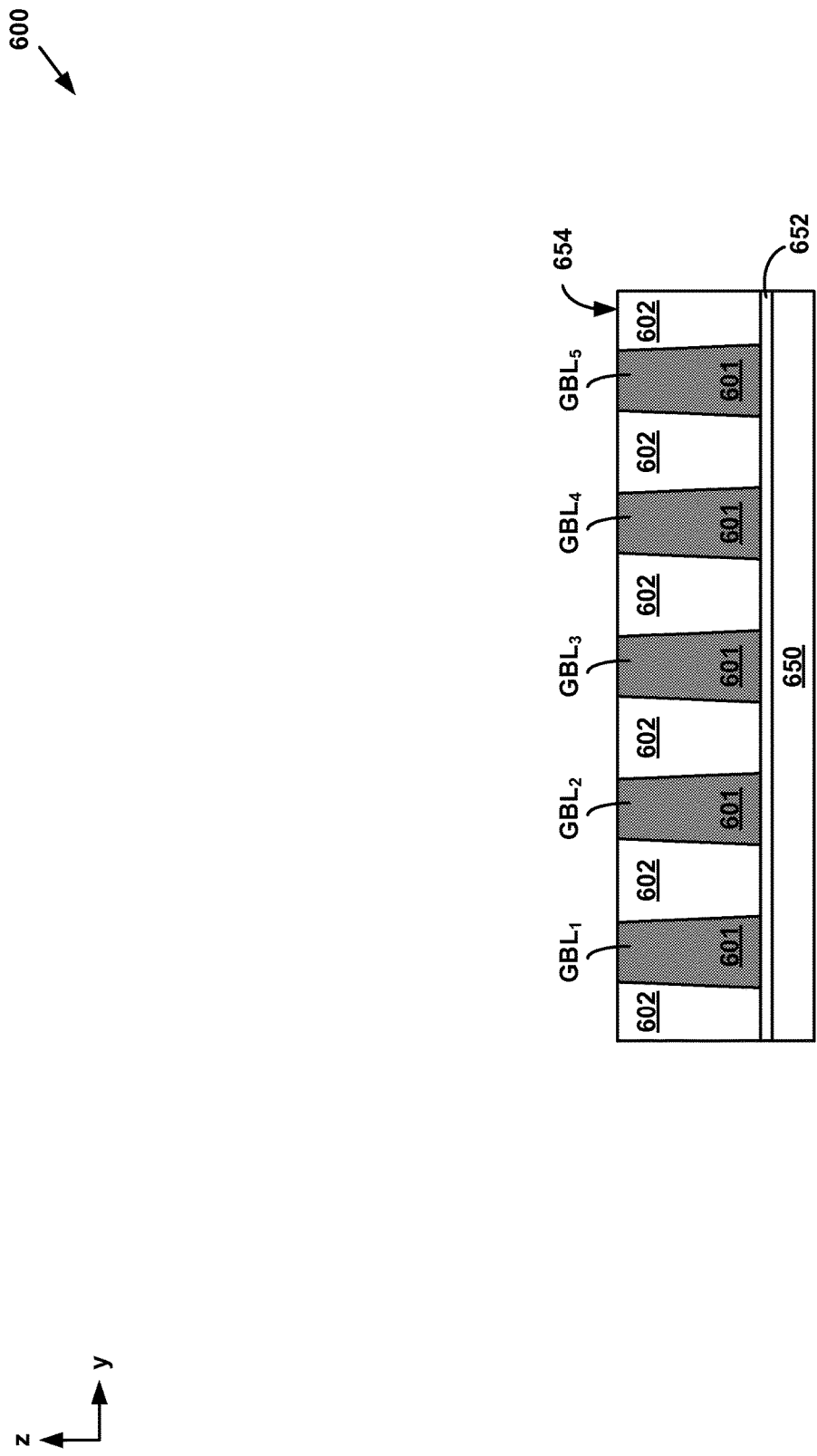

With reference to FIGS. 8A-8C, substrate 650 is shown as having already undergone several processing steps. Substrate 650 may be any suitable substrate such as a silicon, germanium, silicon-germanium, undoped, doped, bulk, silicon-on-insulator ("SOI") or other substrate with or without additional circuitry. For example, substrate 650 may include one or more n-well or p-well regions (not shown). Isolation layer 652 is formed above substrate 650. In some embodiments, isolation layer 652 may be a layer of silicon dioxide, silicon nitride, silicon oxynitride or any other suitable insulating layer.

Following formation of isolation layer 652, a conductive layer 601 is deposited over isolation layer 652. Conductive layer 601 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 601 may comprise between about 200 and about 2500 angstroms of tungsten. Other conductive layer materials and/or thicknesses may be used. In some embodiments, an adhesion layer (not shown), such as titanium nitride or other similar adhesion layer material, may be disposed between isolation layer 652 and conductive layer 601, and/or between the conductive layer 601 and subsequent vertically-oriented bit line select transistors layers.

Persons of ordinary skill in the art will understand that adhesion layers may be formed by PVD or another method on conductive layers, such as conductive layer 601. For example, adhesion layers may be between about 20 and about 500 angstroms, and in some embodiments about 100 angstroms, of titanium nitride or another suitable adhesion layer such as tantalum nitride, tungsten nitride, tungsten, molybdenum, combinations of one or more adhesion layers, or the like. Other adhesion layer materials and/or thicknesses may be employed. To simplify the figures, adhesion layers have not been depicted in any of FIGS. 8A-16C. Persons of ordinary skill in the art will understand that such adhesion layers may be used.

Following formation of conductive layer 601, conductive layer 601 is patterned and etched. For example, conductive layer 601 may be patterned and etched using conventional lithography techniques, with a soft or hard mask, and wet or dry etch processing. In at least one embodiment, conductive layer 601 is patterned and etched to form substantially parallel, substantially co-planar global bit lines $GBL_1, GBL_2, \ldots, GBL_5$. Example widths for global bit lines $GBL_1, GBL_2, \ldots, GBL_5$ and/or spacings between global bit lines $GBL_1, GBL_2, \ldots, GBL_5$ range between about 190 angstroms and about 240 angstroms, although other conductor widths and/or spacings may be used.

After global bit lines $GBL_1, GBL_2, \ldots, GBL_5$ have been formed, a dielectric material layer 602 is formed over substrate 650 to fill the voids between global bit lines $GBL_1, GBL_2, \ldots, GBL_5$. For example, approximately 3000-7000 angstroms of silicon dioxide may be deposited on the substrate 650 and planarized using chemical mechanical polishing or an etchback process to form a planar surface 654. Planar surface 654 includes exposed top surfaces of global bit lines $GBL_1, GBL_2, \ldots, GBL_5$ separated by dielectric material 602. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, global bit lines $GBL_1, GBL_2, \ldots, GBL_5$ may be formed using a damascene process in which dielectric material layer 602 is formed, patterned and etched to create openings or voids for global bit lines $GBL_1, GBL_2, \ldots, GBL_5$. The openings or voids then may be filled with conductive layer 601 (and/or a conductive seed, conductive fill and/or barrier layer if needed). Conductive layer 601 then may be planarized to form planar surface 654.

Figure 9A:
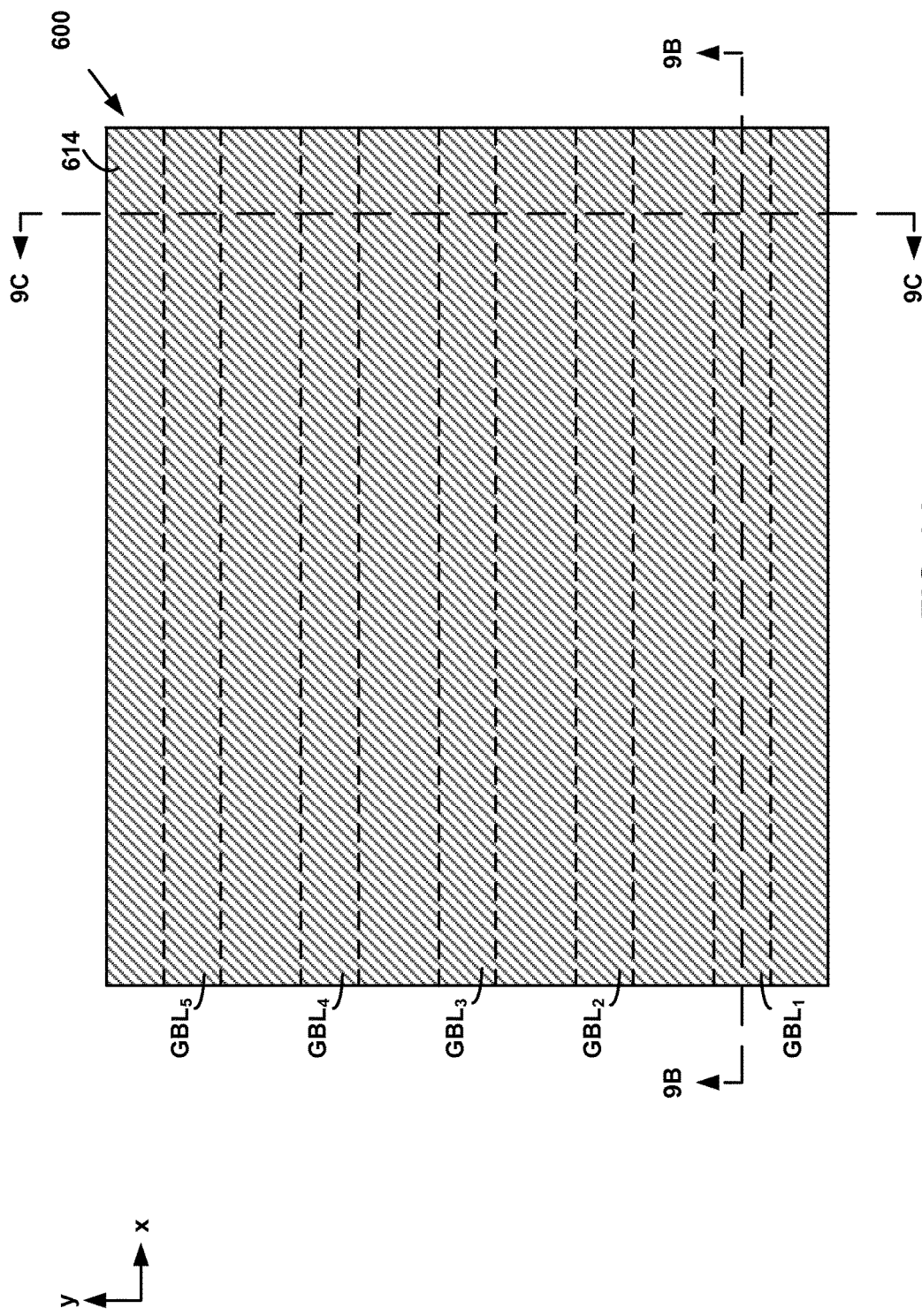
Figure 9B:
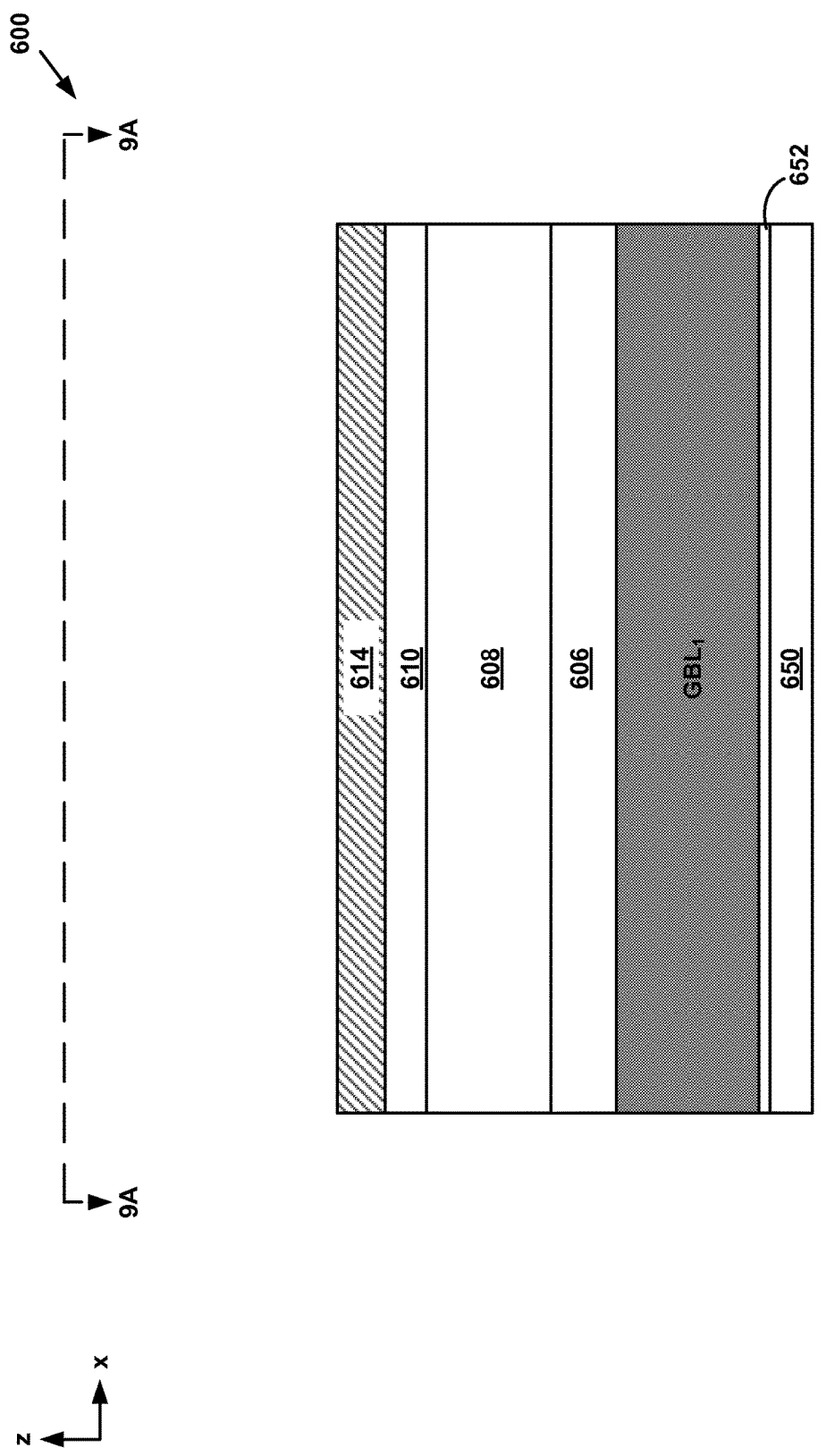
Figure 9C:
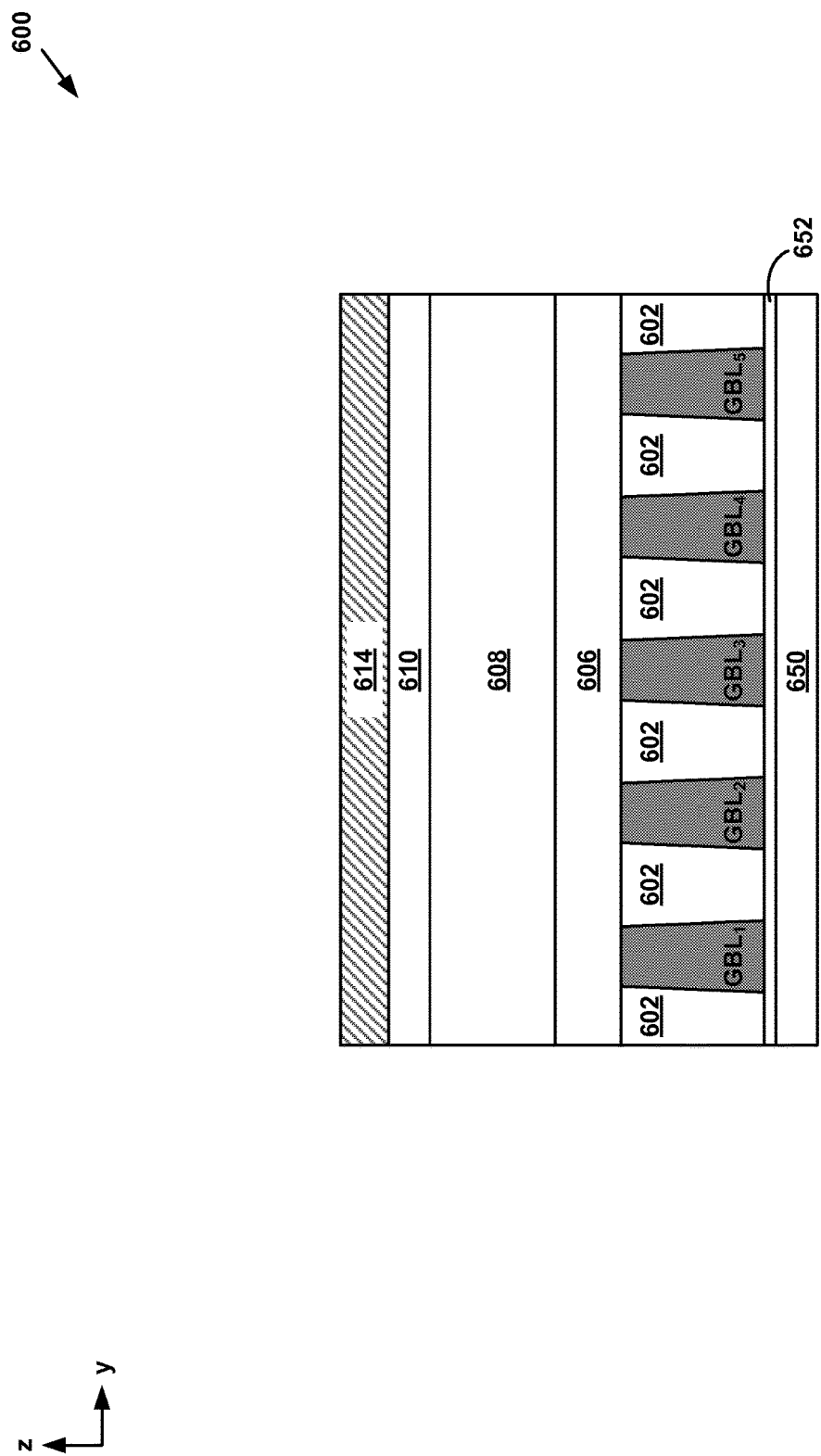
Figure 10A:
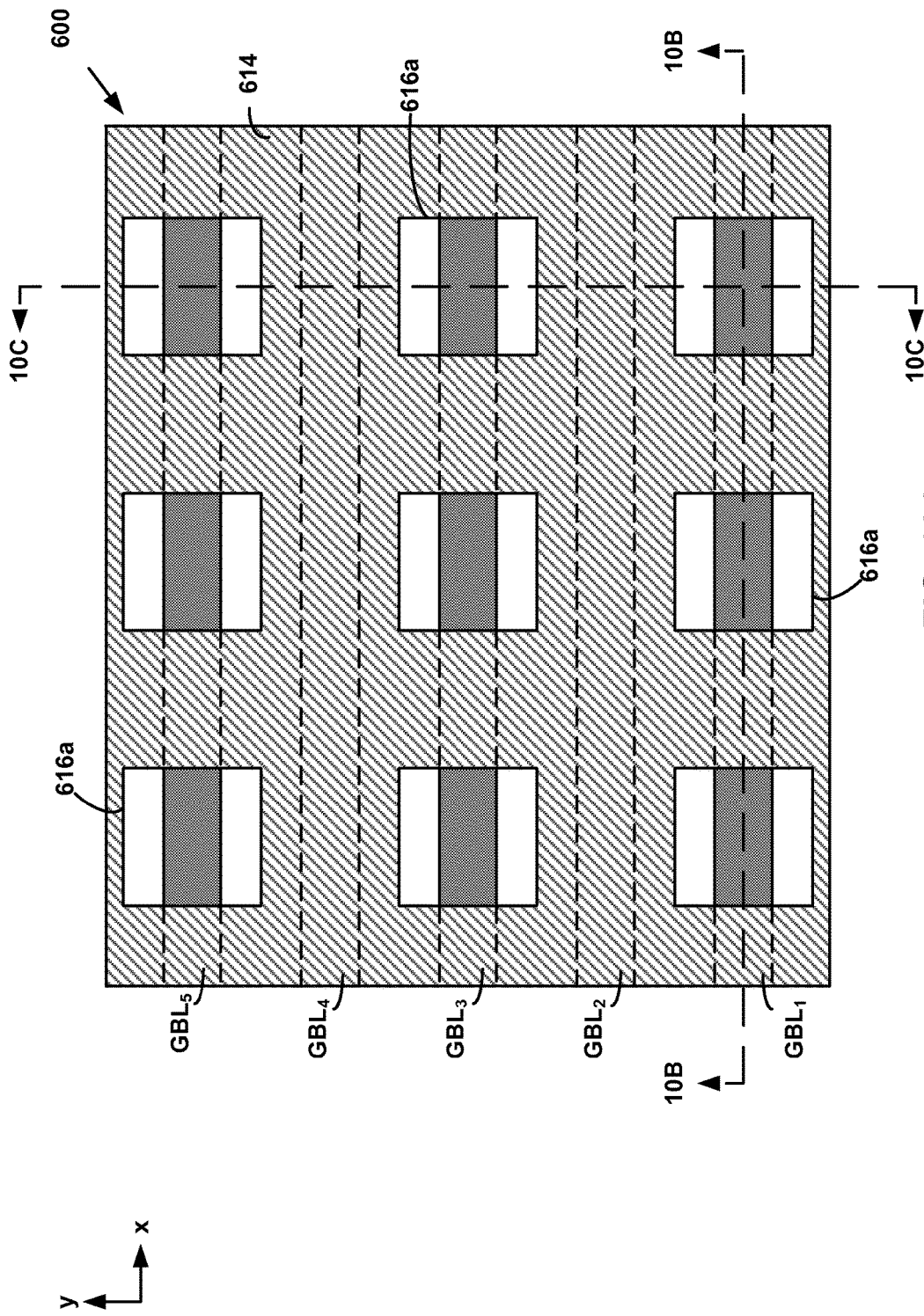
Figure 10B:
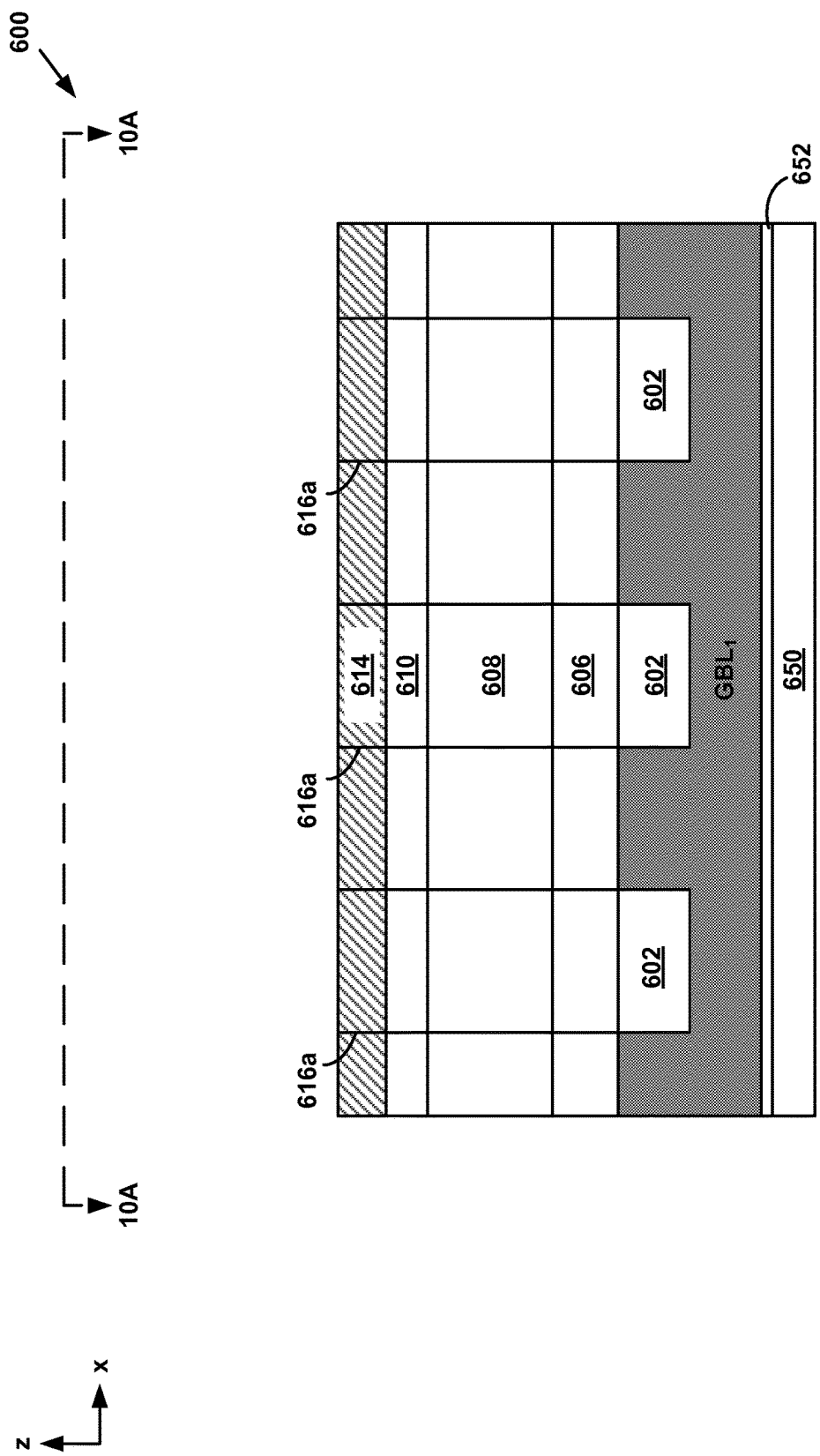
Figure 10C:
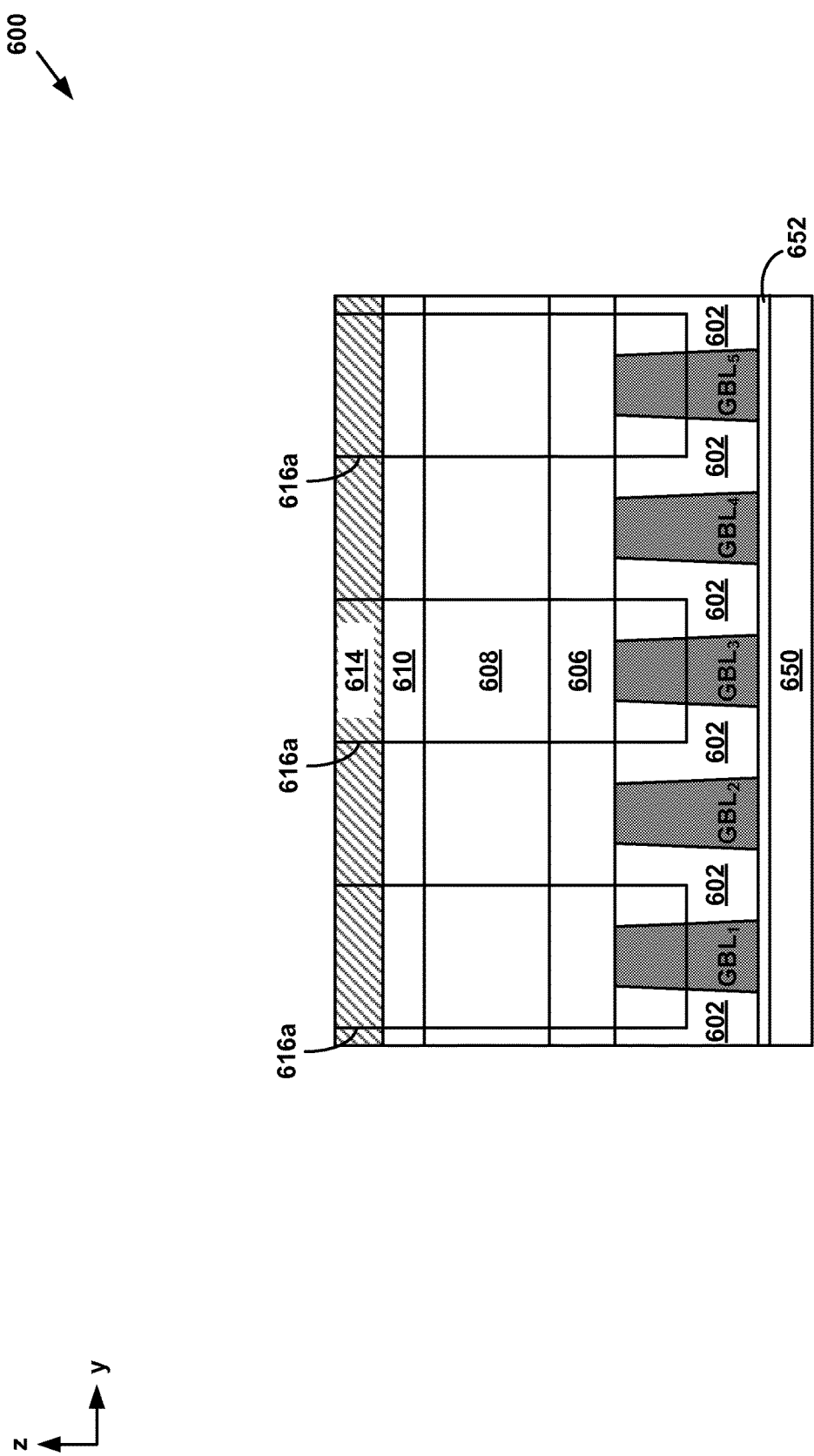
Figure 11A:
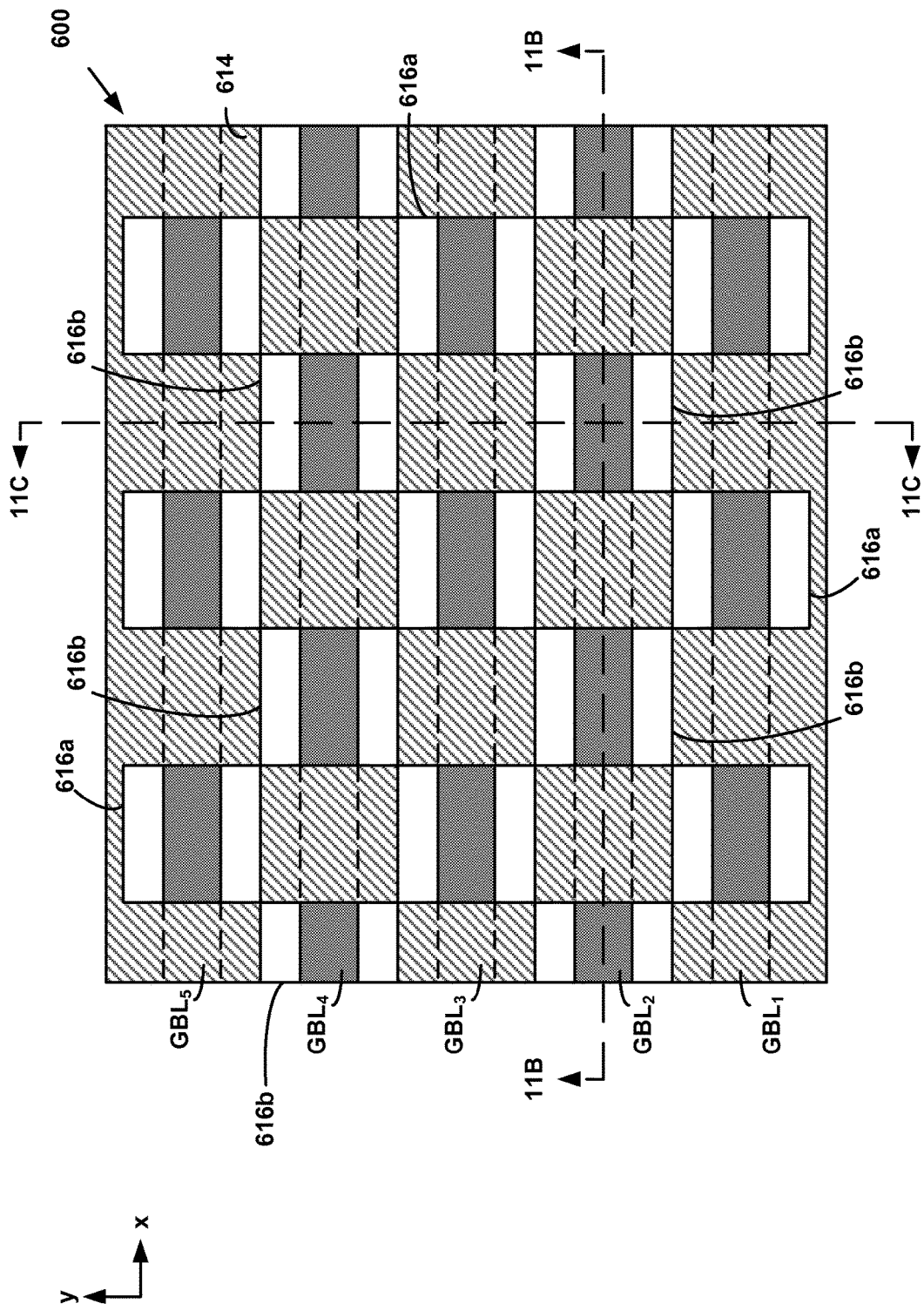
Figure 11C:
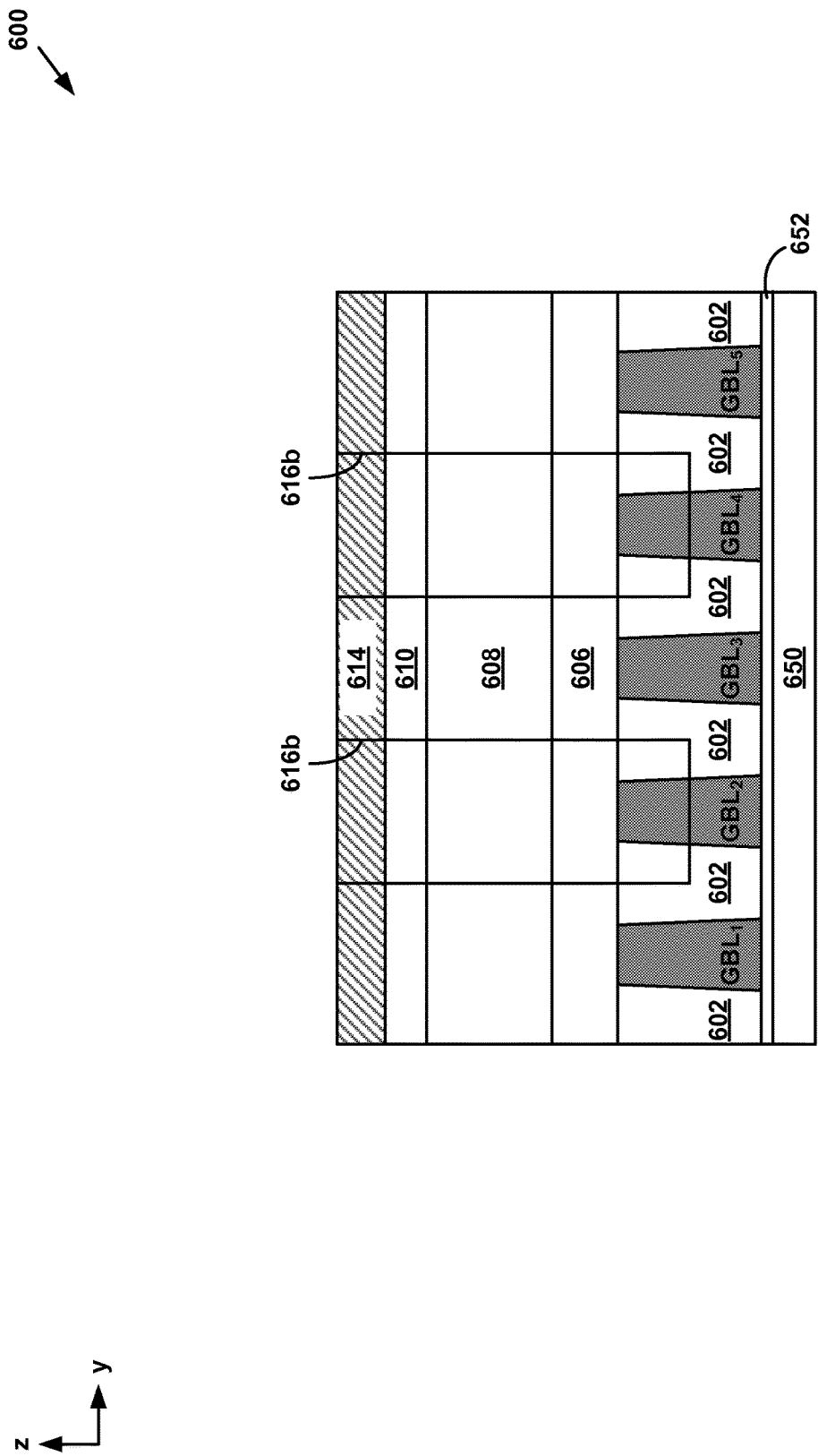
Figure 12A:
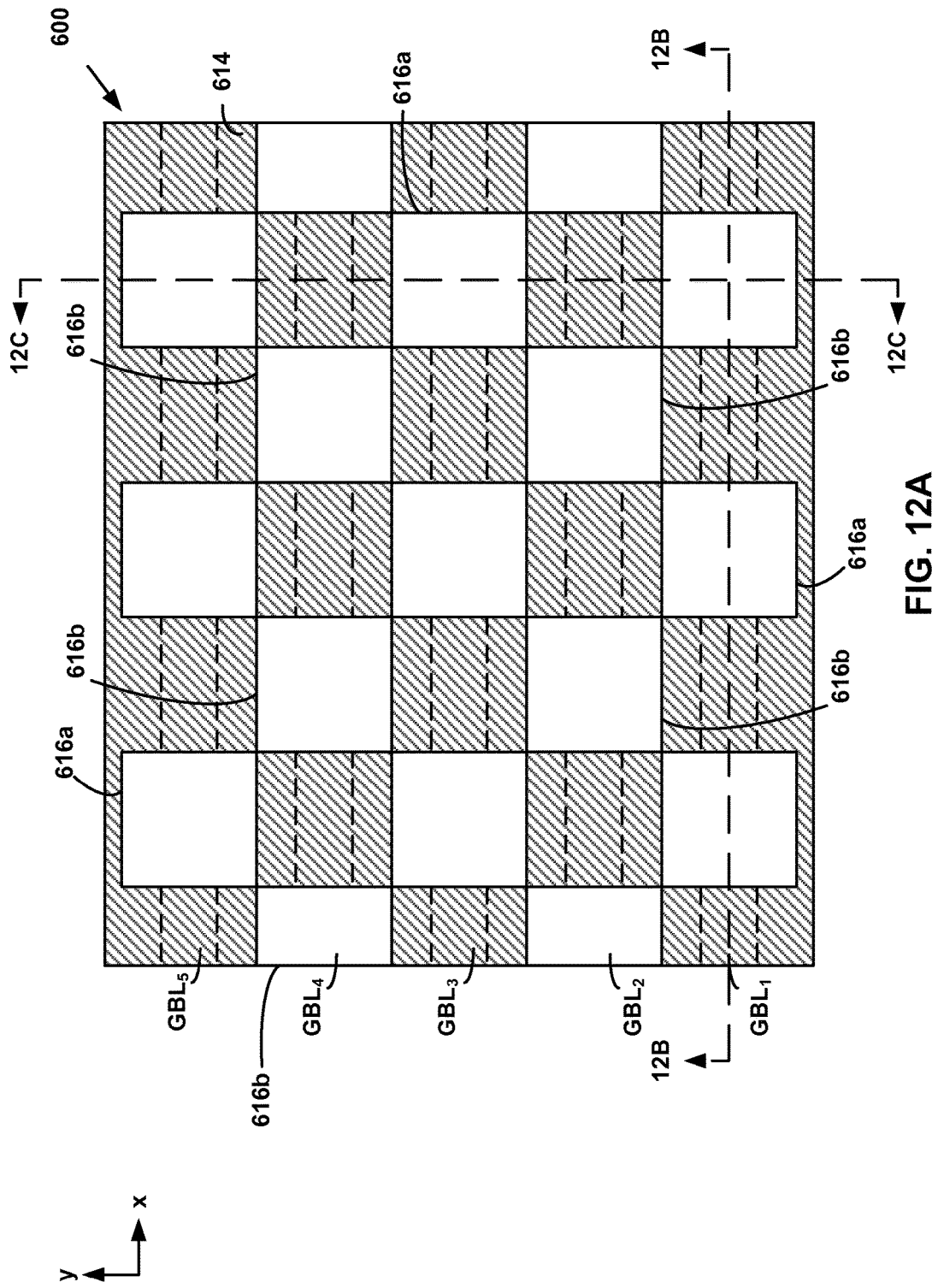
Figure 12B:
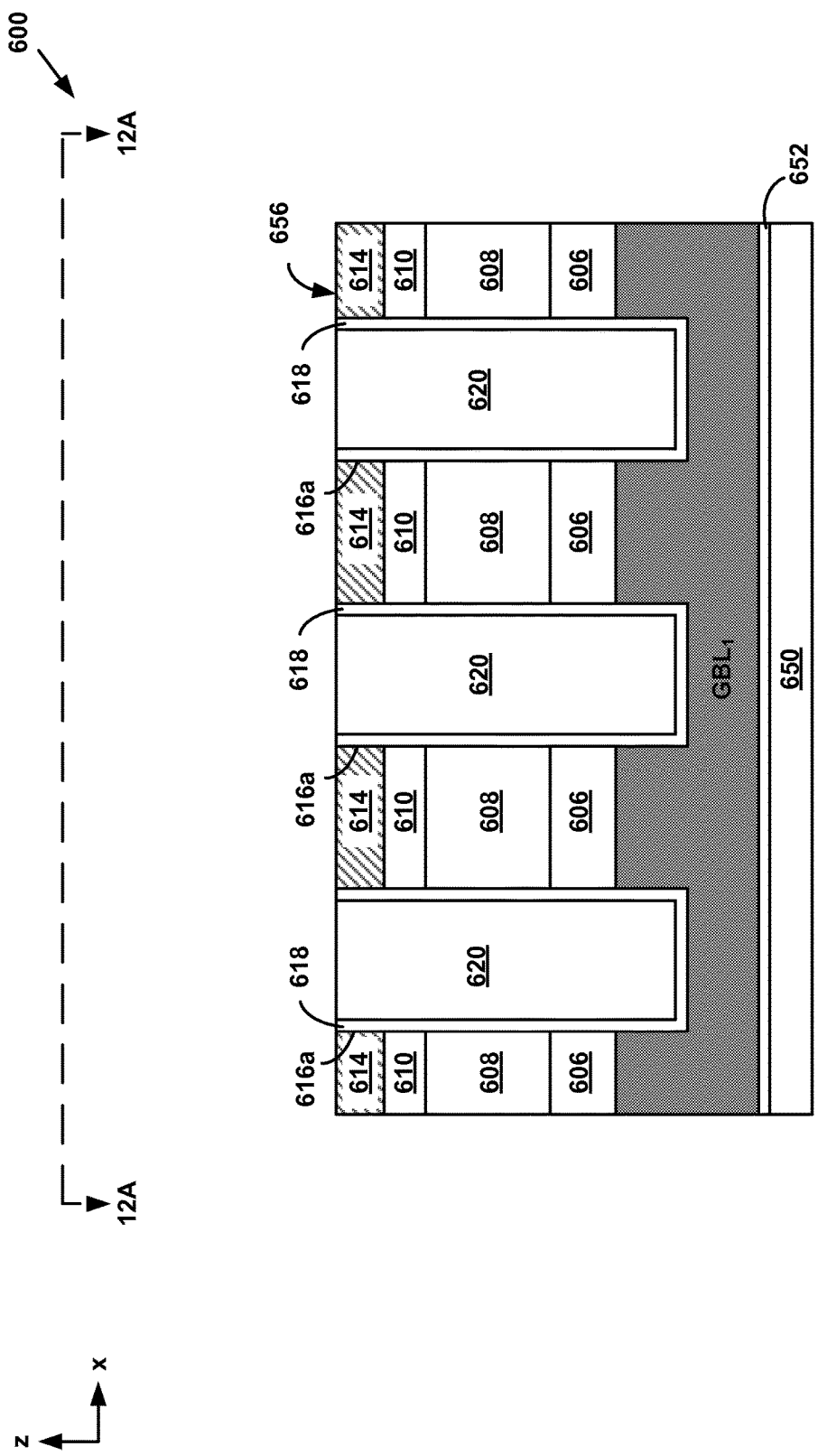
Figure 12C:
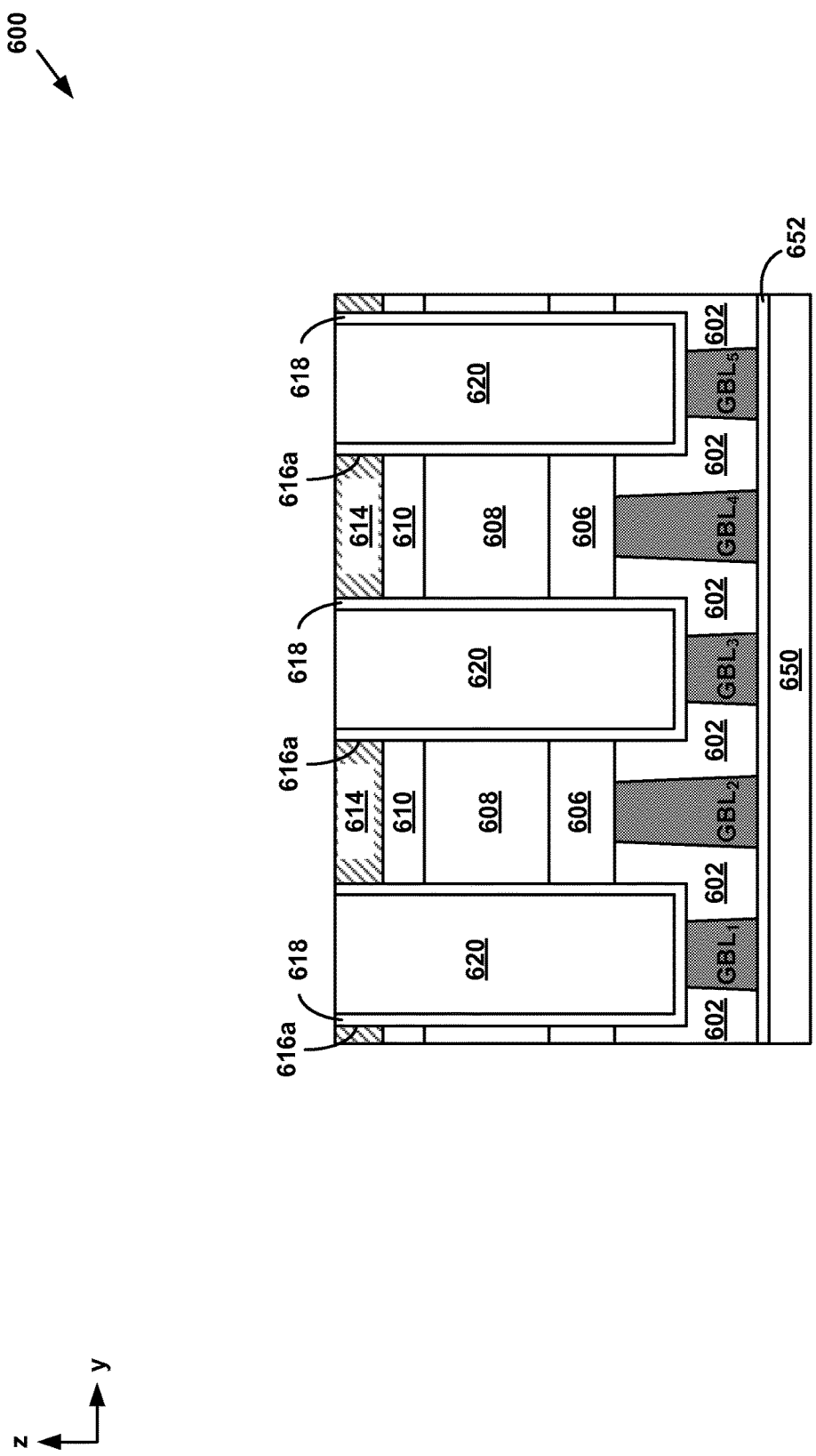

With reference to FIGS. 9A-9C, following planarization, the semiconductor material used to form vertically-oriented bit line select transistors $Q_{12}$-$Q_{53}$ is formed over planarized top surface 650 of substrate 650. In some embodiments, each vertically-oriented bit line select transistor is formed from a polycrystalline semiconductor material such as polysilicon, a polycrystalline silicon-germanium alloy, polygermanium or any other suitable material. Alternatively, vertically-oriented bit line select transistors $Q_{12}$-$Q_{53}$ may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, each vertically-oriented bit line select transistor may include a first region (e.g., n+ polysilicon), a second region (e.g., p polysilicon) and a third region (e.g., n+ polysilicon) to form drain/source, body, and source/drain regions, respectively, of a vertical FET. For example, a heavily doped n+ silicon layer 606 may be deposited on planarized top surface 650. In some embodiments, n+ silicon layer 606 is in an amorphous state as deposited. In other embodiments, n+ silicon layer 606 is in a polycrystalline state as deposited. CVD or another suitable process may be employed to deposit n+ silicon layer 606.

In an embodiment, n+ silicon layer 606 may be formed, for example, from about 100 to about 500 angstroms, of phosphorus or arsenic doped silicon having a doping concentration of about $10^{21}$ cm$^{-3}$. Other layer thicknesses, doping types and/or doping concentrations may be used. N+ silicon layer 606 may be doped in situ, for example, by flowing a donor gas during deposition. Other doping methods may be used (e.g., implantation).

After deposition of n+ silicon layer 606, a doped p-type silicon layer 608 may be formed over n+ silicon layer 606. P-type silicon may be either deposited and doped by ion implantation or may be doped in situ during deposition to form a p-type silicon layer 608. For example, an intrinsic silicon layer may be deposited on n+ silicon layer 606, and a blanket p-type implant may be employed to implant boron a predetermined depth within the intrinsic silicon layer. Example implantable molecular ions include $BF_2$, $BF_3$, B and the like. In some embodiments, an implant dose of about $1$-$10 \times 10^{13}$ ions/cm$^2$ may be employed. Other implant species and/or doses may be used. Further, in some embodiments, a diffusion process may be employed. In an embodiment, the resultant p-type silicon layer 608 has a thickness of from about 800 to about 4000 angstroms, although other p-type silicon layer sizes may be used.

Following formation of p-type silicon layer 608, a heavily doped n+ silicon layer 610 is deposited on p-type silicon layer 608. In some embodiments, n+ silicon layer 610 is in an amorphous state as deposited. In other embodiments, n+ silicon layer 610 is in a polycrystalline state as deposited. CVD or another suitable process may be employed to deposit n+ silicon layer 610.

In an embodiment, n+ silicon layer 610 may be formed, for example, from about 100 to about 500 angstroms of phosphorus or arsenic doped silicon having a doping concentration of about $10^{21}$ cm$^{-3}$. Other layer thicknesses, doping types and/or doping concentrations may be used. N+ silicon layer 610 may be doped in situ, for example, by flowing a donor gas during deposition. Other doping methods may be used (e.g., implantation). Persons of ordinary skill in the art will understand that silicon layers 606, 608 and 610 alternatively may be doped p+/n/p+, respectively, or may be doped with a single type of dopant to produce junctionless-FETs.

Following formation of n+ silicon layer 610, a hard mask layer 614 is deposited on n+ silicon layer 610, resulting in the structure shown in FIGS. 9A-9C. In an embodiment, hard mask layer 614 may be formed. Hard mask 614 may include one or more layers selected from a Bottom Anti-Refection Coating (BARC) layer, a Dielectric Anti-Reflection Coating (DARC) layer (such as a silicon oxynitride layer), an organic hard mask layer, a conductive hard mask layer or layers, or an oxide hard mask layer. The organic hard mask layer can be an amorphous carbon advanced patterning film (APF). Hard mask 614 may have a thickness between about 200 nm and about 350 nm, although other thickness may be used.

In a first masking step, silicon layers 606, 608 and 610, and hard mask layer 614 are patterned and etched to form first etched cavities 616a. For example, silicon layers 606, 608 and 610c, and hard mask layer 614 may be patterned and etched using conventional lithography techniques, with wet or dry etch processing. In an embodiment, silicon layers 606, 608 and 610c, and hard mask layer 614 are patterned and etched to form first etched cavities 616a disposed above global bit lines $GBL_1$, $GBL_3$ and $GBL_5$, resulting in the structure shown in FIGS. 10A-10C. Each of first etched cavities 616a may have a square, rectangular or other shape each having a width of between about 38 nm and about 48 nm, and a length of between about 38 nm and about 48 nm, although other widths and lengths may be used.

Silicon layers 606, 608 and 610, and hard mask layer 614 may be patterned and etched in a single pattern/etch procedure or using separate pattern/etch steps. Any suitable masking and etching process may be used to form first etched cavities 616a. For example, silicon layers 606, 608 and 610c, and hard mask layer 614 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, first etched cavities 616a may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

In a second masking step, silicon layers 606, 608 and 610, and hard mask layer 614 are patterned and etched to form second etched cavities 616b. For example, silicon layers 606, 608 and 610c, and hard mask layer 614 may be patterned and etched using conventional lithography techniques, with wet or dry etch processing. In an embodiment, silicon layers 606, 608 and 610c, and hard mask layer 614 are patterned and etched to form second etched cavities 616b disposed above global bit lines $GBL_2$ and $GBL_4$, resulting in the structure shown in FIGS. 11A-11C. Each of second etched cavities 616b may have a square, rectangular or other shape each having a width of between about 38 nm and about 48 nm, and a length of between about 38 nm and about 48 nm, although other widths and lengths may be used.

Silicon layers 606, 608 and 610, and hard mask layer 614 may be patterned and etched in a single pattern/etch procedure or using separate pattern/etch steps. Any suitable masking and etching process may be used to form second etched cavities 616b. For example, silicon layers 606, 608 and 610c, and hard mask layer 614 may be patterned with about 1 to about 1.5 micron, more preferably about 1.2 to about 1.4 micron, of PR using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, second etched cavities 616b may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute HF acid (e.g., about 0.4-0.6 wt %) for 60 seconds. Megasonics may or may not be used. Other clean chemistries, times and/or techniques may be employed.

A dielectric liner 618 is deposited conformally on sidewalls and bottom of first etched cavities 616a and second etched cavities 616b. In an embodiment, dielectric liner 618 may comprise about 40 angstroms to about 60 angstroms of silicon nitride. Persons of ordinary skill in the art will understand that other dielectric materials may be used to form dielectric liner 618, and other thicknesses may be used.

A dielectric material layer 620 is formed over substrate 650 to fill the voids in first etched cavities 616a and second etched cavities 616b. For example, approximately 3000-7000 angstroms of silicon dioxide may be deposited on the substrate 650 and planarized using chemical mechanical polishing or an etchback process to form a planar surface 656, resulting in the structure shown in FIGS. 12A-12C. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Figure 13A:
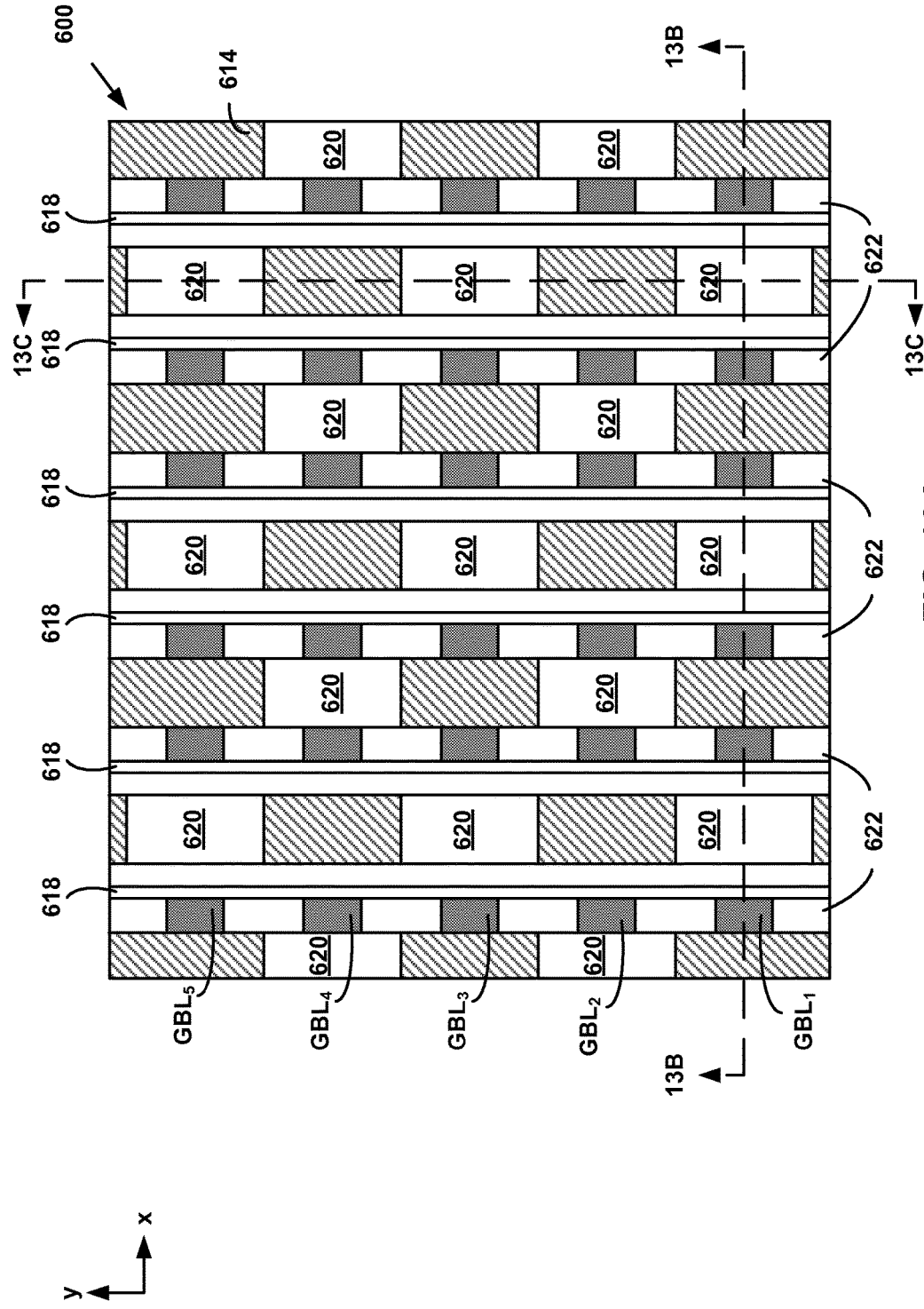
Figure 13B:
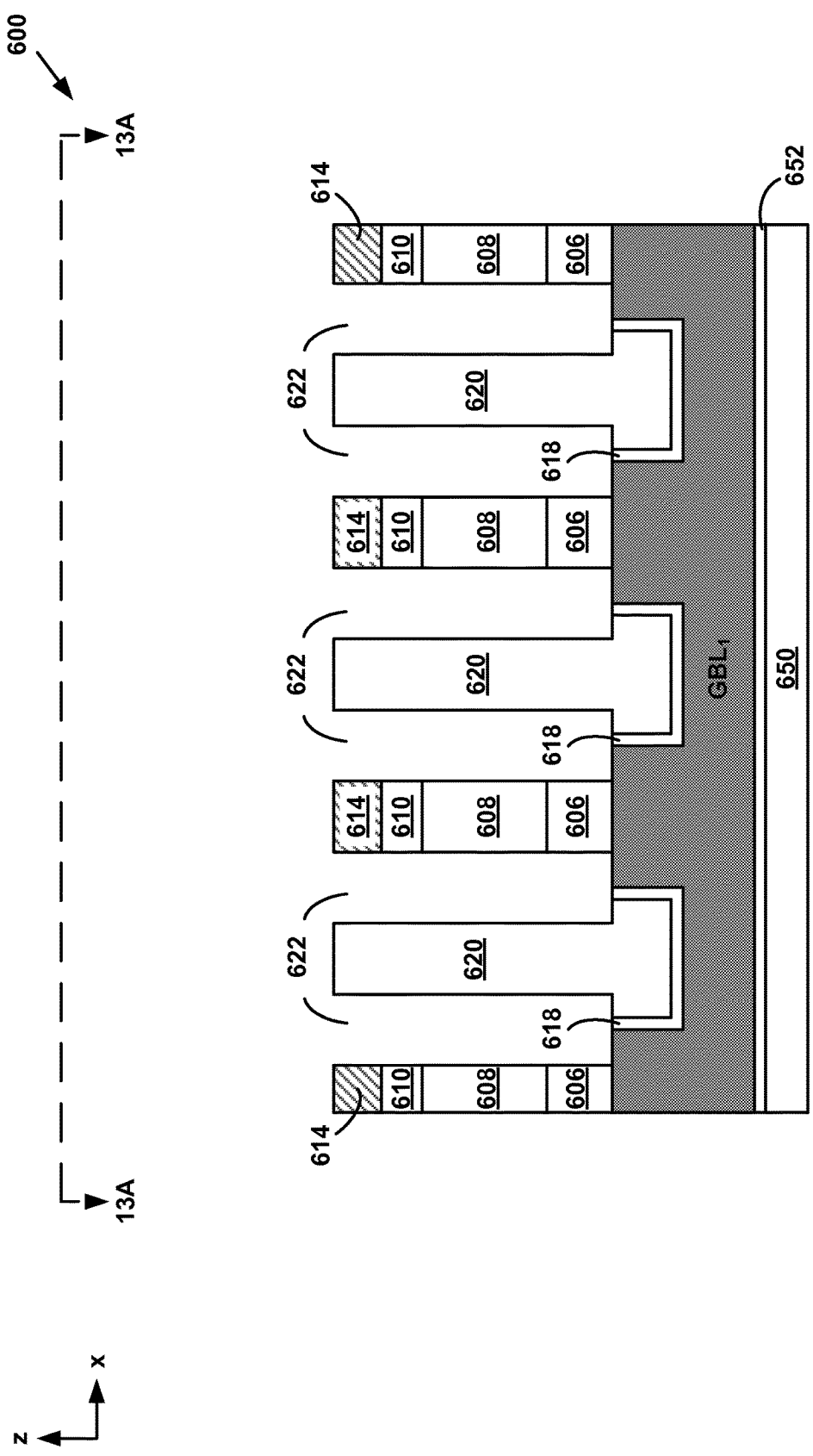
Figure 13C:
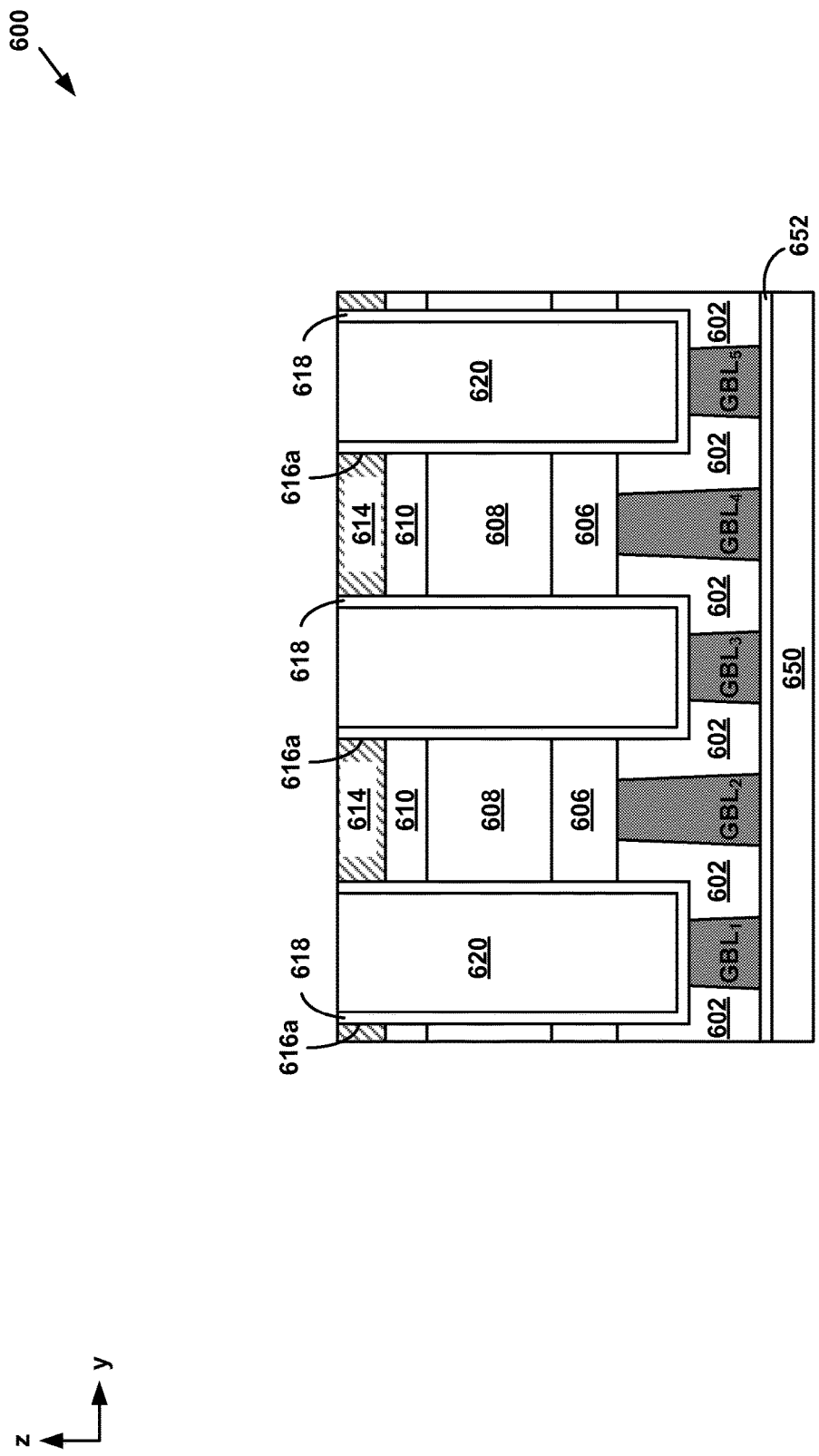
Figure 14A:
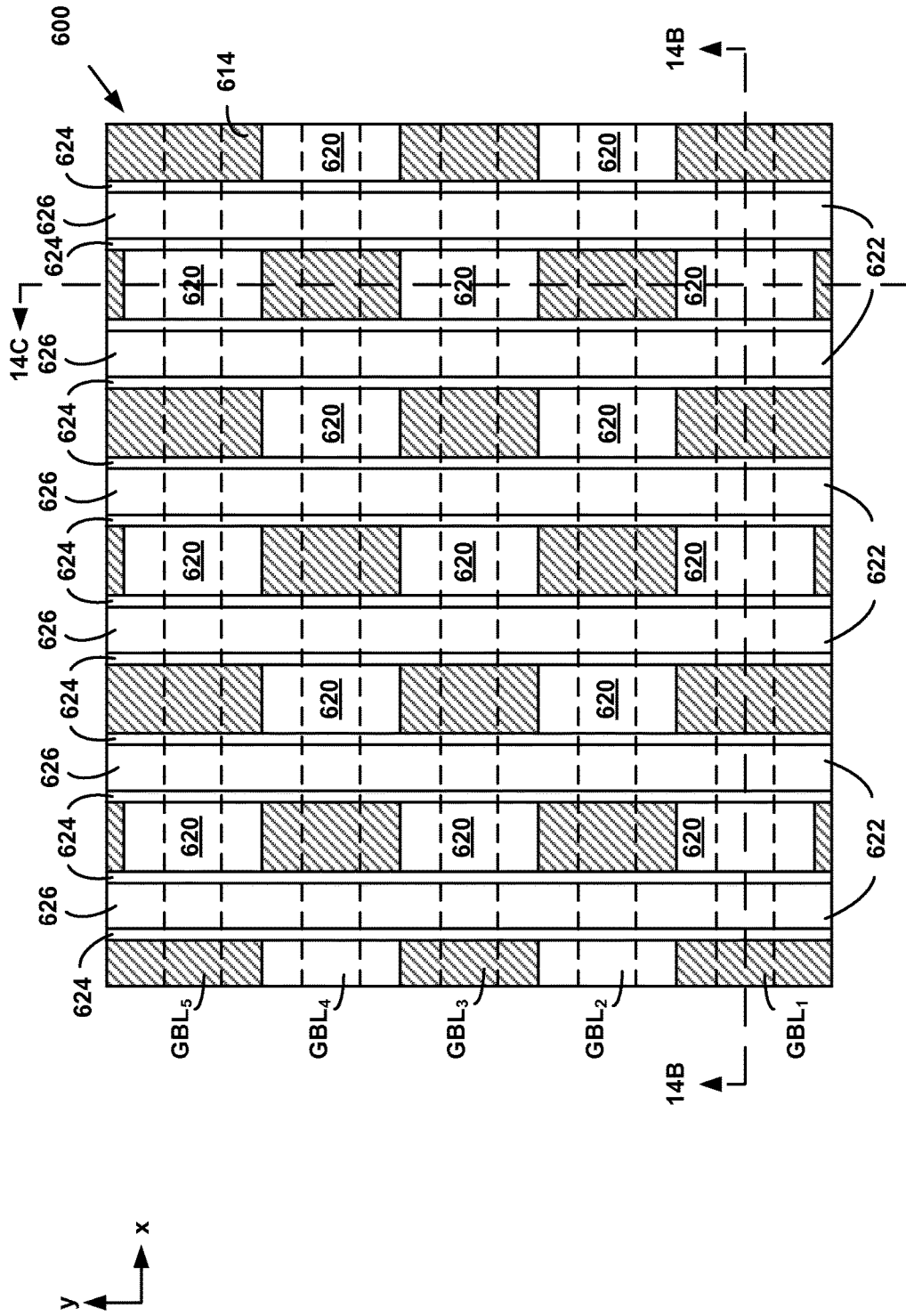
Figure 14B:
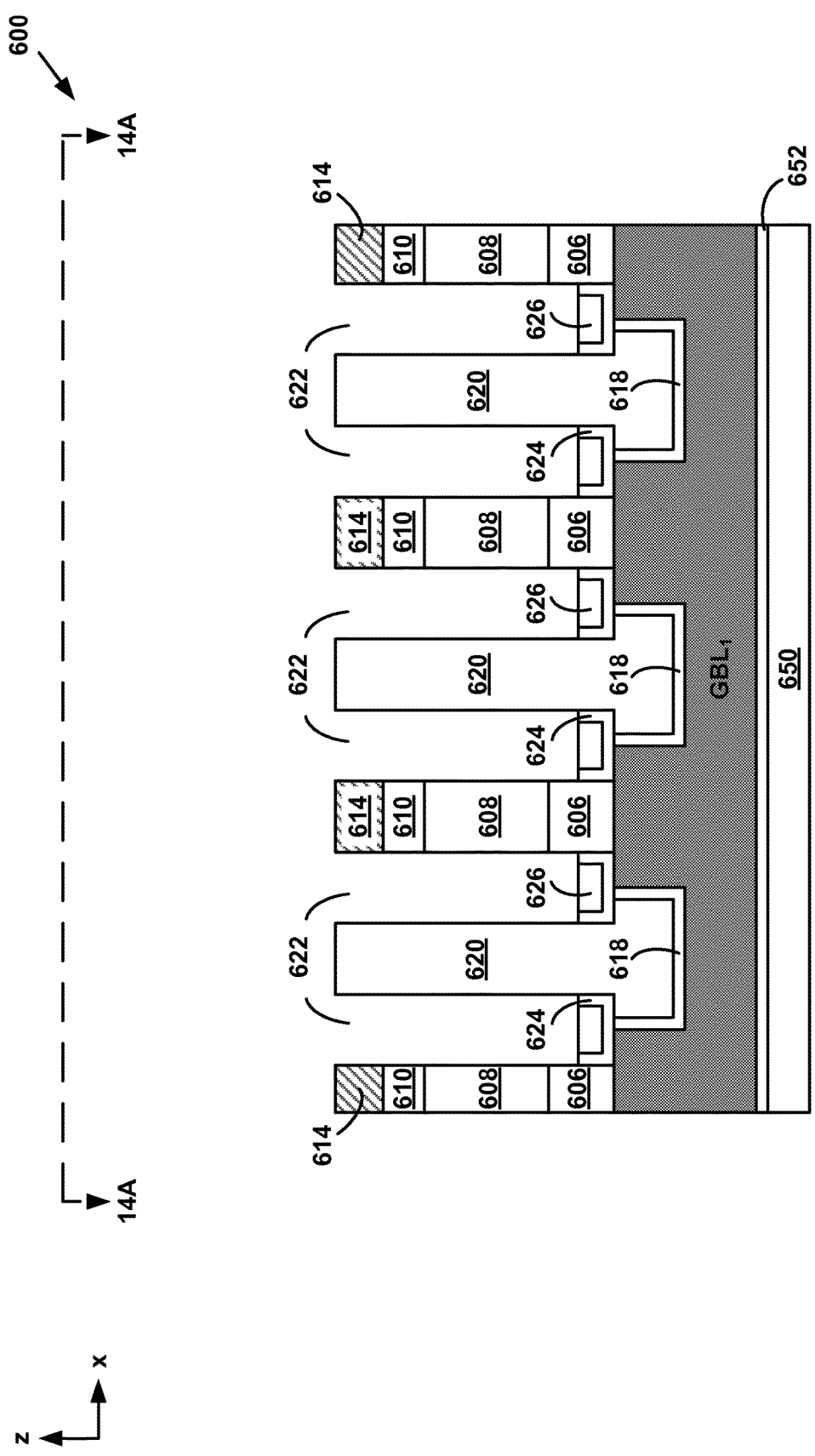
Figure 14C:
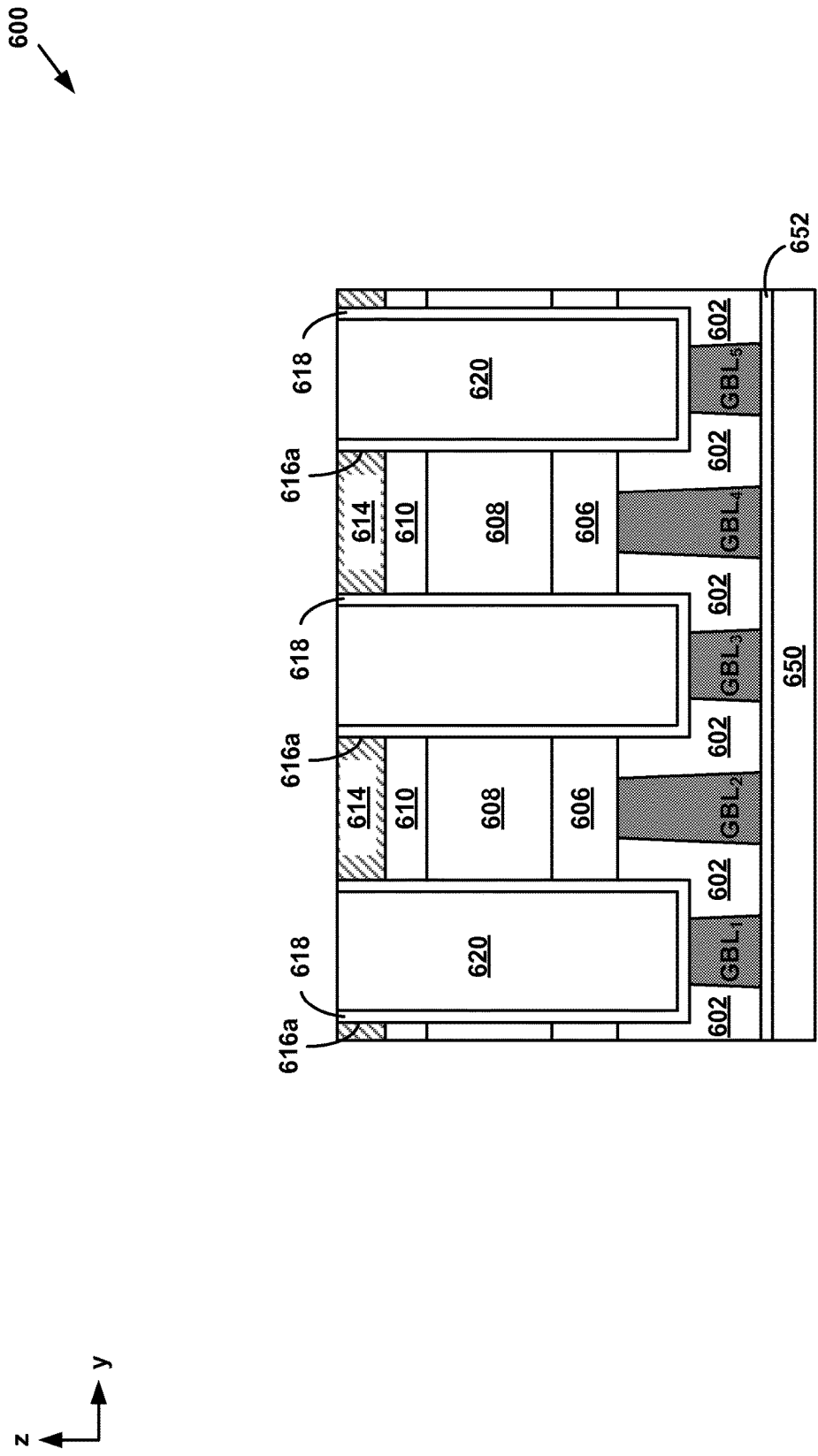
Figure 15A:
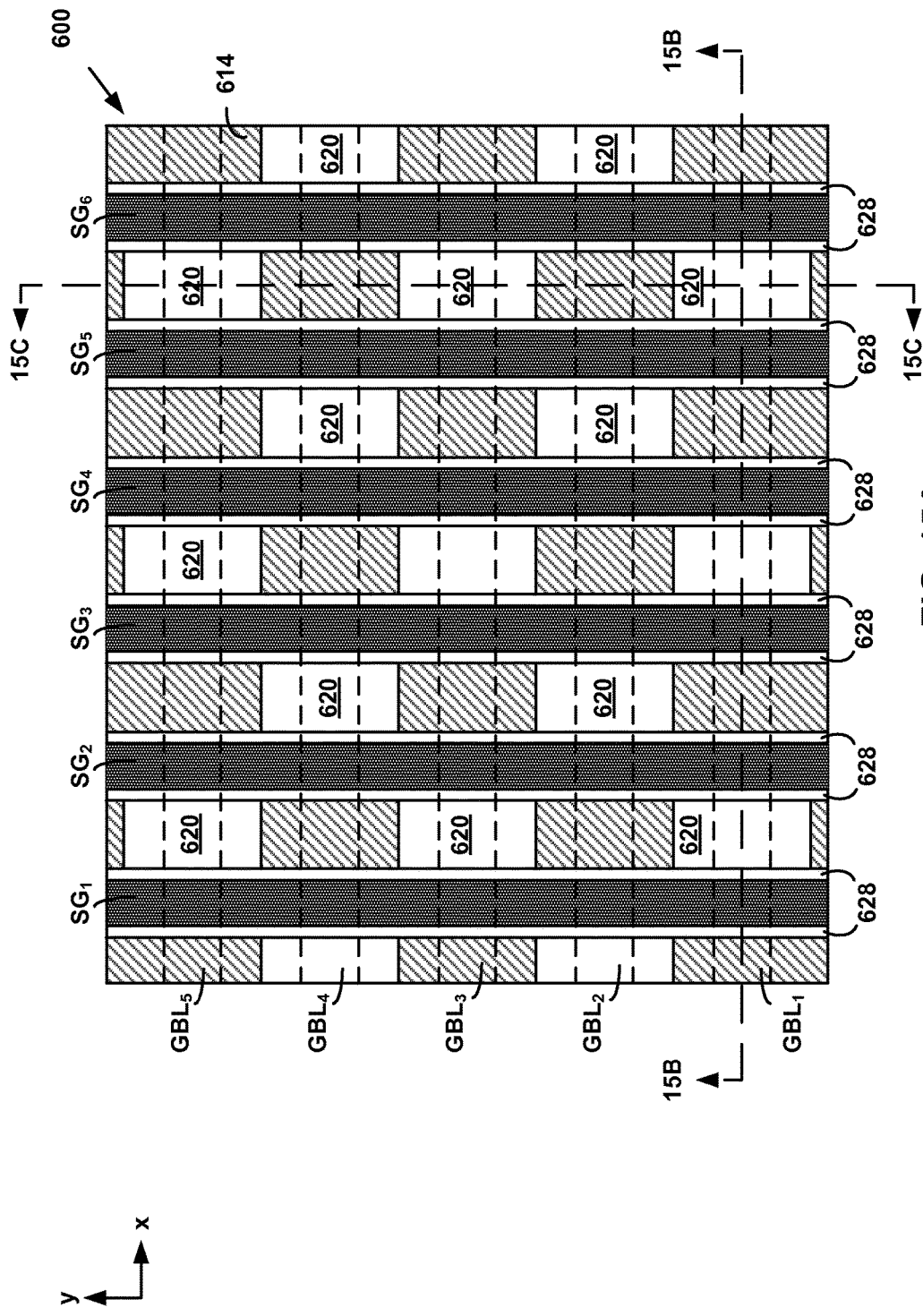
Figure 15B:
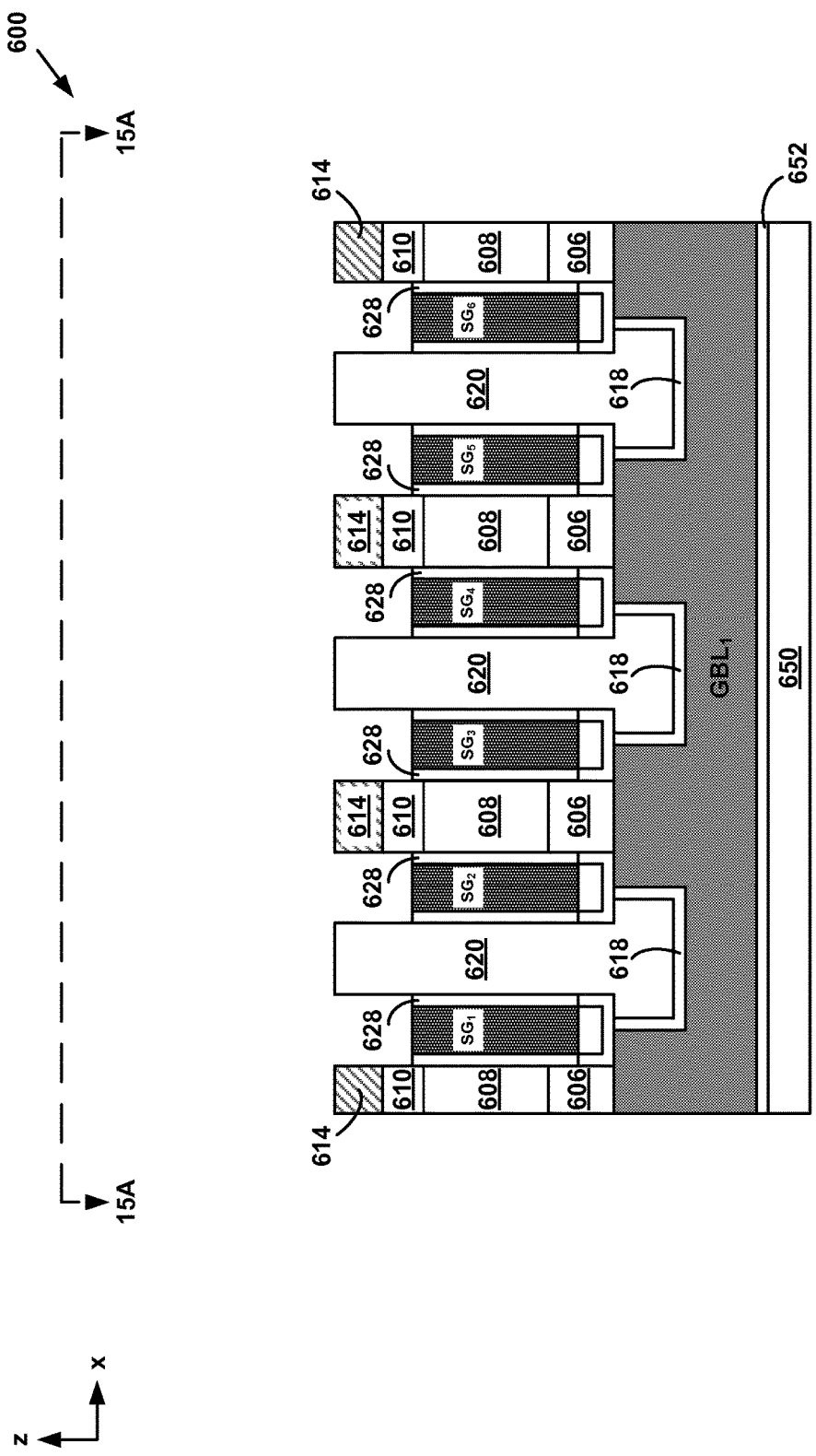
Figure 15C:
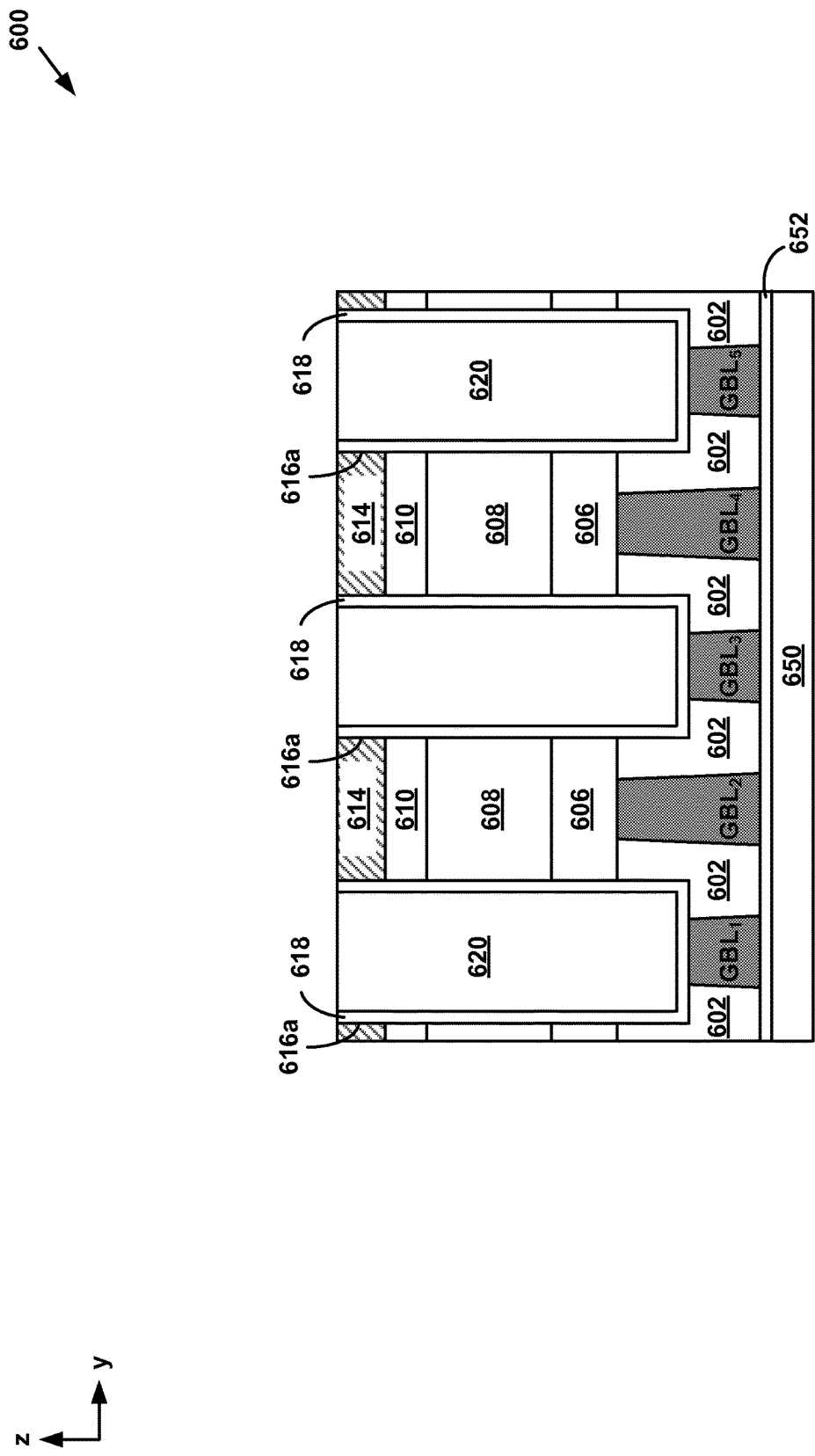
Figure 16A:
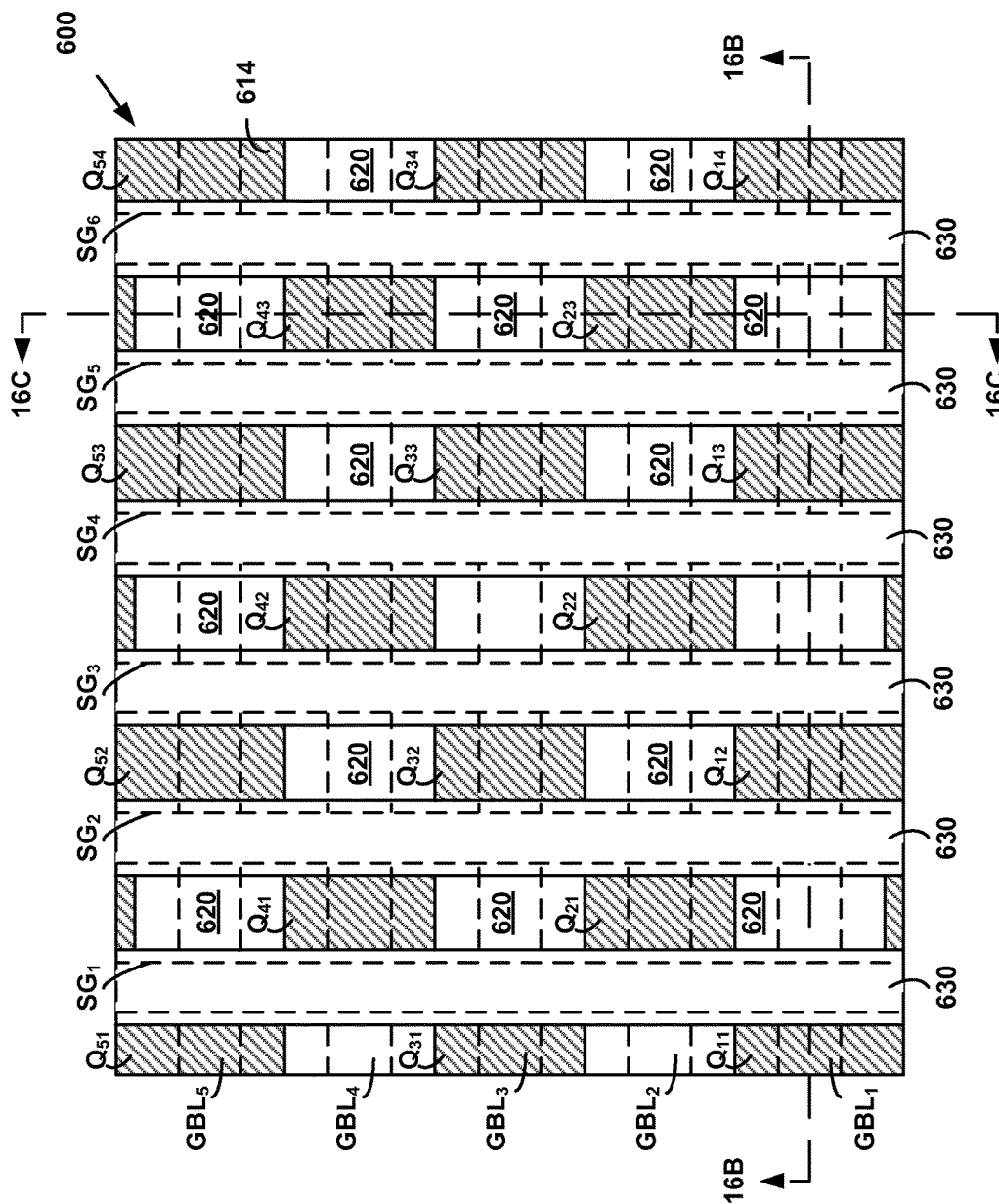
Figure 16B:
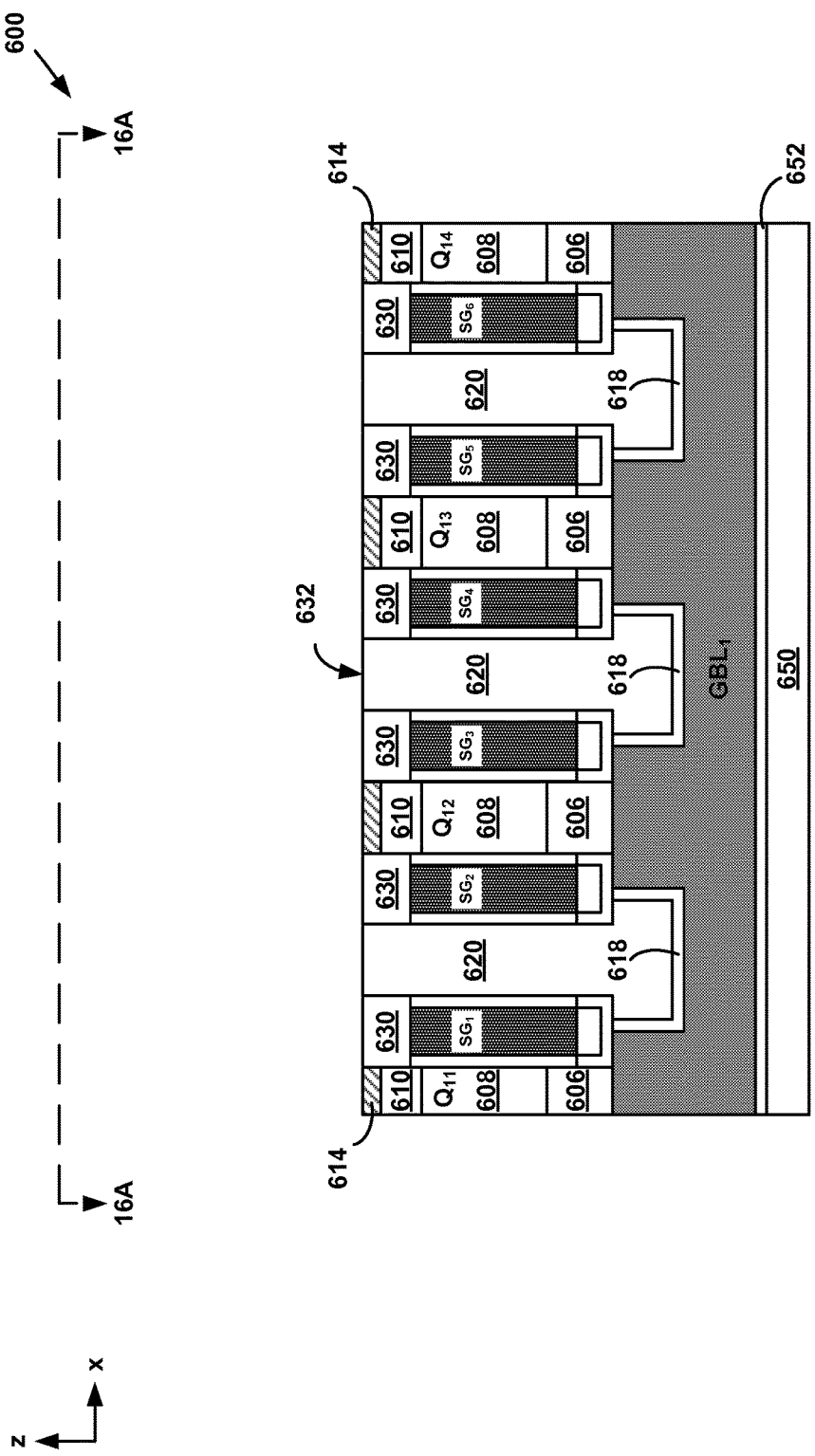
Figure 16C:
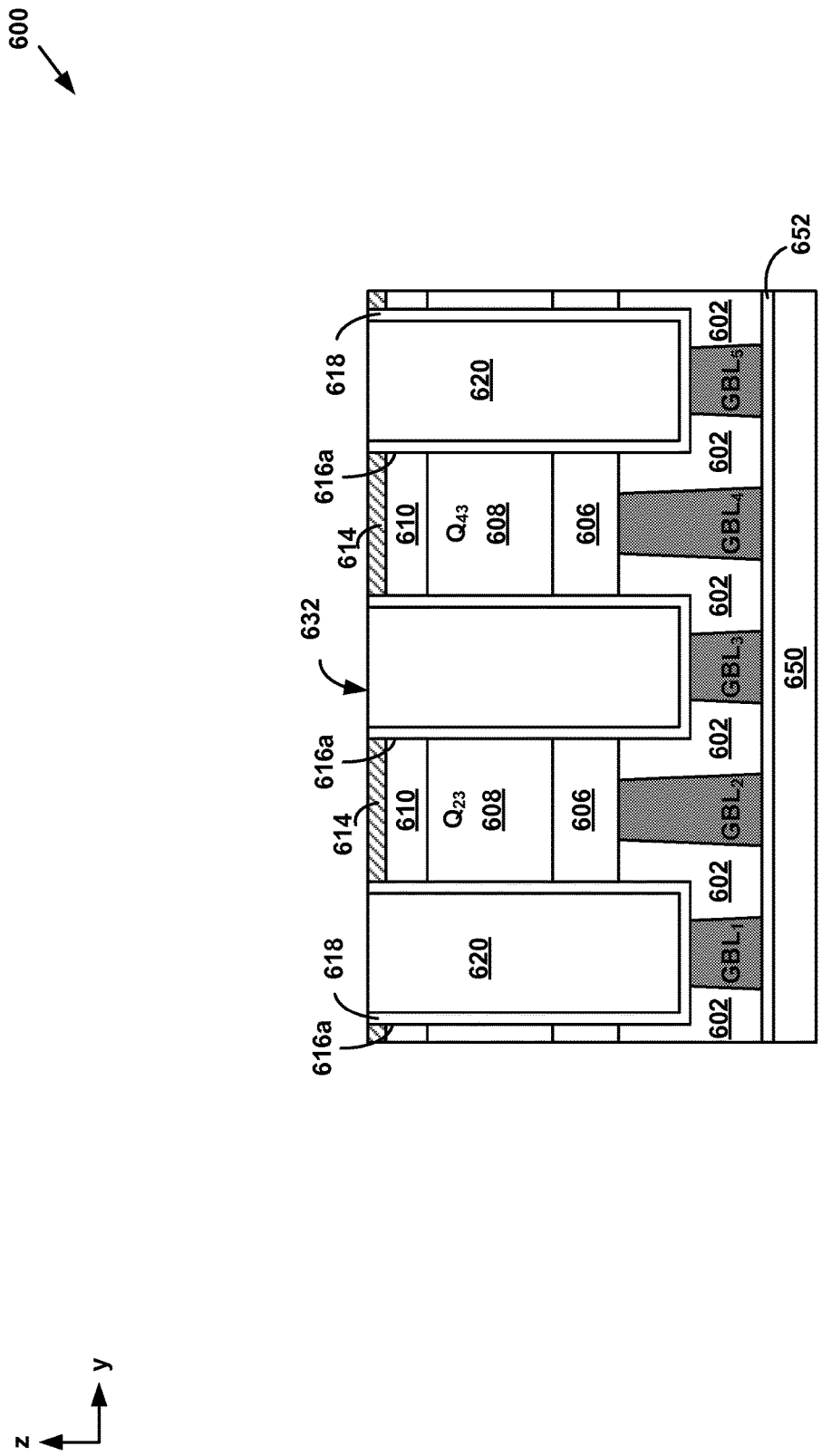

In a third masking step, silicon layers 606, 608 and 610, hard mask layer 614, dielectric liner 618 and dielectric material layer 620 are etched to form etched channels 622, resulting in the structure shown in FIGS. 13A-13C. For example, silicon layers 606, 608 and 610, hard mask layer 614, dielectric liner 618 and dielectric material layer 620 may be patterned and etched using conventional lithography techniques, with wet or dry etch processing. In an embodiment, silicon layers 606, 608 and 610, hard mask layer 614, dielectric liner 618 and dielectric material layer 620 are patterned and etched to form substantially parallel, substantially co-planar channels 622, resulting in the structure shown in FIGS. 13A-13C. Example widths for channels 622 between about 190 angstroms and about 240 angstroms, although other widths may be used.

Silicon layers 606, 608 and 610, hard mask layer 614, dielectric liner 618 and dielectric material layer 620 may be patterned and etched in a single pattern/etch procedure or using separate pattern/etch steps. Any suitable masking and etching process may be used to form etched channels 622. For example, silicon layers 606, 608 and 610, hard mask layer 614, dielectric liner 618 and dielectric material layer 620 may be patterned with about 1 to about 1.5 micron, more preferably about 1.2 to about 1.4 micron, of PR using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, channels 622 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute HF acid (e.g., about 0.4-0.6 wt %) for 60 seconds. Megasonics may or may not be used. Other clean chemistries, times and/or techniques may be employed.

A dielectric liner 624 is deposited conformally on sidewalls and bottom of channels 622. In an embodiment, dielectric liner 624 may comprise about 40 angstroms to about 60 angstroms of silicon nitride. Persons of ordinary skill in the art will understand that other dielectric materials may be used to form dielectric liner 624, and other thicknesses may be used.

A dielectric material layer 626 is formed over substrate 650 to fill the voids in channels 622. For example, approximately 3000-7000 angstroms of silicon dioxide may be deposited on the substrate 650 and planarized using chemical mechanical polishing process. An etchback process may be used to recess dielectric material layer 626 inside channels 622, and remaining portions of dielectric liner 624 may be removed from channels 622, resulting in the structure shown in FIGS. 14A-14C. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

A gate dielectric layer 628 is deposited conformally over substrate 650, and forms on sidewalls of silicon layers 606, 608 and 610. For example, between about 30 angstroms to about 70 angstroms of silicon dioxide may be deposited. Other dielectric materials such as silicon nitride, silicon oxynitride, low K dielectrics, etc., and/or other dielectric material layer thicknesses may be used.

Gate electrode material is deposited over recesses and gate dielectric layer 628 to fill the voids between recesses 622. For example, approximately 10 nm to about 20 nm of titanium nitride or other similar metal, a highly-doped semiconductor, such as n+ polysilicon, p+ polysilicon, or other similar conductive material may be deposited. The as-deposited gate electrode material is subsequently etched back to form row select lines $SG_1, SG_2, \ldots, SG_6$, resulting in the structure shown in FIGS. 15A-15C.

A dielectric material layer 630 is deposited over the recessed row select lines $SG_1, SG_2, \ldots, SG_6$. For example, approximately 100 to 800 angstroms of silicon dioxide may be deposited and planarized using chemical mechanical polishing or an etch-back process, resulting in the structure illustrated in FIGS. 16A-16C.

Thus, as described above, one embodiment includes a monolithic three-dimensional memory array that includes a plurality of global bit lines disposed above a substrate, each global bit line having a long axis, a plurality of vertically-oriented bit lines disposed above the global bit lines, a plurality of word lines disposed above the global bit lines, a plurality of memory cells coupled between the vertically-oriented bit lines and the word lines, and a plurality of vertically-oriented bit line select transistors coupled between the vertically-oriented bit lines and the global bit lines, each vertically-oriented bit line select transistor comprising a width and a thickness. Vertically-oriented bit line select transistors disposed above adjacent global bit lines are offset from one another in a direction along the long axis of the global bit lines. The width of each vertically-oriented bit line select transistor is greater than the thickness of the vertically-oriented bit line select transistors.

One embodiment of the disclosed technology includes a method of providing a monolithic three-dimensional memory array. The method includes providing a plurality of global bit lines above a substrate, each global bit line having a long axis, providing a plurality of vertically-oriented bit lines above the global bit lines, providing a plurality of word lines above the global bit lines, coupling a plurality of memory cells between the vertically-oriented bit lines and the word lines, coupling a plurality of vertically-oriented bit line select transistors between the vertically-oriented bit lines and the global bit lines, and offsetting vertical bit lines disposed above adjacent global bit lines from one another in a direction along the long axis of the global bit lines. Each vertically-oriented bit line select transistor has a width and a thickness, and the width of each vertically-oriented bit line select transistor is greater than the thickness of the vertically-oriented bit line select transistors.

One embodiment of the disclosed technology includes a method of forming a plurality of vertically-oriented bit line select transistors for a monolithic three-dimensional memory array that includes a plurality of global bit lines above a substrate, each global bit line having a long axis. The method includes forming the plurality of vertically-oriented bit line select transistors above the plurality of global bit lines, each comprising a width and a thickness, wherein the width of each vertically-oriented bit line select transistor is greater than the thickness of the vertically-oriented bit line select transistors, and offsetting the vertically-oriented bit line select transistors disposed above adjacent global bit lines from one another in a direction along the long axis of the global bit lines.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A monolithic three-dimensional memory array comprising:
   a plurality of global bit lines disposed above a substrate, each global bit line extending in a first direction, the plurality of global bit lines arranged in a second direction perpendicular to the first direction;
   a plurality of vertically-oriented bit lines disposed above the global bit lines, each of the vertically-oriented bit lines extending in a third direction perpendicular to the first and second directions;
   a plurality of word lines disposed above the global bit lines;
   a plurality of memory cells coupled between the vertically-oriented bit lines and the word lines; and
   a plurality of vertically-oriented bit line select transistors coupled between the vertically-oriented bit lines and the global bit lines, each vertically-oriented bit line select transistor comprising a width in the second direction and a thickness in the first direction,
   wherein:
      vertically-oriented bit line select transistors disposed above adjacent global bit lines are offset from one another in the first direction, and
      the width of each vertically-oriented bit line select transistor is greater than the thickness of the vertically-oriented bit line select transistors.

2. The monolithic three-dimensional memory array of claim 1, wherein the width of each vertically-oriented bit line select transistor is about 2-3 times the thickness of the vertically-oriented bit line select transistors.

3. The monolithic three-dimensional memory array of claim 1, wherein each vertically-oriented bit line select transistor has a long axis that is substantially perpendicular to the long axis of the plurality of global bit lines.

4. The monolithic three-dimensional memory array of claim 1, wherein the vertically-oriented bit line select transistors comprise bipolar junction transistors or field effect transistors.

5. The monolithic three-dimensional memory array of claim 1, wherein each vertically-oriented bit line select transistor comprises a first control terminal and a second control terminal.

6. The monolithic three-dimensional memory array of claim 5, wherein the first control terminal and the second control terminal of each vertically-oriented bit line select transistor are disposed on opposite sides of the vertically-oriented transistor.

7. The monolithic three-dimensional memory array of claim 5, wherein each vertically-oriented bit line select transistor comprises a first terminal and a second terminal, and the first control terminal may be used to selectively induce a first conductive channel between the first terminal and the second terminal, and the second control terminal may be used to selectively induce a second conductive channel between the first terminal and the second terminal.

8. The monolithic three-dimensional memory array of claim 5, further comprising a plurality of row select lines, each row select line coupled to the first control terminal and the second control terminal of a corresponding one of the vertically-oriented bit line select transistors.

9. The monolithic three-dimensional memory array of claim 1, wherein the vertically-oriented bit line select transistors comprise vertically-oriented pillar-shaped transistors.

10. The monolithic three-dimensional memory array of claim 1, wherein the memory cells comprise reversible resistance-switching memory cells.

11. A method of providing a monolithic three-dimensional memory array, the method comprising:
   providing a plurality of global bit lines above a substrate, each global bit line extending in a first direction, the plurality of global bit lines arranged in a second direction perpendicular to the first direction;
   providing a plurality of vertically-oriented bit lines above the global bit lines, each of the vertically-oriented bit lines extending in a third direction perpendicular to the first and second directions;
   providing a plurality of word lines above the global bit lines;
   coupling a plurality of memory cells between the vertically-oriented bit lines and the word lines;
   coupling a plurality of vertically-oriented bit line select transistors between the vertically-oriented bit lines and the global bit lines, each vertically-oriented bit line select transistor comprising a width in the second direction and a thickness in the first direction, wherein the width of each vertically-oriented bit line select transistor is greater than the thickness of the vertically-oriented bit line select transistors; and
   offsetting the vertically-oriented bit line select transistors disposed above adjacent global bit lines from one another in the first direction.

12. The method of claim 11, wherein the width of each vertically-oriented bit line select transistor is about 2-3 times the thickness of the vertically-oriented bit line select transistors.

13. The method of claim 11, wherein each vertically-oriented bit line select transistor has a long axis that is substantially perpendicular to the long axis of the plurality of global bit lines.

14. The method of claim 11, wherein the vertically-oriented bit line select transistors comprise bipolar junction transistors or field effect transistors.

15. The method of claim 11, further comprising providing a first control terminal and a second control terminal on each vertically-oriented bit line select transistor.

16. The method of claim 15, further comprising disposing the first control terminal and the second control terminal of each vertically-oriented bit line select transistor on opposite sides of the vertically-oriented transistor.

17. The method of claim 15, further comprising coupling each of a plurality of row select lines to the first control terminal and the second control terminal of a corresponding one of the vertically-oriented bit line select transistors.

18. The method of claim 11, wherein the vertically-oriented bit line select transistors comprise vertically-oriented pillar-shaped transistors.

19. The method of claim 11, wherein the memory cells comprise reversible resistance-switching memory cells.

20. A method of forming a plurality of vertically-oriented bit line select transistors for a monolithic three-dimensional memory array that includes a plurality of global bit lines above a substrate, each global bit line extending in a first direction, the plurality of global bit lines arranged in a second direction perpendicular to the first direction, the method comprising:
forming the plurality of vertically-oriented bit line select transistors above the plurality of global bit lines, each comprising a width in the second direction and a thickness in the first direction, wherein the width of each vertically-oriented bit line select transistor is greater than the thickness of the vertically-oriented bit line select transistors; and
offsetting the vertically-oriented bit line select transistors disposed above adjacent global bit lines from one another in the first direction.

21. The method of claim 20, wherein the thickness of each vertically-oriented bit line select transistor comprises a minimum feature size F.

22. The method of claim 20, wherein the width of each vertically-oriented bit line select transistor is about 2-3 times the thickness of the vertically-oriented bit line select transistors.

23. The method of claim 20, wherein each vertically-oriented bit line select transistor has a long axis that is substantially perpendicular to the long axis of the plurality of global bit lines.

24. The method of claim 20, wherein the vertically-oriented bit line select transistors comprise bipolar junction transistors or field effect transistors.

* * * * *